United States Patent
Shibata et al.

(10) Patent No.: US 11,656,393 B2
(45) Date of Patent: May 23, 2023

(54) LAMINATE AND IMAGE DISPLAY DEVICE

(71) Applicant: FUJIFILM Corporation, Tokyo (JP)

(72) Inventors: Naoya Shibata, Kanagawa (JP); Jun Takeda, Kanagawa (JP); Yuta Fukushima, Kanagawa (JP); Ayako Muramatsu, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 171 days.

(21) Appl. No.: 17/177,547

(22) Filed: Feb. 17, 2021

(65) Prior Publication Data

US 2021/0173135 A1  Jun. 10, 2021

Related U.S. Application Data

(63) Continuation of application No. PCT/JP2019/032784, filed on Aug. 22, 2019.

(30) Foreign Application Priority Data

Aug. 28, 2018 (JP) .............................. JP2018-159775
Jul. 26, 2019 (JP) .............................. JP2019-138194

(51) Int. Cl.
  *G02B 5/30* (2006.01)
  *C08F 116/06* (2006.01)
  *C09D 183/04* (2006.01)

(52) U.S. Cl.
  CPC .......... *G02B 5/3016* (2013.01); *C08F 116/06* (2013.01); *C09D 183/04* (2013.01); *H10K 50/86* (2023.02)

(58) Field of Classification Search
  CPC ... G02B 5/3016; H01L 51/5281; C08G 77/14; C09D 183/08; C09D 183/04;
  (Continued)

(56) References Cited

U.S. PATENT DOCUMENTS 7,857,991 B2 * 12/2010 Shiga .................. C09K 19/601
                                                            252/299.1
2007/0134477 A1    6/2007 Bell
                   (Continued)

FOREIGN PATENT DOCUMENTS

JP    2007-171707 A    7/2007
JP    2008-249884 A    10/2008
                   (Continued)

OTHER PUBLICATIONS

Office Action, issued by the Japanese Patent Office dated Oct. 26, 2021, in connection with Japanese Patent Application No. 2020-539386.
                   (Continued)

*Primary Examiner* — Anthony J Frost
(74) *Attorney, Agent, or Firm* — Edwards Neils LLC; Jean C. Edwards, Esq.

(57) ABSTRACT

The present invention provides a laminate used in an image display device the laminate including an optically anisotropic layer, a light-absorbing anisotropic layer, a refractive index-adjusting layer, and an oxygen shielding layer in this order, where the light-absorbing anisotropic layer is formed of a composition containing dichroic azo coloring agent and liquid crystalline compounds, where the dichroic azo coloring agent compound is 10% to 30% by mass with respect to a mass of a total solid content of the light-absorbing anisotropic layer, a degree of alignment of the light-absorbing anisotropic layer is 0.92 or higher, the refractive index-adjusting layer is formed of a composition containing a crosslinkable group compound, and has an in-plane average refractive index of 1.55 to 1.70 (550 nm λ), and an angle formed by an in-plane slow axis of the optically anisotropic layer and an absorption axis of the light-absorbing anisotropic layer is 45°±10°.

20 Claims, 1 Drawing Sheet

(58) Field of Classification Search
CPC ........ C09J 129/04; G02F 1/13; G02F 1/1335; G02F 1/1337; G09F 9/30; H05B 33/02; C08F 116/06
See application file for complete search history.

(56) References Cited

U.S. PATENT DOCUMENTS

| | | | |
|---|---|---|---|
| 2008/0252974 A1* | 10/2008 | Futamura | G02B 5/3016 349/194 |
| 2014/0185135 A1 | 7/2014 | Fukagawa et al. | |
| 2014/0287225 A1* | 9/2014 | Hirano | C08J 7/043 428/447 |
| 2016/0131809 A1* | 5/2016 | Takeda | G02F 1/13363 349/194 |
| 2016/0168035 A1* | 6/2016 | Matus | C23C 16/401 427/579 |
| 2016/0342003 A1* | 11/2016 | Takeda | B29D 11/00788 |
| 2017/0329063 A1* | 11/2017 | Sakai | G02B 5/3016 |
| 2019/0250457 A1 | 8/2019 | Nishimura et al. | |
| 2019/0322937 A1 | 10/2019 | Matsuyama et al. | |
| 2020/0033521 A1 | 1/2020 | Kuwayama et al. | |

FOREIGN PATENT DOCUMENTS

| | | |
|---|---|---|
| JP | 2012-189665 A | 10/2012 |
| JP | 2013-101328 A | 5/2013 |
| JP | 2013-228706 A | 11/2013 |
| JP | 5437744 B2 | 3/2014 |
| JP | 2014-142630 A | 8/2014 |
| WO | 2018/079854 A1 | 5/2018 |
| WO | 2018/124198 A1 | 7/2018 |
| WO | 2018/186500 A1 | 10/2018 |

OTHER PUBLICATIONS

International Search Report issued in PCT/JP2019/032784 dated Nov. 5, 2019.
Written Opinion issued in PCT/JP2019/032784 dated Nov. 5, 2019.
International Preliminary Report on Patentability completed by WIPO dated Mar. 2, 2021 in connection with International Patent Application No. PCT/JP2019/032784.

* cited by examiner

LAMINATE AND IMAGE DISPLAY DEVICE

CROSS-REFERENCE TO RELATED APPLICATIONS

This application is a Continuation of PCT International Application No. PCT/JP2019/032784 filed on Aug. 22, 2019, which was published under PCT Article 21(2) in Japanese, and which claims priority under 35 U.S.C. § 119(a) to Japanese Patent Application No. 2018-159775 filed on Aug. 28, 2018 and Japanese Patent Application No. 2019-138194 filed on Jul. 26, 2019. The above applications are hereby expressly incorporated by reference, in their entirety, into the present application.

BACKGROUND OF THE INVENTION

1. Field of the Invention

The present invention relates to a laminate and an image display device.

2. Description of the Related Art

In recent years, development of an organic light emitting diode (OLED) having flexibility has been in process, and enhancement of flexibility for each member used has been in progress.

Meanwhile, an OLED substrate has a high reflectivity, and a circularly polarizing plate used for preventing the reflection of external light is required to have a high degree of polarization and flexibility.

However, an iodine polarizer commonly used for the circularly polarizing plate is produced by dissolving or adsorbing iodine in or onto a high-molecular material such as polyvinyl alcohol to stretch the film at a high ratio in one direction into a shape of a film, and thus did not have sufficient flexibility.

In this regard, a polarizing element in which a dichroic azo coloring agent is applied onto a substrate such as a transparent film and aligned using an intermolecular interaction or the like has been studied.

For example, JP5437744B proposes a polarizing element which has a high concentration of a dichroic azo coloring agent, is a thin film, and a high degree of polarization.

Moreover, WO2018/124198A proposes a polarizing element having a high degree of alignment by increasing crystallinity of a dichroic azo coloring agent compound using a specific liquid crystalline compound.

SUMMARY OF THE INVENTION

The present inventors have studied the polarizing elements described in JP5437744B and WO2018/124198A, and as a result, it has been clarified that by increasing a content of a dichroic azo coloring agent compound, in a case where the obtained polarizing element (light-absorbing anisotropic film) is used in an image display device, light durability is improved. However, it has been also clarified that there is room for further improvement in the light durability in an application such as a smartphone which is expected to be frequently used in outdoors.

Moreover, the present inventors have clarified a new problem in that by increasing a content of a dichroic azo coloring agent compound, in a case where the obtained light-absorbing anisotropic film is used in an image display device, internal reflection on a visually recognized side is higher than that of the light-absorbing anisotropic film, and display performance deteriorates.

Therefore, an object of the present invention is to provide a laminate having excellent display performance and light durability in a case of being used in an image display device, and an image display device using the same.

The present inventors have conducted extensive studies to achieve the object, and as a result, have found that a laminate, which includes an optically anisotropic layer, a light-absorbing anisotropic layer containing a dichroic azo coloring agent compound at a predetermined ratio, a refractive index-adjusting layer having a predetermined in-plane average refractive index, and an oxygen shielding layer in this order, has favorable display performance and light durability in a case of being used in an image display device, thereby completing the present invention.

That is, the present inventors have found that the object can be achieved by the following configuration.

[1] A laminate comprising, in the following order: an optically anisotropic layer; a light-absorbing anisotropic layer; a refractive index-adjusting layer; and an oxygen shielding layer, in which the light-absorbing anisotropic layer is formed of a composition containing a dichroic azo coloring agent compound and a liquid crystalline compound, a content of the dichroic azo coloring agent compound is 10% to 30% by mass with respect to a mass of a total solid content of the light-absorbing anisotropic layer, a degree of alignment of the light-absorbing anisotropic layer is 0.92 or higher, the refractive index-adjusting layer is formed of a composition containing a compound having a crosslinkable group, and has an in-plane average refractive index of 1.55 to 1.70 at a wavelength of 550 nm, and an angle formed by an in-plane slow axis of the optically anisotropic layer and an absorption axis of the light-absorbing anisotropic layer is 45'±10°.

[2] The laminate as described in [1], in which the oxygen shielding layer has a polyvinyl alcohol-based resin or a polyethylene vinyl alcohol-based resin.

[3] The laminate as described in [1] or [2], in which the liquid crystalline compound is a high-molecular liquid crystalline compound.

[4] The laminate as described in any one of [1] to [3], in which the light-absorbing anisotropic layer has at least two kinds of dichroic azo coloring agent compounds represented by Formulae (1) and (2).

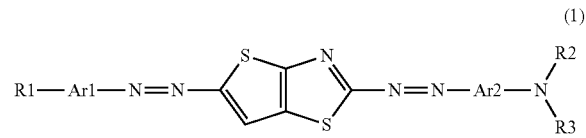

(1)

Ar1 and Ar2 in Formula (1) each independently represent a phenylene group which may have a substituent, or a naphthylene group which may have a substituent.

R1 in Formula (1) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group.

Provided that —$CH_2$— constituting the alkyl group represented by one aspect of R1 may be substituted with —O—, —CO—, —C(O)—O—, —O—C(O)—, —Si($CH_3$)$_2$—O—Si($CH_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where R1 is a group other than a hydrogen atom, a hydrogen atom of the corresponding group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$.

R1' represents a hydrogen atom or a linear or branched alkyl group having 1 to 6 carbon atoms. In a case where a plurality of R1''s are present in the corresponding group, the plurality of R1''s may be the same or different from each other.

R2 and R3 in Formula (1) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Provided that —$CH_2$— constituting the alkyl group represented by one aspect of R2 and R3 may be substituted with —O—, —S—, —C(O)—, —C(O)—O—, —O—C(O)—, —C(O)—S—, —S—C(O)—, —Si($CH_3$)$_2$—O—Si($CH_3$)$_2$—, —NR2'—, —CO—NR2'—, —CO—NR2'—, —NR2'—C(O)—O—, —O—C(O)—NR2'—, —NR2'—C(O)—NR2'—, —CH=CH—, —C≡C—, —N=N—, —C(R2')=CH—C(O)—, or —O—C(O)—O—.

In a case where R2 and R3 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of R2''s are present in the corresponding group, the plurality of R2''s may be the same or different from each other.

R2 and R3 may be bonded to each other to form a ring, and R2 or R3 may be bonded to Ar2 to form a ring.

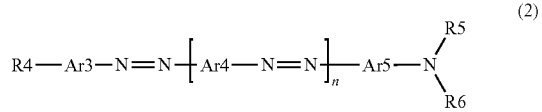

(2)

n in Formula (2) represents 1 or 2.

Ar3, Ar4, and Ar5 in Formula (2) each independently represent a phenylene group which may have a substituent, a naphthylene group which may have a substituent, or a heterocyclic group which may have a substituent.

R4 in Formula (2) represents a hydrogen atom, a linear or branched alkyl group which has 1 to 20 carbon atoms and may have a substituent, air alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group.

R5 and R6 in Formula (2) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Provided that —$CH_2$— constituting the alkyl group represented by one aspect of R5 and R6 may be substituted with —O—, —S—, —C(O)—, —C(O)—O—, —O—C(O)—, —C(O)—S—, —S—C(O)—, —Si($CH_3$)$_2$—O—Si($CH_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —C≡C—, —N=N—, —C(R2')=CH—C(O)—, or —O—C(O)—O—.

In a case where R5 and R6 are each a group other than a hydrogen atom, a hydrogen atom of the corresponding group may be substituted with a halogen atom, a nitro group, a cyano group, an —OH group, —N(R2')$_2$, art amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of R2''s are present in the corresponding group, the plurality of R2''s may be the same or different from each other.

R5 and R6 may be bonded to each other to form a ring, and R5 and R6 may be bonded to Ar5 to form a ring.

[5] The laminate as described in any one of [1] to [4], in which an in-plane average refractive index of the oxygen shielding layer at a wavelength of 550 nm is 1.50 to 1.65.

[6] The laminate as described in any one of [1] to [5], in which an in-plane average refractive index of the oxygen shielding layer at a wavelength of 550 nm is 1.55 to 1.65.

[7] The laminate as described in any one of [1] to [6], in which the oxygen shielding layer is an adhesive containing a polyvinyl alcohol-based resin.

[8] The laminate as described in any one of [1] to [7], in which the refractive index-adjusting layer has a compound having a boronic acid structure.

[9] The laminate as described in any one of [1] to [8], further comprising a photo-alignment layer which is formed of a compound having a crosslinkable group and provided between the optically anisotropic layer and the light-absorbing anisotropic layer.

[10] The laminate as described in any one of [1] to [9], further comprising a surface protective layer which is provided on a side of the oxygen shielding layer opposite to the refractive index-adjusting layer,
in which the surface protective layer has a support, and the support has a polyimide resin.

[11] The laminate as described in any one of [1] to [10], further comprising a surface protective layer which is provided on a side of the oxygen shielding layer opposite to the refractive index-adjusting layer,
in which the surface protective layer has a hard coat layer, and the hard coat layer contains silsesquioxane.

[12] The laminate as described in any one of [1] to [11], further comprising a surface protective layer which is provided on a side of the oxygen shielding layer opposite to the refractive index-adjusting layer, in which the surface protective layer has a support and a hard coat layer, and an in-plane average refractive index of the support at a wavelength of 550 mu is 1.45 to 1.60, and an in-plane average refractive index of the hard coat layer at a wavelength of 550 nm is 1.5 to 1.6.

[13] The laminate as described in any one of [1] to [12], in which the optically anisotropic layer has a λ/4 plate formed of a composition containing a polymerizable liquid crystalline compound.

[14] The laminate as described in [13], in which the polymerizable liquid crystalline compound is a compound represented by Formula (3).

$$L^1\text{-}SP^1\text{-}D^3\text{-}(A^1)_{a1}\text{-}D^5\text{-}(G^1)_{g1}\text{-}D^1\text{-}Ar\text{-}D^2\text{-}(G^2)_{g2}\text{-}D^6\text{-}(A^2)_{a2}\text{-}D^4\text{-}SP^2\text{-}L^2 \quad (3)$$

In Formula (3), a1, a2, g1, and g2 each independently represent 0 or 1, provided that at least one of a1 or g1 represents 1, and at least one of a2 or g2 represents 1.

$D^1$, $D^2$, $D^3$, $D^4$, $D^5$, and $D^6$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

$G^1$ and $G^2$ each independently represent a divalent alicyclic hydrocarbon group which has 5 to 8 carbon atoms and may have a substituent, and one or more —$CH_2$—'s constituting the alicyclic hydrocarbon group may be substituted with —O—, —S—, —NH—.

$A^1$ and $A^2$ each independently represent an aromatic ring which has 6 or more carbon atoms and may have a substituent, or a cycloalkane ring which has 6 or more carbon atoms and may have a substituent.

$SP^1$ and $SP^2$ each independently represent a single bond, a linear or branched alkylene group having 1 to 12 carbon atoms, or a divalent linking group in which one or more —$CH_2$—'s constituting the linear or branched alkylene group having 1 to 12 carbon atoms are substituted with —O—, —S—, —N(Q)-, or —CO—, and Q represents a substituent.

$L^1$ and $L^2$ each independently represent a monovalent organic group, and at least one of $L^1$ or $L^2$ represents a polymerizable group, provided that in a case where Ar is an aromatic ring represented by Formula (Ar-3), at least one of $L^1$, $L^2$, or $L^3$ or $L^4$ in Formula (Ar-3) represents a polymerizable group.

Ar represents any one aromatic ring selected from the group consisting of the groups represented by Formulae (Ar-1) to (Ar-5).

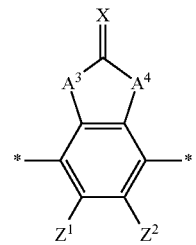

(Ar-1)

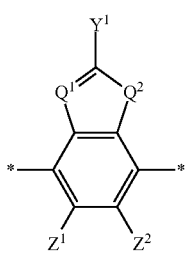

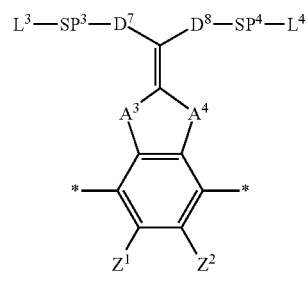

(Ar-2)

(Ar-3)

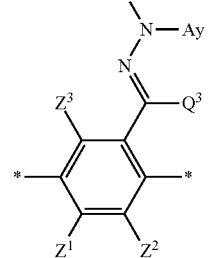

(Ar-4)

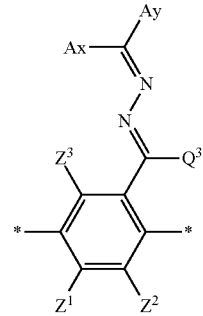

(Ar-5)

In Formulae (Ar-1) to (Ar-5),

* represents a bonding position to $D^1$ or $D^2$, $Q^1$ represents N or CH.

$Q^2$ represents —S—, —O—, or —N($R^5$)—, and $R^5$ represents a hydrogen atom or an alkyl group having 1 to 6 carbon atoms.

$Y^1$ represents an aromatic hydrocarbon group having 6 to 12 carbon atoms or an aromatic heterocyclic group having 3 to 12 carbon atoms, which may have a substituent.

$Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, where $R^6$ to $R^9$ each independently represent a hydrogen atom or an alkyl group having 1 to 6 carbon atoms, and $Z^1$ and $Z^2$ may be bonded to each other to form an aromatic ring.

$A^3$ and $A^4$ each independently represent a group selected from the group consisting of —O—, —N($R^{10}$)—, —S—, and —CO—, and $R^{10}$ represents a hydrogen atom or a substituent.

X represents a non-metallic atom of Group 14 to Group 16, to which a hydrogen atom or a substituent may be bonded.

$D^7$ and $D^8$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

$SP^3$ and $SP^4$ each independently represent a single bond, a linear or branched alkylene group having 1 to 12 carbon atoms, or a divalent linking group in which one or more —$CH_2$-'s constituting the linear or branched alkylene group having 1 to 12 carbon atoms are substituted with —O—, —S—, —NH—, —N(Q)- , or —CO—, and Q represents a substituent.

$L^3$ and $L^4$ each independently represent a monovalent organic group, and at least one of $L^3$, $L^4$, or $L^1$ or $L^2$ in Formula (3) represents a polymerizable group.

Ax represents an organic group which has 2 to 30 carbon atoms and has at least one aromatic ring selected from the group consisting of an aromatic hydrocarbon ring and an aromatic heterocyclic ring.

Ay represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring.

The aromatic rings in Ax and Ay may each have a substituent, and Ax and Ay may be bonded to each other to form a ring.

$Q^3$ represents a hydrogen atom or an alkyl group which has 1 to 6 carbon atoms and may have a substituent.

[15] The laminate as described in [14], in which the compound represented by Formula (3) is a compound represented by Formula (4).

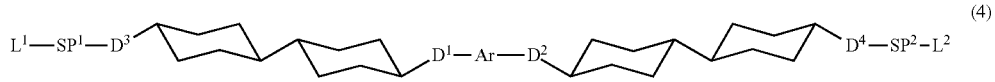

(4)

Here, $D^1$, $D^2$, $D^3$, $D^4$, $SP^1$, $SP^2$, $L^1$, $L^2$, and Ar in Formula (4) are the same as those described in Formula (3), respectively.

[16] The laminate as described in [14], in which the compound represented by Formula (3) is a compound in which Ar in Formula (3) represents an aromatic ring represented by Formula (Ar-2).

[17] An image display device comprising the laminate as described in any one of [1] to [16].

According to the present invention, it is possible to provide a laminate having excellent display performance and light durability in a case of being used in an image display device, and an image display device using the same.

DESCRIPTION OF THE PREFERRED EMBODIMENTS

Figure 1:
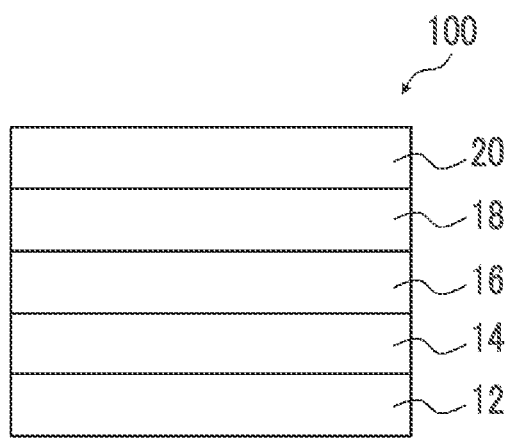
FIG. 1 is a schematic cross-sectional view showing an example of a laminate according to an embodiment of the present invention.

Hereinafter, the present invention will be described in detail.

Description of configuration requirements described below may be made based on representative embodiments of the present invention, but the present invention is not limited to such an embodiment.

In addition, in the present specification, a numerical range expressed using "to" means a range which includes the preceding and succeeding numerical values of "to" as a lower limit value and an upper limit value, respectively.

In the present specification, being parallel, being orthogonal, being horizontal, and being perpendicular do not mean being parallel, being orthogonal, being horizontal, and being perpendicular, in strict meanings, respectively, but mean a range of being parallel ±10°, a range of being orthogonal ±10°, range of being horizontal ±10°, and a range of being perpendicular ±10°, respectively.

In the present specification, as each component, a substance corresponding to each component may be used alone or in combination of two or more kinds thereof. Here, in a case where two or more kinds of substances are used in combination for each component, a content of the component refers to a total content of the substances used in combination unless otherwise specified.

Moreover, in the present specification, "(meth)acrylate" is a notation representing "acrylate" or "methacrylate", "(meth)acryl" is a notation representing "actyl" or "methacryl", and "(meth)acryloyl" is a notation representing "acryloyl." or "methacryloyl".

[Laminate]

A laminate according to the embodiment of the present invention is a laminate including an optically anisotropic layer, a light-absorbing anisotropic layer, a refractive index-adjusting layer, and an oxygen shielding layer in this order.

In the laminate according to the embodiment of the present invention, the light-absorbing anisotropic layer is a layer formed of a composition containing a dichroic azo coloring agent compound and a liquid crystalline compound, and a content of the dichroic azo coloring agent compound is 10% to 30% by mass with respect to a mass of the total solid content of the light-absorbing anisotropic layer.

Moreover, in the laminate according to the embodiment of the present invention, the refractive index-adjusting layer is adjacent to the light-absorbing anisotropic layer, is formed of a composition containing a compound having a cross-linkable group, and has an in-plane average refractive index of 1.55 to 1.70 at a wavelength of 550 nm.

Furthermore, in the laminate according to the embodiment of the present invention, an angle formed by an in-plane slow axis of the optically anisotropic layer and an absorption axis of the light-absorbing anisotropic layer is 45°±10°. That is, the laminate is provided such that the angle formed by the in-plane slow axis of the optically anisotropic layer and the absorption axis of the light-absorbing anisotropic layer is 35° to 55°. The angle formed by the in-plane slow axis of the optically anisotropic layer and the absorption axis of the light-absorbing anisotropic layer is preferably 40° to 50°, more preferably 42° to 48°, still more preferably 44° to 46°, and particularly preferably 45°.

Here, the "in-plane slow axis" of the optically anisotropic layer means a direction in which a refractive index is maximum in the plane of the optically anisotropic layer, and the "absorption axis" of the light-absorbing anisotropic layer means a direction in which an absorbancy is highest.

One of specific examples of the laminate according to the embodiment of the present invention is a laminate for imparting an antireflection function of an organic EL substrate in an organic EL display device, and by using the laminate, it is possible to provide an organic EL display device having both superior display performance and light durability.

In the present invention, as described above, both superior display performance and light durability are achieved.

Details of a reason thereof are not yet clear, but the present inventors presume that the reason is as follows.

First, by incorporating the dichroic azo coloring agent compound at a high concentration within the scope of the present invention in the light-absorbing anisotropic layer, it is possible to realize a high degree of alignment and improvement in light durability in a thin film. This is presumed that by improving crystallinity of the dichroic azo coloring agent compound, a high degree of alignment and improved light durability of the dichroic azo coloring agent compound have been realized.

In this case, the dichroic azo coloring agent has a high absorbancy in a visible light range, and thus the light-absorbing anisotropic layer is considered to be a layer having high refractive index anisotropy in the visible light range.

Therefore, the reason why the laminate according to the embodiment of the present invention has an excellent antireflection function is presumed that by disposing the refractive index-adjusting layer having a suitable refractive index adjacent to a surface side, reflection at an interface with the light-absorbing anisotropic layer is reduced, and as a result, internal reflection is suppressed and the antireflection function is improved. In addition, it is considered that the refractive index is designed after an oxygen shielding layer which can further enhance the light durability is also provided, and thus both superior display performance and light durability can be achieved.

Figure 2:
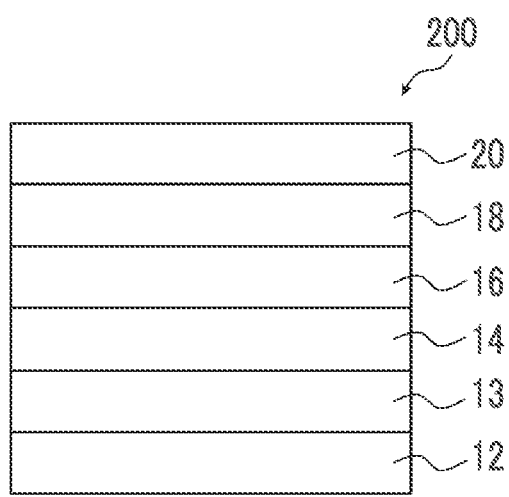
FIG. 2 is a schematic cross-sectional view showing another example of the laminate according to the embodiment of the present invention.

FIGS. 1 and 2 are schematic cross-sectional views showing an example of the laminate according to the embodiment of the present invention.

Here, a laminate 100 shown in FIG. 1 is a laminate having a layer configuration in which an optically anisotropic layer 12, a light-absorbing anisotropic layer 14, a refractive index-adjusting layer 16, an oxygen shielding layer 18, and an optional surface protective layer 20 are provided in this order.

Moreover, a laminate 200 shown in FIG. 2 is a laminate having a layer configuration in which the optically anisotropic layer 12, an optional alignment layer 13, the light-absorbing anisotropic layer 14, the refractive index-adjusting layer 16, the oxygen shielding layer 18, and the optional surface protective layer 20 are provided in this order.

Furthermore, in the above-mentioned configurations, other layers may be provided between the above-mentioned layers, except for between the light-absorbing anisotropic layer and the refractive index-adjusting layer which are provided adjacent to each other. For example, an adhesive layer, a pressure sensitive adhesive layer, or a transparent support may be provided between the surface protective layer 20 and the oxygen shielding layer 18.

Each layer may have a multilayer configuration. For example, it is also preferable that the surface protective layer 20 has a two-layer configuration of a support and a hard coat layer. Moreover, it is also preferable that the optically anisotropic layer has a two-layer configuration of a positive A-plate, which is a λ/4 plate, and a positive C-plate. At this time, the positive A-plate, which is a λ/4 plate, and the positive C-plate may be adhered to each other with an adhesive or a pressure sensitive adhesive, or may be adjacent to each other (lamination coating).

Hereinafter, the optically anisotropic layer, the light-absorbing anisotropic layer, the refractive index-adjusting layer, and the oxygen shielding layer as well as the optional surface protective layer and alignment layer, which are included in the laminate according to the embodiment of the present invention, will be described in detail.

[Light-Absorbing Anisotropic Layer]

The light-absorbing anisotropic layer which is included in the laminate according to the embodiment of the present invention is a layer formed of a composition (hereinafter, also referred to as a "composition for forming a light-absorbing anisotropic layer) containing a dichroic azo coloring agent compound and a liquid crystalline compound.

The composition for forming a light-absorbing anisotropic layer may contain a solvent, a polymerization initiator, an interface modifier, or components other than these components, as needed.

In the present invention, a degree of alignment of the light-absorbing anisotropic layer is 0.92 or greater, more preferably 0.94 or greater, and still more preferably 0.96 or greater.

Here, as the degree of alignment is increased, the refractive index anisotropy of the light-absorbing anisotropic layer tends to be increased, and reflection at an interface with the adjacent layer tends to be increased, and thus in a case where the degree of alignment of the light-absorbing anisotropic layer is 0.92 or greater, the effect of the present invention is actualized.

Furthermore, the degree of alignment of the light-absorbing anisotropic layer is a value calculated according to the following expression by setting a light-absorbing anisotropic layer on a sample table in a state where a linear polarizer is inserted into a side of a light source of an optical microscope (manufactured by Nikon Corporation, product name "ECLIPSE E600 POL"), and measuring an absorbancy of the light-absorbing anisotropic layer using a multichannel spectrometer (manufactured by Ocean Optics Inc., product name "QE65000").

Degree of alignment: $S=[(Az0/Ay0)-1]/[(Az0/Ay0)+2]$

Az0: Absorbancy with respect to polarized light in an absorption axis direction of the light-absorbing anisotropic layer Ay0: Absorbency with respect to polarized light in a transmission axis direction of the light-absorbing anisotropic layer In addition, in the present invention, the light-absorbing anisotropic layer may exhibit reciprocal wavelength dispersibility.

Here, the expression that the light-absorbing anisotropic layer exhibits reciprocal wavelength dispersibility indicates that in a case where an in-plane retardation (Re) value at a specific wavelength (visible light range) is measured, the Re value is maintained or increased as the measurement wavelength is increased.

A thickness of the light-absorbing anisotropic layer is not particularly limited, but is preferably 100 to 8,000 nm and more preferably 300 to 5,000 mil from the viewpoint of flexibility of the laminate according to the embodiment of the present invention.

<Dichroic Azo Coloring Agent Compound>

The composition for forming a light-absorbing anisotropic layer contains a dichroic azo coloring agent compound.

The dichroic azo coloring agent compound is not particularly limited, dichroic azo coloring agents well known in the related art can be used, hut the following compounds are preferably used.

In the present invention, the dichroic azo coloring agent compound means a coloring agent having different absorbancies depending on a direction.

The dichroic azo coloring agent compound may or may not exhibit liquid crystallinity.

In a case where the dichroic azo coloring agent compound exhibits the liquid crystallinity, the liquid crystallinity may exhibit any one of nematicity or smecticity. A temperature range showing the liquid crystal phase is preferably room temperature (about 20° C. to 28° C.) to 300° C., and from the viewpoint of handleability and manufacturing suitability, is more preferably 50° C. to 200° C.

In the present invention, from the viewpoint of adjusting a tint, it is preferable that the light-absorbing anisotropic layer at least has at least one kind of coloring agent compound (hereinafter, also simply referred to as a "first dichroic azo coloring agent compound") having a maximum absorption wavelength in a wavelength range of 560 to 700 nm, and at least one kind of coloring agent compound (hereinafter, also simply referred to as a "second dichroic azo coloring agent compound") having a maximum absorption wavelength in a wavelength range of 455 nm or greater and less than 560 nm, and specifically, it is more preferable that the light-absorbing anisotropic layer has at least a dichroic azo coloring agent compound represented by Formula (1) and a dichroic azo coloring agent compound represented by Formula (2).

In the present invention, three or more kinds of dichroic azo coloring agent compounds may be used in combination, and for example, from the viewpoint that a color of the light-absorbing anisotropic layer is close to black, it is preferable that the first dichroic azo coloring agent compound, the second dichroic azo coloring agent compound, and at least one kind of coloring agent compound (hereinafter, also simply referred to as a "third dichroic azo coloring agent compound") having a maximum absorption wavelength in a wavelength range of 380 nm or greater and less than 455 nm are used in combination.

In the present invention, for a reason that pressing resistance is improved, it is preferable that the dichroic azo coloring agent compound has a crosslinkable group.

Specific examples of the crosslinkable group include a (meth)acryloyl group, an epoxy group, an oxetanyl group, and a styryl group, and among them, a (meth)acryloyl group is preferable.

(First Dichroic Azo Coloring Agent Compound)

The first dichroic azo coloring agent compound is preferably a compound having a chromophore as a core, and a side chain bonded to the end of the chromophore.

Specific examples of the chromophore include an aromatic ring group (for example, an aromatic hydrocarbon group and an aromatic heterocyclic group), and an azo group, a structure having both an aromatic ring group and an azo group is preferable, and a bisazo structure having an aromatic heterocyclic group (preferably, a thienothiazole group) and two azo groups is more preferable.

The side chain is not particularly limited, and examples thereof include a group represented by R2 in Formula (1).

The first dichroic azo coloring agent compound is a dichroic azo coloring agent compound having a maximum absorption wavelength in a wavelength range of 560 am to 700 nm, and from the viewpoint of adjusting a tint of a polarizer, is preferably a dichroic azo coloring agent compound having a maximum absorption wavelength in a wavelength range of 560 to 650 am and more preferably a dichroic azo coloring agent compound having a maximum absorption wavelength in a wavelength range of 560 to 640 nm.

The maximum absorption wavelength (nm) of the dichroic azo coloring agent compound in the present specification is obtained from an ultraviolet-visible light spectrum in a wavelength range of 380 to 800 nm, as measured by a spectrophotometer using a solution obtained by dissolving a dichroic azo coloring agent compound in a good solvent.

In the present invention, for a reason that the degree of alignment of the formed light-absorbing anisotropic layer is further improved, the first dichroic azo coloring agent compound is preferably a compound represented by Formula (1).

(1)

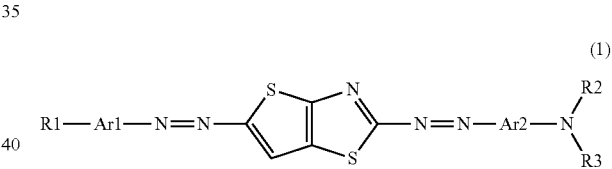

Ar1 and Ar2 in Formula (1) each independently represent a phenylene group which may have a substituent, or a naphthylene group which may have a substituent, and are preferably phenylene groups.

R1 in Formula (1) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group.

—CH$_2$— constituting the alkyl group may be substituted with —O—, —CO—, —C(O)—O—, —O—C(O)—, —Si(CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where R1 is a group other than a hydrogen atom, a hydrogen atom of the corresponding group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$.

R1' represents a hydrogen atom or a linear or branched alkyl group having 1 to 6 carbon atoms. In a case where a plurality of R1''s are present in the corresponding group, the plurality of R1''s may be the same or different from each other.

R2 and R3 in Formula (1) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

—CH$_2$— constituting the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —C≡C—, —N=N—, —C(R2')=CH—C(O)—, or —O—C(O)—O—.

In a case where R2 and R3 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of R2''s are present in the corresponding group, the plurality of R2''s may be the same or different from each other.

R2 and R3 may be bonded to each other to form a ring, and R2 or R3 may be bonded to Ar2 to form a ring.

From the viewpoint of light resistance, R1 is preferably an electron-withdrawing group, and R2 and R3 each are preferably a group having low electron-donating properties.

Specific examples of such a group include: as R1, an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group; and as R2 and R3, groups having the following structures. Furthermore, the groups having the following structures are shown in a form of including a nitrogen atom to which R2 and R3 are bonded in Formula (1).

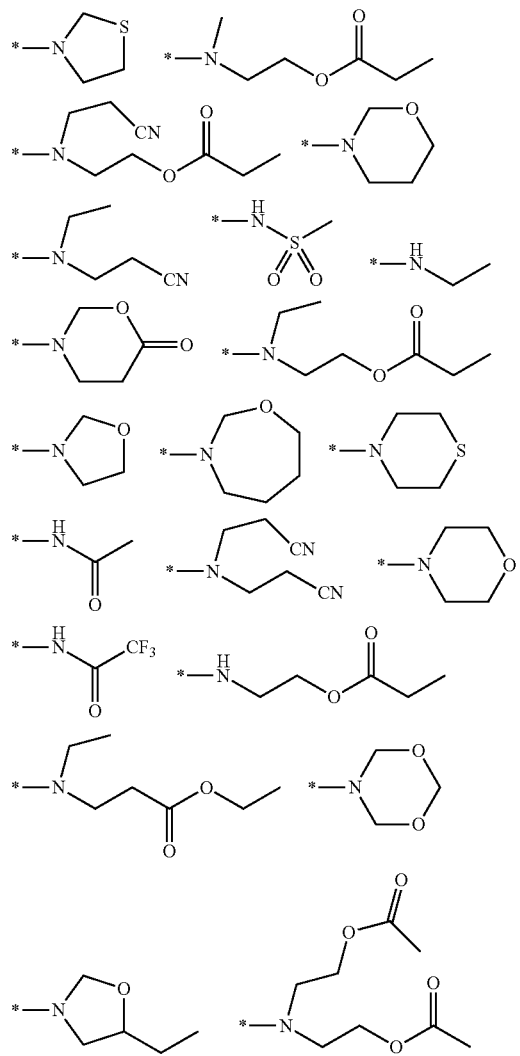

Specific examples of the first dichroic azo coloring agent compound are shown below, but the present invention is not limited to these examples.

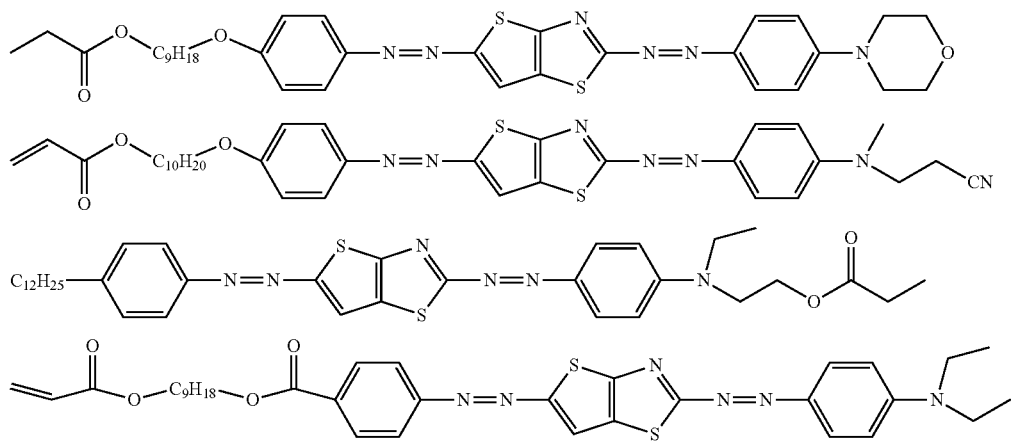

-continued
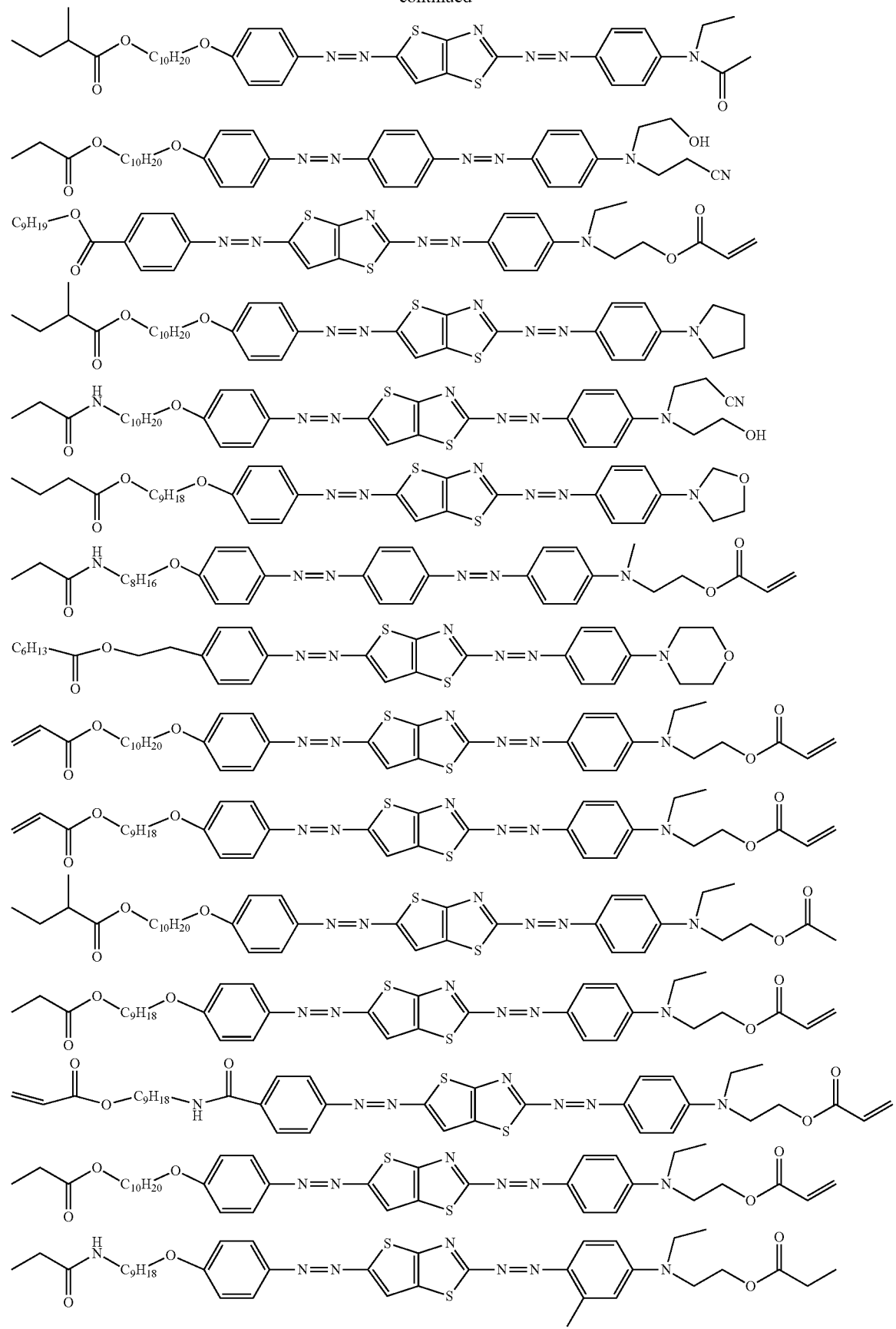

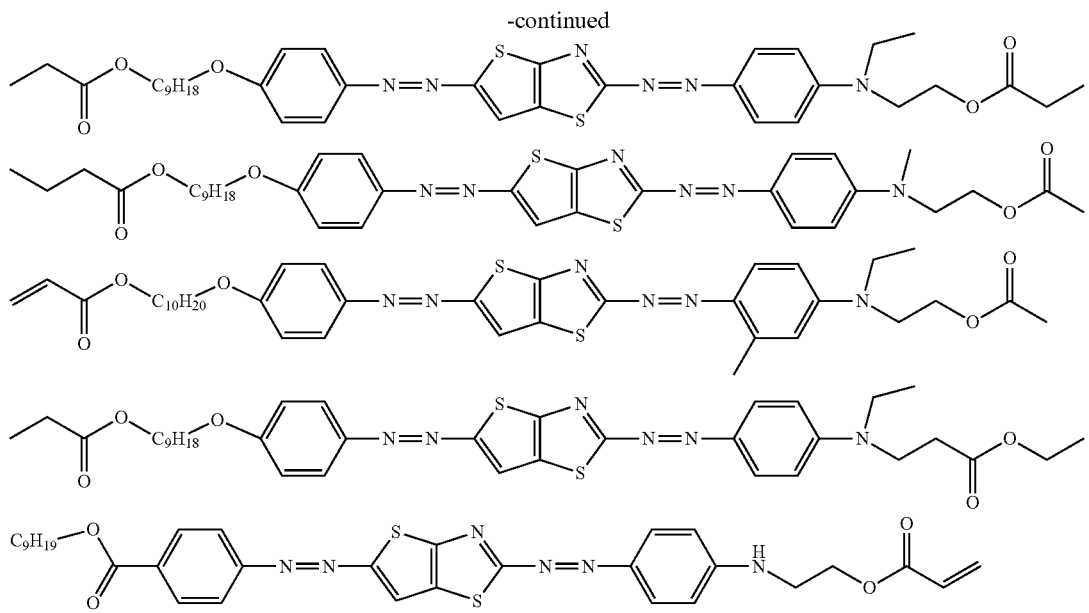

(Second Dichroic Azo Coloring Agent Compound)

The second dichroic azo coloring agent compound is a compound different from the first dichroic azo coloring agent compound, and specifically, chemical structures thereof are different.

The second dichroic azo coloring agent compound is preferably a compound having a chromophore as a core of the dichroic azo coloring agent compound, and a side chain bonded to the end of the chromophore.

Specific examples of the chromophore include an aromatic ring group (for example, an aromatic hydrocarbon group and an aromatic heterocyclic group), and an azo group, a structure having both an aromatic hydrocarbon group and an azo group is preferable, and a bisazo or trisazo structure having an aromatic hydrocarbon group and two or three azo groups is more preferable.

The side chain is not particularly limited, and examples thereof include a group represented by R4, R5, or R6 in Formula (2).

The second dichroic azo coloring agent compound is a dichroic azo coloring agent compound having a maximum absorption wavelength in a wavelength range of 455 nm or greater and less than 560 run, and from the viewpoint of adjusting a tint of a polarizer, is preferably a dichroic azo coloring agent compound having a maximum absorption wavelength in a wavelength range of 455 to 555 nm and more preferably a dichroic azo coloring agent compound having a maximum absorption wavelength in a wavelength range of 455 to 550 nm.

In particular, in a case where the first dichroic azo coloring agent compound having a maximum absorption wavelength in a range of 560 to 700 nm, and the second dichroic azo coloring agent compound having a maximum absorption wavelength in a range of 455 nm or greater and less than 560 nm are used, the tint of the polarizer is more easily adjusted.

The second dichroic azo coloring agent compound is preferably a compound represented by Formula (2) from the viewpoint that the degree of alignment of the polarizer is further improved.

$$R4-Ar3-N{=}N{-}\!\!\left[Ar4{-}N{=}N\right]_n\!\!-Ar5-N\begin{smallmatrix}R5\\ \\R6\end{smallmatrix} \quad (2)$$

n in Formula (2) represents 1 or 2.

Ar3, Ar4, and Ar5 in Formula (2) each independently represent a phenylene group which may have a substituent, a naphthylene group which may have a substituent, or a heterocyclic group which may have a substituent.

The heterocyclic group may either aromatic or non-aromatic.

Examples of atoms which constitute the aromatic heterocyclic group and are other than carbon include a nitrogen atom, a sulfur atom, and an oxygen atom. In a case where the aromatic heterocyclic group has a plurality of atoms which constitute a ring and are other than carbon, these atoms may be the same or different from each other.

Specific examples of the aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

R4 in Formula (2) has the same definition as R1 in Formula (1).

R5 and R6 in Formula (2) have the same definitions as R2 and R3 in Formula (1), respectively.

From the viewpoint of light resistance, R4 is preferably an electron-withdrawing group, and R5 and R6 each are preferably a group having low electron-donating properties.

Among such groups, the specific example of a case where R4 is an electron-withdrawing group is the same as the specific example of a case where R1 is an electron-withdrawing group, and the specific example of a case where R5 and R6 each are a group having low electron-donating properties is the same as the specific example of a case where R2 and R3 each are a group having low electron-donating properties.
Specific examples of the second dichroic azo coloring agent compound are shown below, but the present invention is not limited to these examples.
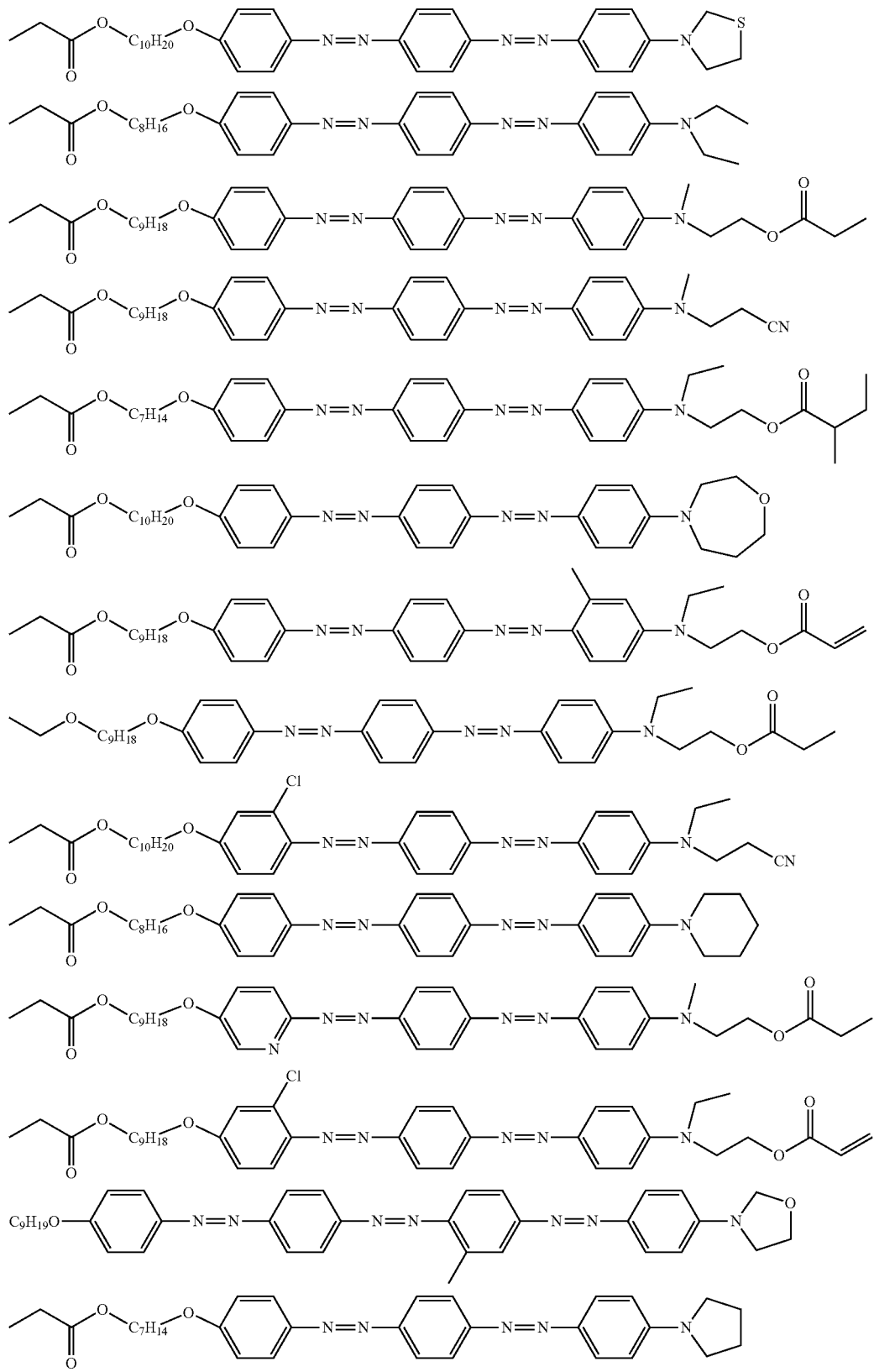

-continued
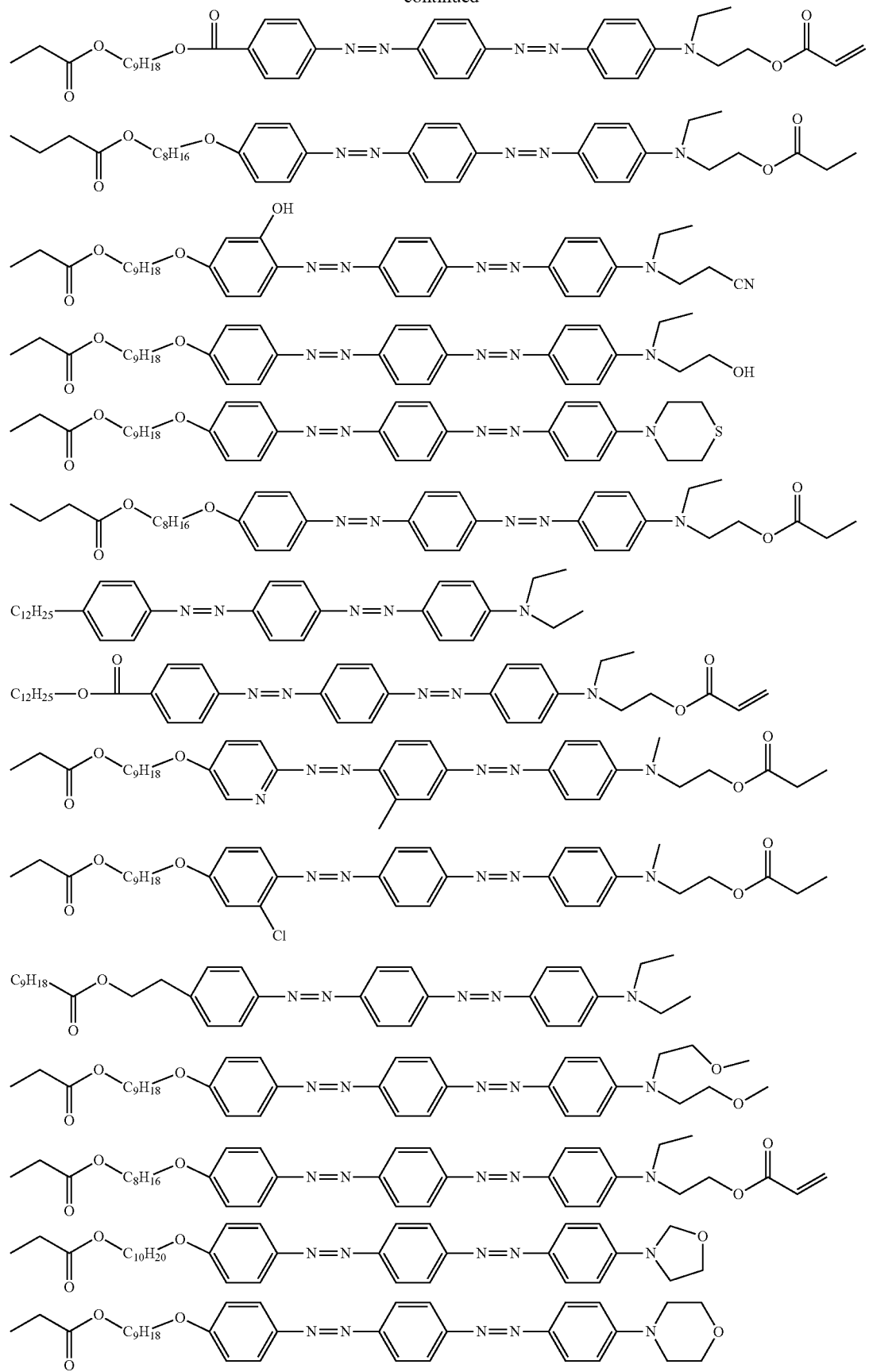

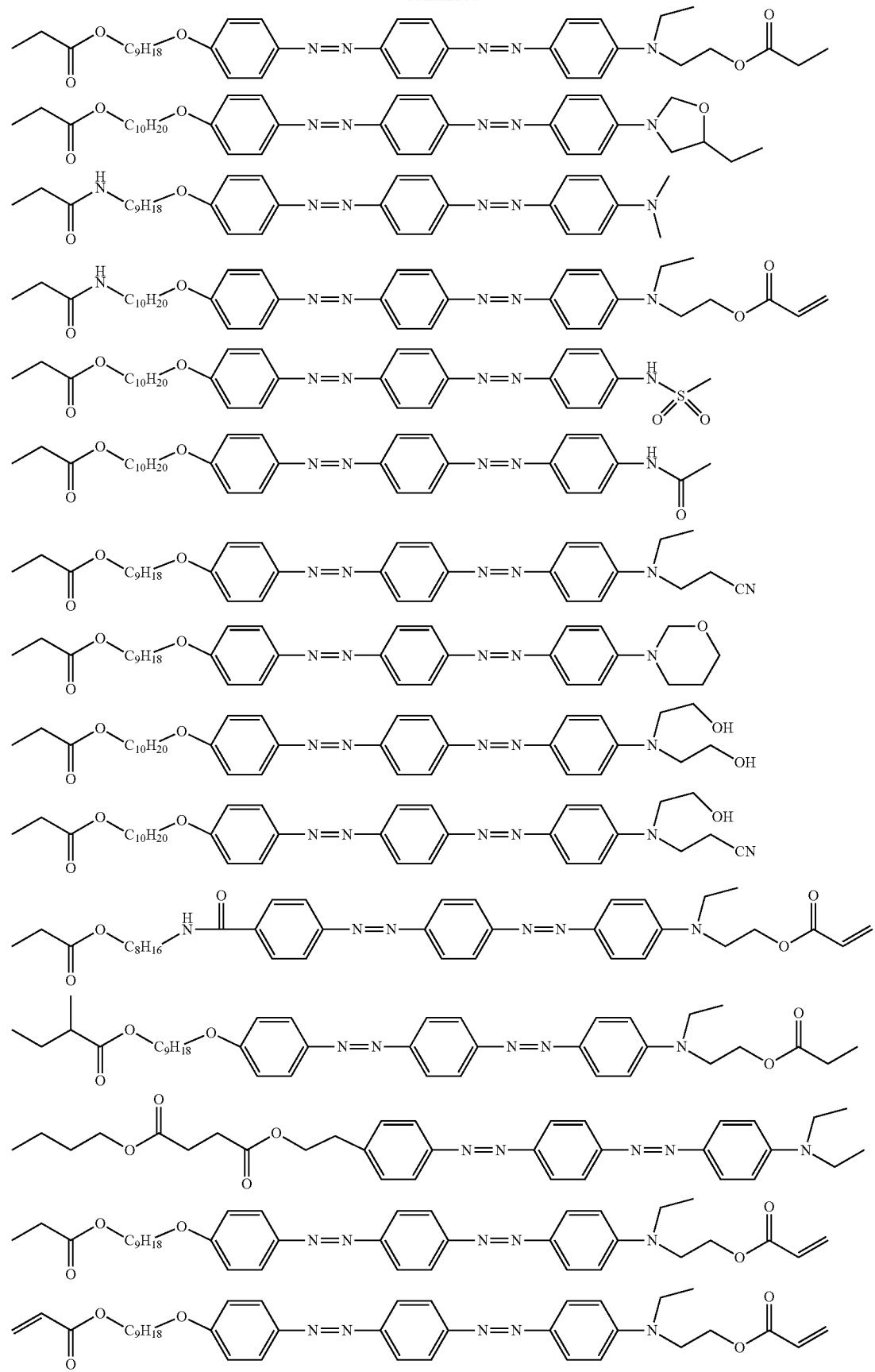

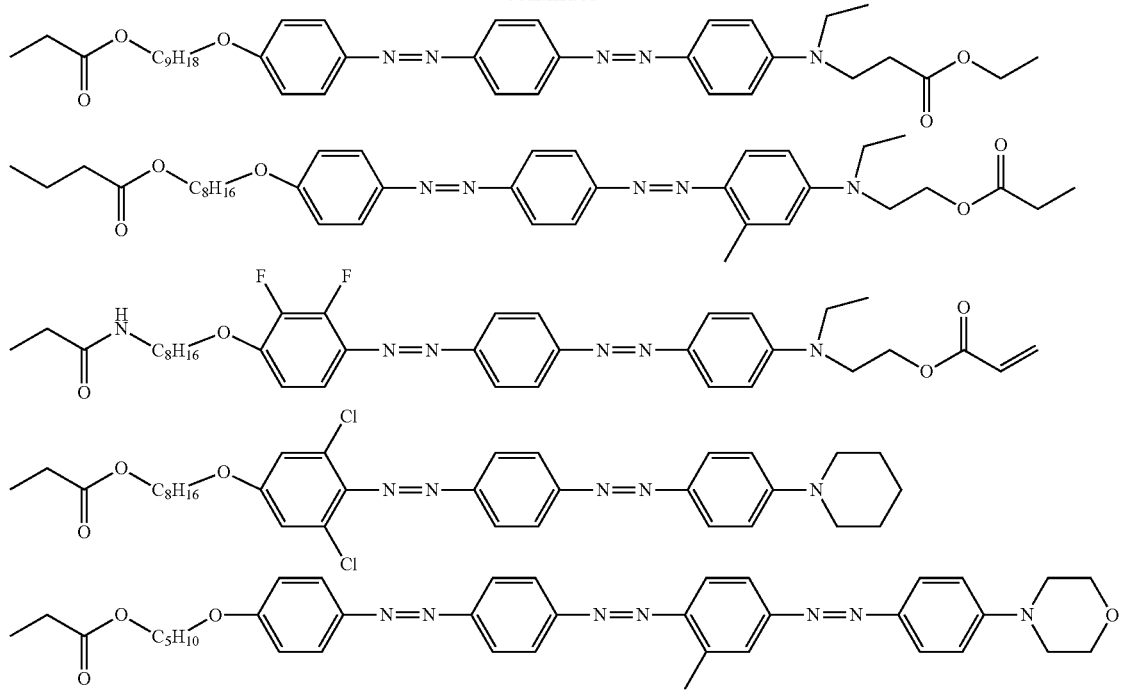

(Difference in LogP Value)

A logP value is an index expressing properties of hydrophilicity and hydrophobicity of a chemical structure. An absolute value (hereinafter, also referred to as a "logP difference") of a difference between a logP value of the side chain of the first dichroic azo coloring agent compound and a logP value of the side chain of the second dichroic azo coloring agent compound is preferably 2.30 or less, more preferably 2.0 or less, still more preferably 1.5 or less, and particularly preferably 1.0 or less. In a case where the logP difference is 2.30 or less, an affinity between the first dichroic azo coloring agent compound and the second dichroic azo coloring agent compound is increased, an arrangement structure is more easily formed, and thus the degree of alignment of the light-absorbing anisotropic layer is further improved.

Furthermore, in a case where a plurality of the side chains of the first dichroic azo coloring agent compound or the second dichroic azo coloring agent compound are present, it is preferable that at least one logP difference satisfies the above value.

Here, each side chain of the first dichroic azo coloring agent compound and the second dichroic azo coloring agent compound means a group bonded to the end of the above-mentioned chromophore. For example, in a case where the first dichroic azo coloring agent compound is the compound represented by Formula (1), R1, R2, and R3 in Formula (I) are side chains, and in a case where the second dichroic azo coloring agent compound is the compound represented by Formula (2), R4, R5, and R6 in Formula (2) are side chains. In particular, in a case where the first dichroic azo coloring agent compound is the compound represented by Formula (1), and the second dichroic azo coloring agent compound is the compound represented by Formula (2), it is preferable that among a difference between logP values of R1 and R4, a difference between logP values of R1 and R5, a difference between logP values of R2 and R4, and a difference between logP values of R2 and R5, at least one logP difference satisfies the above value.

Here, the logP value is an index expressing properties of hydrophilicity and hydrophobicity of a chemical structure, and may be called a hydrophilic-hydrophobic parameter. The logP value can be calculated using software such as ChemBioDraw Ultra or HSPiP (Ver. 4.1.07). Moreover, the logP value can also be obtained experimentally by a method of OECD Guidelines for the Testing of Chemicals, Sections 1, Test No. 117 or the like. In the present invention, unless otherwise specified, a value calculated by inputting a structural formula of a compound into HSPiP (Ver. 4.1.07) is employed as a logP value.

(Third Dichroic Azo Coloring Agent Compound)

The third dichroic azo coloring agent compound is a dichroic azo coloring agent compound other than the first dichroic azo coloring agent compound and the second dichroic azo coloring agent compound, and specifically, has a chemical structure different from those of the first dichroic azo coloring agent compound and the second dichroic azo coloring agent compound. In a case where the composition for forming a light-absorbing anisotropic layer contains the third dichroic azo coloring agent compound, there is an advantage that the tint of the light-absorbing anisotropic layer is easily adjusted.

The maximum absorption wavelength of the third dichroic azo coloring agent compound is 380 nm or greater and less than 455 nm, and is preferably 385 to 454 nm.

Specific examples of the third dichroic azo coloring agent compound include compounds other than the first dichroic azo coloring agent compound and the second dichroic azo coloring agent compound, among compounds represented by Formula (1) described in WO2017/195833A.

Specific examples of the third dichroic azo coloring agent compound are shown below, but the present invention is not limited to these examples. Moreover, in the following specific examples, n represents an integer of 1 to 10.

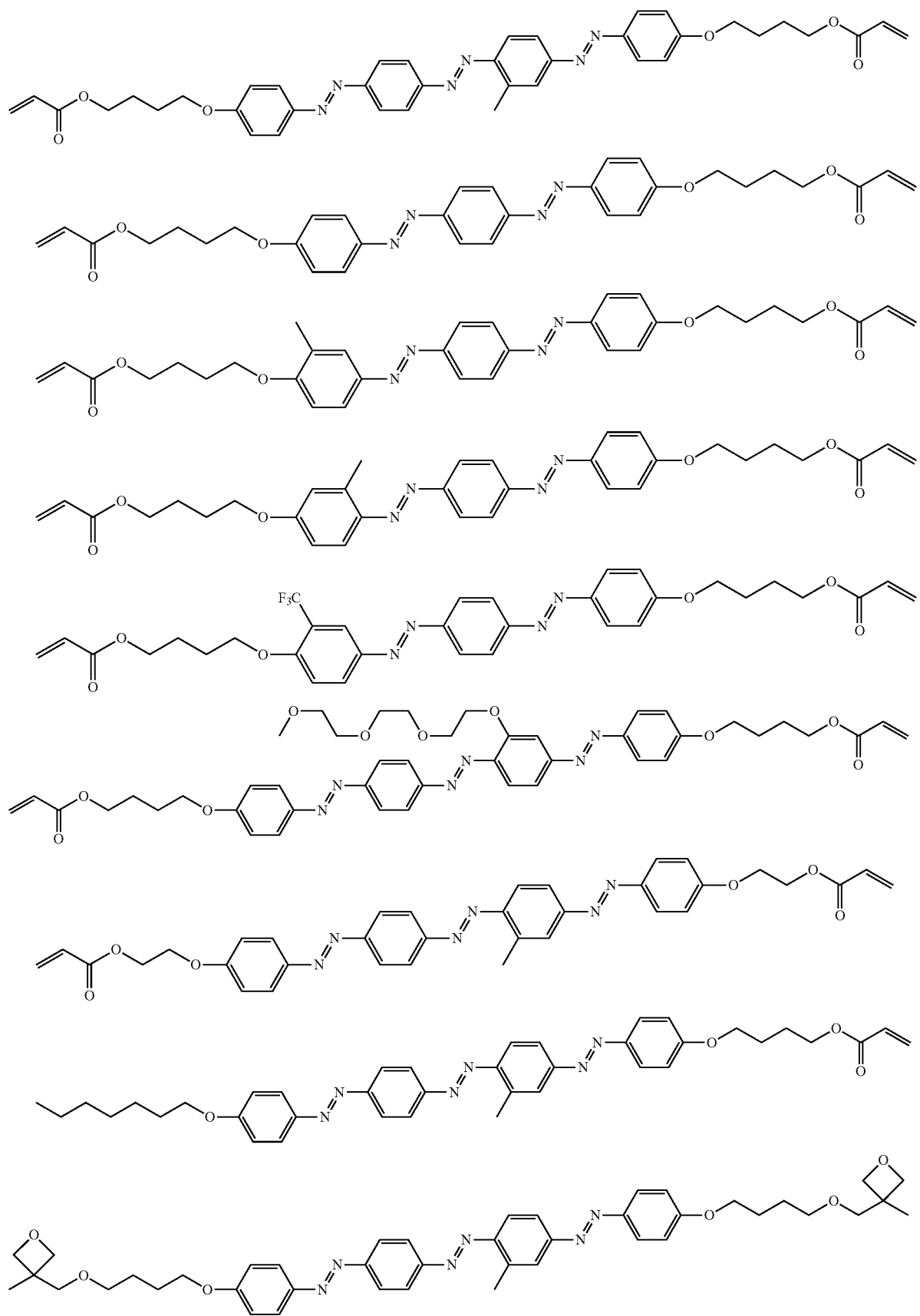

-continued

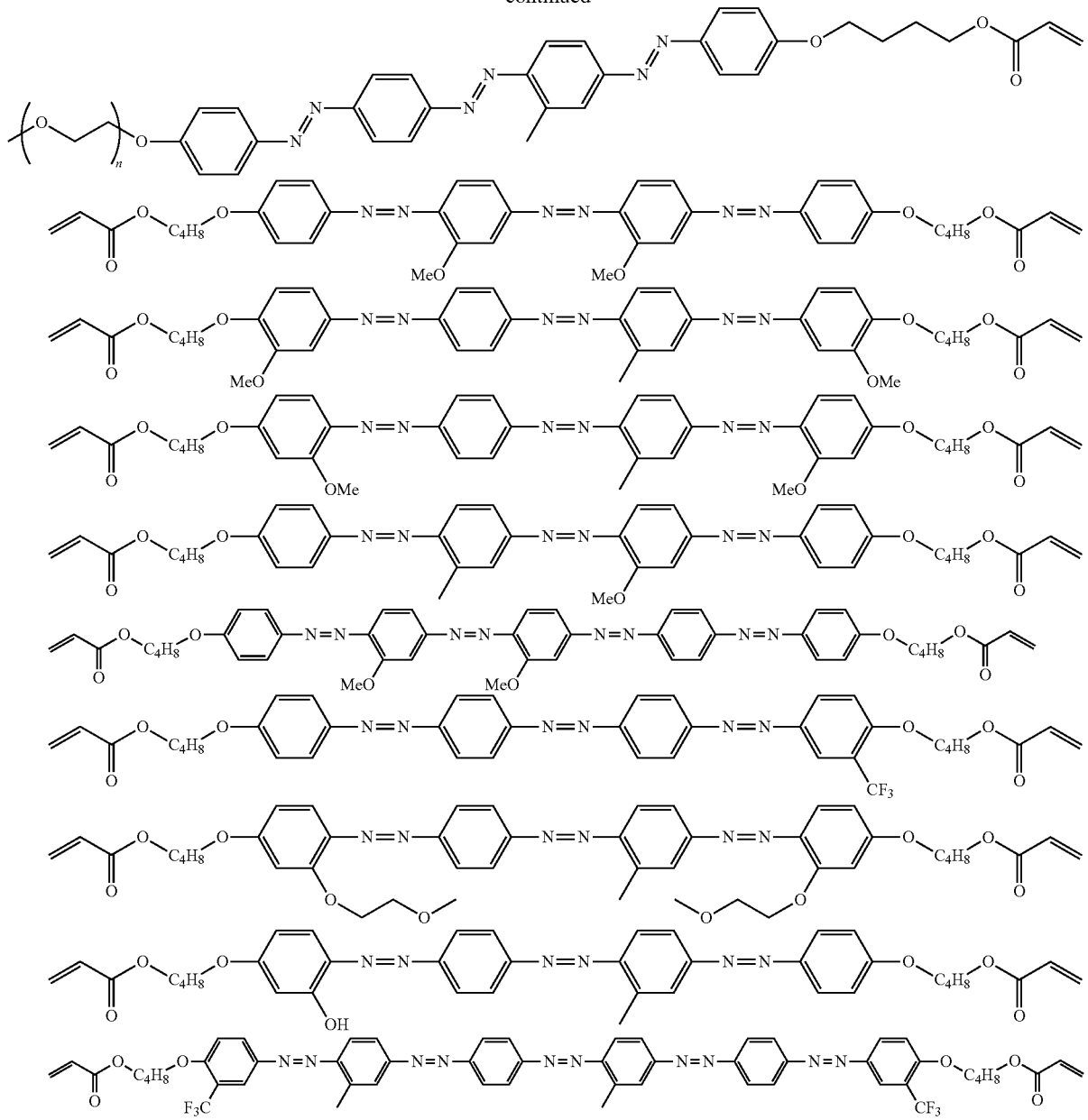

(Content of Dichroic Azo Coloring Agent Compound)

The content of the dichroic azo coloring agent compound is 10% to 30% by mass, preferably 15% to 30% by mass, more preferably 18% to 28% by mass, and still more preferably 20% to 26% by mass with respect to the mass of the total solid content of the light-absorbing anisotropic layer. In a case where the content of the dichroic azo coloring agent compound is within the above range, a light-absorbing anisotropic layer having a high degree of alignment can be obtained even in a case where the light-absorbing anisotropic layer is formed into a thin film. Therefore, a light-absorbing anisotropic layer having excellent flexibility is easily obtained. Moreover, in a case where the content is more than 30% by mass, the suppression of the internal reflection by the refractive index-adjusting layer is less likely to occur.

The content of the first dichroic azo coloring agent compound is preferably 40 to 90 parts by mass and more preferably 45 to 75 parts by mass with respect to 100 parts by mass of the content of all the dichroic azo coloring agent compounds in the composition for forming a light-absorbing anisotropic layer.

The content of the second dichroic azo coloring agent compound is preferably 6 to 50 parts by mass and more preferably 8 to 35 parts by mass with respect to 100 parts by mass of the content of all the dichroic azo coloring agent compounds in the composition for forming a light-absorbing anisotropic layer.

The content of the third dichroic azo coloring agent compound is preferably 3 to 35 parts by mass and more preferably 5 to 30 parts by mass with respect to 100 parts by mass of the content of all the dichroic azo coloring agent compounds in the composition for forming a light-absorbing anisotropic layer.

The content ratio among the first dichroic azo coloring agent compound, the second dichroic azo coloring agent compound, and the third dichroic azo coloring agent compound used as needed can be optionally set in order to adjust the tint of the light-absorbing anisotropic layer. Here, the content ratio (second dichroic azo coloring agent compound/first dichroic azo coloring agent compound) of the second dichroic azo coloring agent compound to the first dichroic azo coloring agent compound is preferably 0.1 to 10, more preferably 0.2 to 5, and particularly preferably 0.3 to 0.8, in terms of mole. In a case where the content ratio of the second dichroic azo coloring agent compound to the first dichroic azo coloring agent compound is within the above range, the degree of alignment is increased.

<Liquid Crystalline Compound>

The composition for forming a light-absorbing anisotropic layer contains a liquid crystalline compound. By containing the liquid crystalline compound, a dichroic azo coloring agent compound can be aligned at a high degree of alignment while restraining the dichroic azo coloring agent compound from being precipitated.

The liquid crystalline compound is a liquid crystalline compound that does not exhibit dichroism.

As the liquid crystalline compound, both a low-molecular liquid crystalline compound and a high-molecular liquid crystalline compound can be used, but the high-molecular liquid crystalline compound is more preferable in order to obtain a high degree of alignment.

Here, the "low-molecular liquid crystalline compound" refers to a liquid crystalline compound having no repeating unit in the chemical structure. Moreover, the "high-molecular liquid crystalline compound" refers to a liquid crystalline compound having a repeating unit in the chemical structure.

Examples of the low-molecular liquid crystalline compound include the liquid crystalline compound described in JP2013-228706A.

Examples of the high-molecular liquid crystalline compound include the thermotropic liquid crystalline polymers described in JP2011-237513A. Moreover, the high-molecular liquid crystalline compound may have a crosslinkable group (for example, an acryloyl group and a methacryloyl group) at the terminal.

The liquid crystalline compound may be used alone or in combination of two or more kinds thereof.

A content of the liquid crystalline compound is preferably 100 to 600 parts by mass, more preferably 200 to 450 parts by mass, and still more preferably 250 to 400 parts by mass with respect to 100 parts by mass of the content of the dichroic azo coloring agent compounds in the composition for forming a light-absorbing anisotropic layer. By setting the content of the liquid crystalline compound to be within the above range, a degree of alignment of the light-absorbing anisotropic layer is further improved.

For a reason that the degree of alignment of the dichroic azo coloring agent compound is superior, the liquid crystalline compound is preferably a high-molecular liquid crystalline compound containing a repeating unit (hereinafter, also referred to as "repeating unit (3-1)") represented by Formula (3-1).

(3-1)

In Formula (3-1), P1 represents a main chain of the repeating unit, L1 represents a single bond or a divalent linking group, SP1 represents a spacer group, M1 represents a mesogenic group, and T1 represents a terminal group.

In the repeating unit (3-1), the difference between the logP value of P1, L1, and SP1 and the logP value of M1 is preferably 4 or greater. The difference is more preferably 4.5 or greater. Since the logP value of the main chain, L1, and the spacer group is separated from the logP value of the mesogenic group by a predetermined value or greater, compatibility between a structure from the main chain to the spacer group and the mesogenic group is low. Thereby, crystallinity of the high-molecular liquid crystalline compound is increased and it is presumed to be in a state where the degree of alignment of the high-molecular liquid crystalline compound is high. As described above, in a case where the degree of alignment of the high-molecular liquid crystalline compound is high, it is presumed that compatibility between the high-molecular liquid crystalline compound and the dichroic azo coloring agent compound is reduced, that is, crystallinity of the dichroic azo coloring agent compound is improved, and a degree of alignment of the dichroic azo coloring agent compound is improved. As a result, it is thought that the obtained degree of alignment of the light-absorbing anisotropic layer is increased.

Specific examples of the main chain of the repeating unit represented by P1 include groups represented by Formulae (P1-A) to (P1-D), and among them, from the viewpoint of a diversity of monomers used as raw materials and easy handling, a group represented by Formula (P1-A) is preferable.

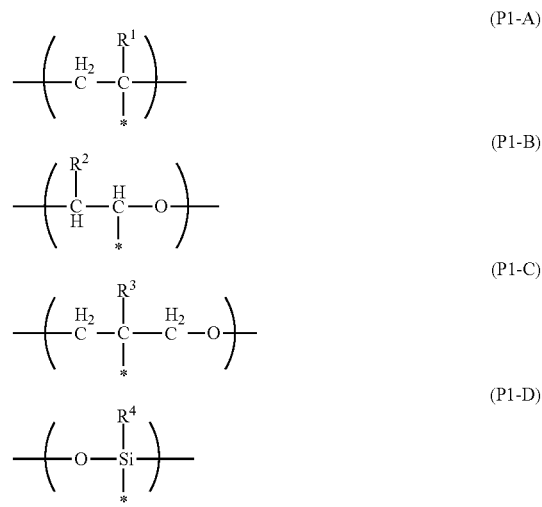

In Formulae (P1-A) to (P1-D), "*" represents a bonding position to L1 in Formula (3-1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group (cycloalkyl group) having a cyclic structure. Moreover, the number of carbon atoms in the alkyl group is preferably 1 to 5.

A group represented by Formula (P1-A) is preferably one unit of a partial structure of poly(meth)acrylic acid ester obtained by polymerization of (meth)acrylic acid ester.

A group represented by Formula (P1-B) is preferably an ethylene glycol unit formed by ring-opening polymerization of an epoxy group of a compound having the epoxy group.

A group represented by Formula (P1-C) is preferably a propylene glycol unit formed by ring-opening polymerization of an oxetane group of a compound having the oxetane group.

A group represented by Formula (P1-D) is preferably a siloxane unit of a polysiloxane obtained by condensation polymerization of a compound having at least one group of an alkoxysilyl group or a silanol group. Here, examples of the compound having at least one group of an alkoxysilyl group or a silanol group include a compound having a group represented by a formula of $SiR^{14}(OR^{15})_2$—. In the formula, $R^{14}$ has the same definition as $R^{14}$ in Formula (P1-D), and a plurality of $R^{15}$'s each independently represent a hydrogen atom or an alkyl group having 1 to 10 carbon atoms.

L1 is a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, R$^3$ and R$^4$ each independently represent a hydrogen atom, or an alkyl group which has 1 to 6 carbon atoms and may have a substituent.

In a case where P1 is a group represented by Formula (P1-A), for a reason that the degree of alignment of the light-absorbing anisotropic layer is superior, L1 is preferably a group represented by —C(O)O—.

In a case where P1 is a group represented by each of Formulae (P1-B) to (P1-D), for a reason that the degree of alignment of the light-absorbing anisotropic layer is superior, L1 is preferably a single bond.

For a reason of easy exhibition of liquid crystallinity or availability of a raw material, the spacer group represented by SP1 preferably contains at least one kind of structure selected from the group consisting of an oxyethylene structure, an oxypropylene structure, a polysiloxane structure, and an alkylene fluoride structure.

Here, the oxyethylene structure represented by SP1 is preferably a group represented by *—(CH$_2$—CH$_2$O)$_{n1}$—*. In the formula, n1 represents an integer of 1 to 20, and * represents a bonding position to L1 or M1 in Formula (3-1). For a reason that the degree of alignment of the light-absorbing anisotropic layer is superior, n1 is preferably an integer of 2 to 10, more preferably an integer of 2 to 4, and most preferably 3.

For a reason that the degree of alignment of the light-absorbing anisotropic layer is superior, the oxypropylene structure represented by SP1 is preferably a group represented by *—(CH(CH$_3$)—CH$_2$O)$_{n2}$—*. In the formula, n2 represents an integer of 1 to 3, and * represents a bonding position to L1 or M1.

For a reason that the degree of alignment of the light-absorbing anisotropic layer is superior, the polysiloxane structure represented by SP1 is preferably a group represented by *—(Si(CH$_3$))—O)$_{n3}$—*, In the formula, n3 represents an integer of 6 to 1.0, and * represents a bonding position to L1 or M1.

For a reason that the degree of alignment of the light-absorbing anisotropic layer is superior, the alkylene fluoride structure represented by SP1 is preferably a group represented by *—(CF$_2$—CF$_2$)$_{n4}$—*. In the formula, n4 represents an integer of 6 to 10, and * represents a bonding position to L1 or M1.

The mesogenic group represented by M1 is a group indicating a main skeleton of a liquid crystal molecule which contributes to liquid crystal formation. The liquid crystal molecule exhibits liquid crystallinity which is an intermediate state (mesophase) between a crystalline state and an isotropic liquid state. The mesogenic group is not particularly limited, and reference can be made to, for example, "Flussige Kristalle in Tribelien II" (VEB Deutsche Verlag fur Grundstoff Industrie, Leipzig, published in 1984), particularly the descriptions on pages 7 to 16, and Editorial committee of Liquid Crystal Handbook, liquid crystal handbook (Maruzen Publishing Co., Ltd., published in 2000), particularly the descriptions in Chapter 3.

As the mesogenic group, for example, a group having at least one kind of cyclic structure selected from the group consisting of an aromatic hydrocarbon group, a heterocyclic group, and an alicyclic group is preferable.

For a reason that the degree of alignment of the light-absorbing anisotropic layer is superior, the mesogenic group preferably has an aromatic hydrocarbon group, more preferably has two to four aromatic hydrocarbon groups, and still more preferably has three aromatic hydrocarbon groups.

As the mesogenic group, from the viewpoint of exhibition of liquid crystallinity, adjustment of a liquid crystal phase transition temperature, availability of a raw material, and synthesis suitability, and for a reason that the degree of alignment of the light-absorbing anisotropic layer is superior, a group represented by Formula (M1-A) or Formula (M1-B) is preferable, and a group represented by Formula (M1-B) is more preferable.

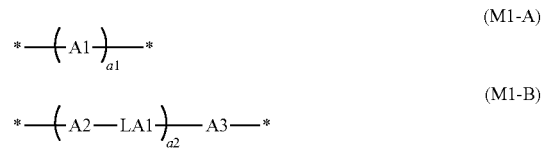

In Formula (M1-A), A1 is a divalent group selected from the group consisting of an aromatic hydrocarbon group, a heterocyclic group, and an alicyclic group. These groups may be substituted with an alkyl group, an alkyl fluoride group, an alkoxy group, or a substituent.

The divalent group represented by A1 is preferably a 4- to 6-membered ring. Moreover, the divalent group represented by A1 may be a single ring or a condensed ring.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group, and from the viewpoint of a diversity of design of a mesogenic skeleton or availability of a raw material, a phenylene group or a naphthylene group is preferable and a phenylene group is more preferable.

The divalent heterocyclic group represented by A1 may be either aromatic or non-aromatic, but is preferably a divalent aromatic heterocyclic group from the viewpoint that the degree of alignment is further improved.

Examples of atoms which constitute the divalent aromatic heterocyclic group and are other than carbon include a nitrogen atom, a sulfur atom, and an oxygen atom. In a case where the aromatic heterocyclic group has a plurality of atoms which constitute a ring and are other than carbon, these atoms may be the same or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same or different from each other.

In Formula (M1-B), A2 and A3 are each independently a divalent group selected from the group consisting of an aromatic hydrocarbon group, a heterocyclic group, and an alicyclic group. Specific examples and suitable aspects of A2 and A3 are the same as those of A1 in Formula (M1-A), and thus descriptions thereof will be omitted.

In Formula (M1-B), a2 represents an integer of 1 to 10, and in a case where a2 is 2 or more, a plurality of A2's may be the same or different from each other, a plurality of A3's may be the same or different from each other, and a plurality of LA1's may be the same or different from each other. For a reason that the degree of alignment of the light-absorbing anisotropic layer is superior, a2 is preferably an integer of 2 or more and more preferably 2.

In Formula (M1-B), in a case where a2 is 1, LA1 is a divalent linking group. In a case where a2 is 2 or more, the plurality of LA1's are each independently a single bond or a divalent linking group, and at least one among the plurality of LA1's is a divalent linking group. In a case where a2 is 2, for a reason that the degree of alignment of the light-absorbing anisotropic layer is superior, it is preferable that one of two LA1's is a divalent linking group and the other is a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)—C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)—C(Z')—C(O)—S—, —S—C(O)—C(Z)=C(Z')—, —C(Z)—N=N=C(Z')— (Z, Z', and Z" independently represent hydrogen, a C1 to C4 alkyl group, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among them, for a reason that the degree of alignment of the light-absorbing anisotropic layer is superior, —C(O)O— is preferable. LA1 may be a group obtained by combining two or more of these groups.

Specific examples of M1 include the following structures. Moreover, in the following specific examples, "Ac" represents an acetyl group.

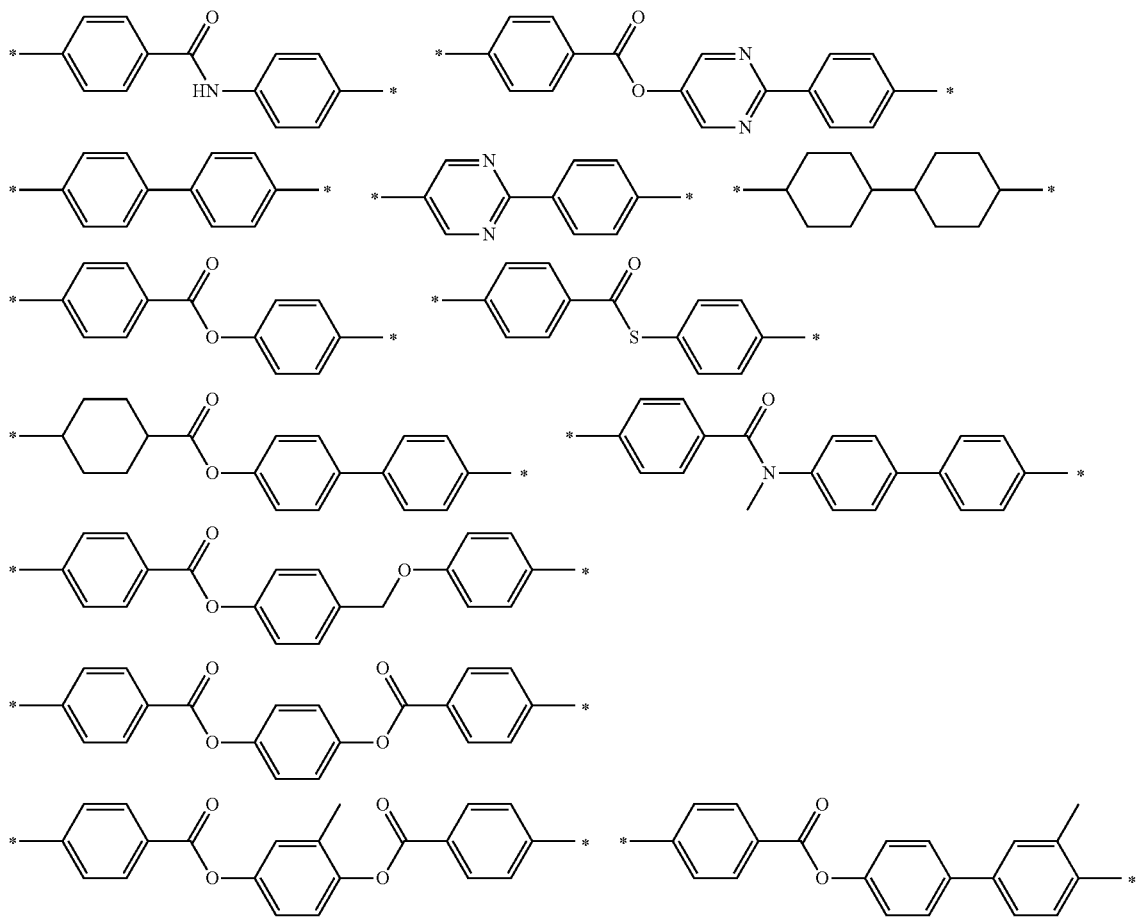

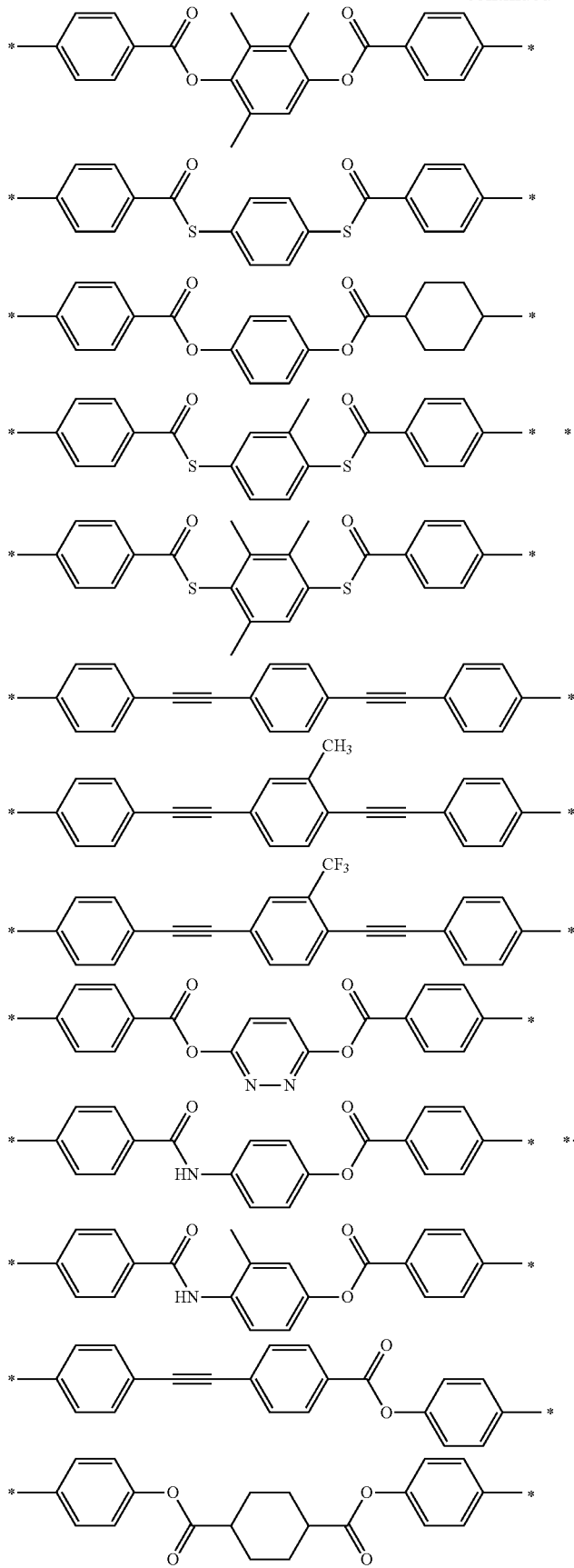

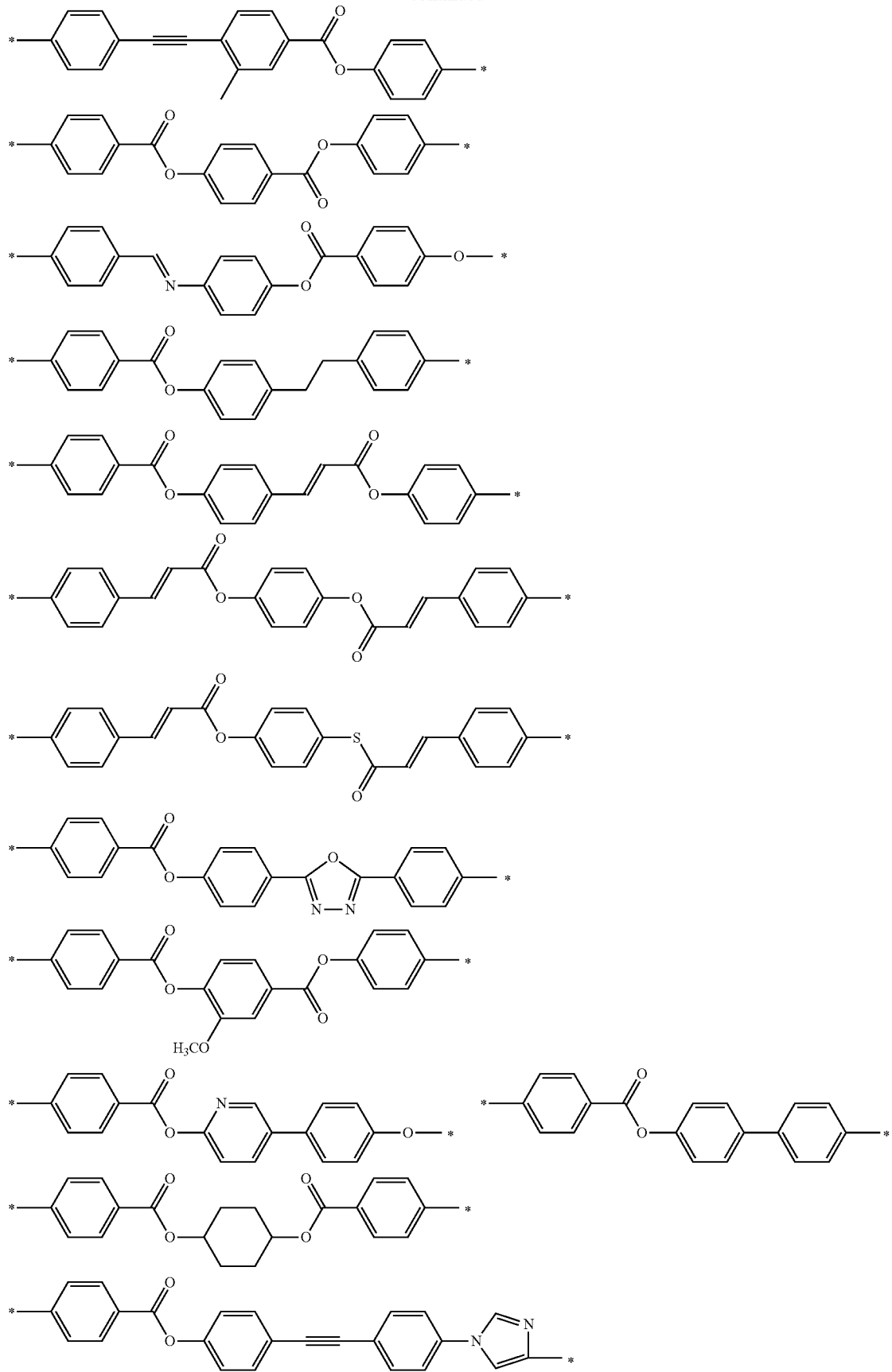

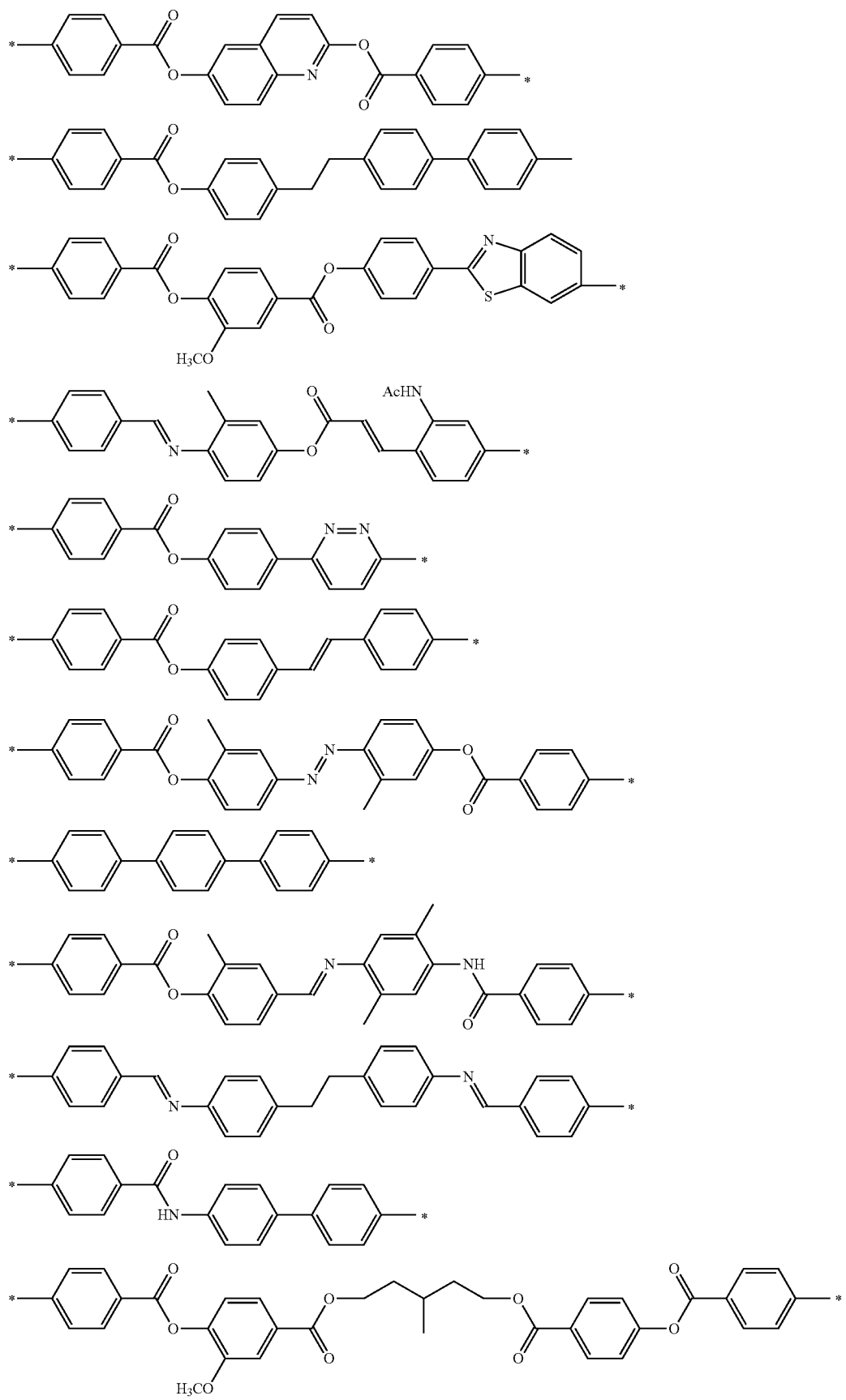

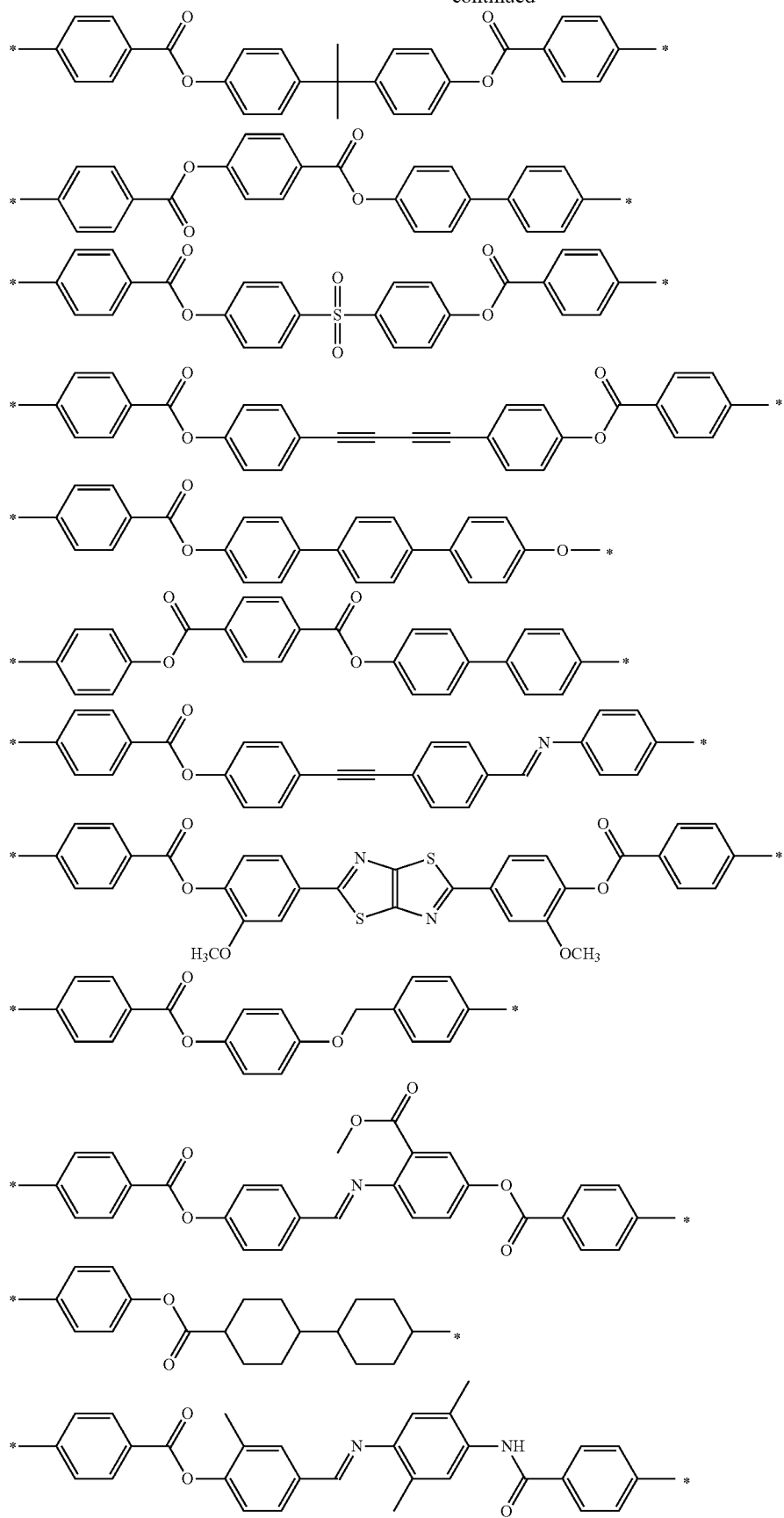

-continued

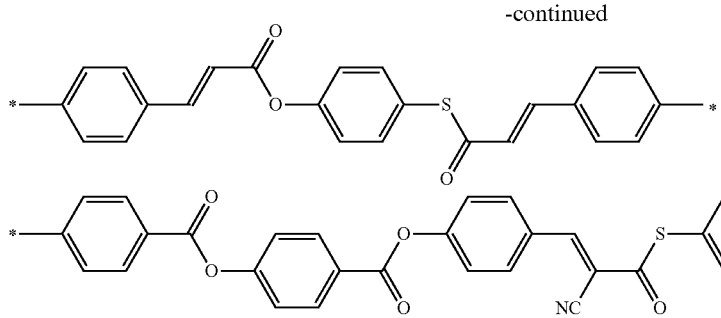

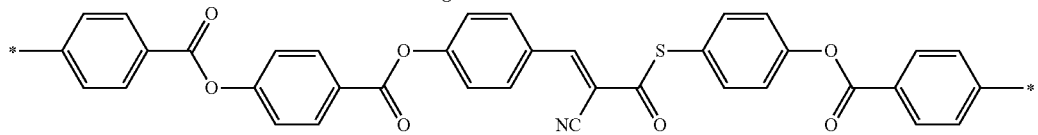

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group (ROC(O)—: R is an alkyl group) having 1 to 10 carbon atoms, an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group; specific examples of the linking group are the same as those of L1 and SP1; and A represents a (meth) acryloyloxy group).

For a reason that the degree of alignment of the light-absorbing anisotropic layer is superior, T1 is preferably an alkoxy group having 1 to 10 carbon atoms, more preferably an alkoxy group having 1 to 5 carbon atoms, and still more preferably a methoxy group. These terminal groups may be further substituted with these groups or the polymerizable group described in JP2010-244038A.

For a reason that the degree of alignment of the light-absorbing anisotropic layer is superior, the number of atoms in the main chain of T1 is preferably 1 to 20, more preferably 1 to 15, still more preferably 1 to 10, and particularly preferably 1 to 7. In a case where the number of atoms in the main chain of T1 is 20 or less, the degree of alignment of the light-absorbing anisotropic layer is further improved. Here, the "main chain" in T1 means the longest molecular chain bonded to M1, and the number of hydrogen atoms is not counted as the number of atoms in the main chain of T1. For example, in a case where T1 is an n-butyl group, the number of atoms in the main chain is 4, and in a case where T1 is a sec-butyl group, the number of atoms in the main chain is 3.

A content of the repeating unit (3-1) is preferably 20% to 100% by mass with respect to 100% by mass of all the repeating units in the high-molecular liquid crystalline compound, for a reason that the degree of alignment of the light-absorbing anisotropic layer is superior.

In the present invention, a content of each repeating unit contained in the high-molecular crystalline compound is calculated based on a charged amount (mass) of each monomer used to obtain each repeating unit.

The high-molecular liquid crystalline compound may contain one kind of repeating unit (3-1) alone or two or more kinds thereof. In a case where the high-molecular liquid crystalline compound contains two or more kinds of the repeating units (3-1), there are advantages such as improvement in a solubility of the high-molecular liquid crystalline compound in a solvent and easy adjustment of the liquid crystal phase transition temperature. In a case where two or more kinds of the repeating units (3-1) are contained, a total amount thereof is preferably within the above range.

In a case where the high-molecular liquid crystalline compound contains two kinds of the repeating units (3-1), for a reason that the degree of alignment of the light-absorbing anisotropic layer is superior, it is preferable that the terminal group represented by T1 in one repeating unit (repeating unit A) is an alkoxy group, and the terminal group represented by T1 in the other repeating unit (repeating unit B) is a group other than an alkoxy group.

For a reason that the degree of alignment of the light-absorbing anisotropic layer is superior, the terminal group represented by T1 in the repeating unit B is preferably an alkoxycarbonyl group, a cyano group, or a (meth)acryloyloxy group-containing group, and more preferably an alkoxycarbonyl group or a cyano group.

A ratio (A/B) of the content of the repeating unit A in the high-molecular liquid crystalline compound to the content of the repeating unit B in the high-molecular liquid crystalline compound is preferably 50/50 to 95/5, more preferably 60/40 to 93/7, and still more preferably 70/30 to 90/10, for a reason that the degree of alignment of the light-absorbing anisotropic layer is superior, <Repeating Unit (3-2)>

The high-molecular liquid crystalline compound of the present invention may further contain a repeating unit (in the present specification, also referred to as a "repeating unit (3-2)") represented by Formula (3-2). Thereby, there are advantages such as improvement in a solubility of the high-molecular liquid crystalline compound in a solvent and easy adjustment of the liquid crystal phase transition temperature.

The repeating unit (3-2) differs from the repeating unit (3-1) in that the repeating unit (3-2) has at least no mesogenic group.

In a case where the high-molecular liquid crystalline compound contains the repeating unit (3-2), the high-molecular liquid crystalline compound is a copolymer of the repeating unit (3-1) and the repeating unit (3-2) (furthermore, may be a copolymer containing the repeating units A and B), and may be any polymer such as a block polymer, an alternating polymer, a random polymer, and a graft polymer.

(3-2)

In Formula (3-2), P3 represents a main chain of the repeating unit, L3 represents a single bond or a divalent linking group, SP3 represents a spacer group, and T3 represents a terminal group.

Specific examples of P3, L3, SP3, and 13 in Formula (3-2) are the same as those of P1, L1, SP1, and T1 in Formula (3-1).

Here, T3 in Formula (3-2) preferably has a polymerizable group from the viewpoint that the hardness of the light-absorbing anisotropic layer is improved.

In a case where the repeating unit (3-2) is contained, a content thereof is preferably 0.5% to 40% by mass and more preferably 1% to 30% by mass with respect to 100% by mass of all the repeating units in the high-molecular liquid crystalline compound.

The high-molecular liquid crystalline compound may contain one kind of repeating unit (3-2) alone or two or more kinds thereof. In a case where two or more kinds of the repeating units (3-2) are contained, a total amount thereof is preferably within the above range.

(Weight-Average Molecular Weight)

A weight-average molecular weight (Mw) of the high-molecular liquid crystalline compound is preferably 1,000 to 500,000 and more preferably 2,000 to 300,000, for a reason that the degree of alignment of the light-absorbing anisotropic layer is superior. In a case where Mw of the high-molecular liquid crystalline compound is within the above range, handling of the high-molecular liquid crystalline compound is easy.

In particular, from the viewpoint of suppression of cracks during application, the weight-average molecular weight (Mw) of the high-molecular liquid crystalline compound is preferably 10,000 or more and more preferably 10,000 to 300,000.

Furthermore, from the viewpoint of a temperature latitude of the degree of alignment, the weight-average molecular weight (Mw) of the high-molecular liquid crystalline compound is preferably less than 10,000 and more preferably 2,000 or more and less than 10,000.

Here, the weight-average molecular weight and the number-average molecular weight in the present invention are values measured by a gel permeation chromatography (GPC) method.

Solvent (eluent): N-Methylpyrrolidone
Device name: TOSOH HLC-8220GPC
Column: Three TOSOH TSKgel Super AWM-H (6 mm×15 cm) are connected and used
Column temperature: 25° C.
Sample concentration: 0.1% by mass
Flow rate: 0.35 mL/min
Calibration curve: Calibration curve obtained by seven samples, which have Mw of 2,800,000 to 1,050 (Mw/Mn=1.03 to 1.06), of TSK standard polystyrene produced by Tosoh Corporation is used <Polymerization Initiator>

The composition for forming a light-absorbing anisotropic layer preferably contains a polymerization initiator.

The polymerization initiator is not particularly limited, but is preferably a photosensitive compound, that is, a photopolymerization initiator.

As the photopolymerization initiator, various kinds of compounds can be used with no particular limitation. Examples of the photopolymerization initiator include the α-carbonyl compound (each of the specifications of U.S. Pat. Nos. 2,367,661A and 2,367,670A), the acyloin ether (the specification of U.S. Pat. No. 2,448,828A), the α-hydrocarbon-substituted aromatic acyloin compound (the specification of U.S. Pat. No. 2,722,512A), the polynuclear quinone compound (each of the specifications of U.S. Pat. Nos. 3,046,127A and 2,951,758A), the combination of a triarylimidazole dimer and a p-aminophenyl ketone (the specification of U.S. Pat. No. 3,549,367A), the acridine and phenazine compounds (JP1985-105667A (JP-S60-105667A) and the specification of U.S. Pat. No. 4,239,850A), the oxadiazole compound (the specification of U.S. Pat. No. 4,212,970A), and the acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

A commercially available product can also be used as such a photopolymerization initiator, and examples thereof include IRGACURE (hereinafter, also simply referred to as "Irg")-184, IRGACURE-907, IRGACURE-369, IRGACURE-651, IRGACURE-819, IRGACURE OXE-01, and IRGACURE OXE-02, which are produced by BASF SE.

In a case where the composition for forming a light-absorbing anisotropic layer contains the polymerization initiator, a content of the polymerization initiator is preferably 0.01 to 30 parts by mass and more preferably 0.1 to 15 parts by mass with respect to 100 parts by mass of the total of the dichroic azo coloring agent compound and the liquid crystalline compound in the composition for forming a fight-absorbing anisotropic layer. In a case where the content of the polymerization initiator is 0.01 parts by mass or more, the durability of the light-absorbing anisotropic layer is favorable, and in a case where the content is 30 parts by mass or less, the degree of alignment of the light-absorbing anisotropic layer is improved.

These polymerization initiators may be used alone or in combination of two or more kinds thereof. In a case where two or more kinds of the polymerization initiators are contained, a total amount thereof is preferably within the above range.

<Interface Modifier>

The composition for forming a light-absorbing anisotropic layer preferably contains an interface modifier.

By incorporation of the interface modifier, the effect that the smoothness of the coating surface is improved to further improve the degree of alignment, or cissing and unevenness are suppressed to improve the in-plane uniformity is anticipated.

As the interface modifier, a material having the dichroic azo coloring agent compound and the liquid crystalline compound horizontal on the coating surface side is preferable, and the compounds (horizontal alignment agents) described in paragraphs [0253] to [0293] of JP2011-237513A can be used.

In a case where the composition for forming a light-absorbing anisotropic layer contains the interface modifier, a content thereof is preferably 0.001 to 5 parts by mass and more preferably 0.01 to 3 parts by mass with respect to 100 parts by mass of the total of the dichroic azo coloring agent compound and the liquid crystalline compound in the composition for forming a light-absorbing anisotropic layer.

These interface modifiers may be used alone or in combination of two or more kinds thereof. In a case where two or more kinds of the interface modifiers are contained, a total amount thereof is preferably within the above range.

<Solvent>

The composition for forming a light-absorbing anisotropic layer preferably contains a solvent from the viewpoint of workability or the like.

Examples of the solvent include organic solvents such as ketones (for example, acetone, 2-butanone, methyl isobutyl ketone, cyclopentanone, cyclohexanone, and the like), ethers (for example, dioxane, tetrahydrofuran, and the like), aliphatic hydrocarbons (for example, hexane and the like), alicyclic hydrocarbons (for example, cyclohexane and the like), aromatic hydrocarbons (for example, benzene, toluene, xylene, trimethylbenzene, and the like), halocarbons (for example, dichloromethane, trichloromethane, dichloroethane, dichlorobenzene, chlorotoluene, and the like), esters (for example, methyl acetate, ethyl acetate, butyl acetate, and the like), alcohols (for example, ethanol, isopropanol, butanol, cyclohexanol, and the like), cellosolves (for example, methyl cellosolve, ethyl cellosolve, 1,2-dimethoxyethane, and the like), cellosolve acetates, sulfoxides (for example, dimethyl sulfoxide and the like), amides (for example, dimethylformamide, dimethylacetamide, and the like), and heterocyclic compounds (for example, pyridine and the like); and water. These solvents may be used alone or in combination of two or more kinds thereof.

Among these solvents, it is preferable to use the organic solvents, and more preferable to use the halocarbons or the ketones.

In a case where the composition for forming a light-absorbing anisotropic layer contains the solvent, a content of the solvent is preferably 80% to 99% by mass, more preferably 83% to 97% by mass, and particularly preferably 85% to 95% by mass with respect to the total mass of the composition for forming a light-absorbing anisotropic layer.

These solvents may be used alone or in combination of two or more kinds thereof. In a case where two or more kinds of the solvents are contained, a total amount thereof is preferably within the above range.

<Formation Method>

A method for forming a light-absorbing anisotropic layer using the above-mentioned composition for forming a light-absorbing anisotropic layer is not particularly limited, and examples thereof include a method including a step (hereinafter, also referred to as a "coating film formation step") of applying the above-mentioned composition for forming a light-absorbing anisotropic layer onto the alignment layer described later according to the layer configuration to form a coating film, and a step (hereinafter, also referred to as an "alignment step") of aligning liquid crystalline components contained in the coating film, in this order.

Furthermore, the liquid crystalline component is a component containing not only the above-mentioned liquid crystalline compound hut also the dichroic azo coloring agent compound having liquid crystallinity in a case where the above-mentioned dichroic azo coloring agent compound has liquid crystallinity.

(Coating Film Formation Step)

The coating film formation step is a step of applying the composition for forming a light-absorbing anisotropic layer onto the alignment layer to form a coating film.

By using the composition which is for forming a light-absorbing anisotropic layer and contains the above-mentioned solvent or using a liquid material such as a molten liquid obtained by heating or the like of the composition for forming a light-absorbing anisotropic layer, the composition for forming a light-absorbing anisotropic layer is easily applied onto the alignment layer or the liquid crystal layer.

Specific examples of the method for applying the composition for forming a light-absorbing anisotropic layer include well-known methods such as a roll coating method, a gravure printing method, a spin coating method, a wire bar coating method, an extrusion coating method, a direct gravure coating method, a reverse gravure coating method, a die-coating method, a spray method, and an ink jet method.

(Alignment Step)

The alignment step is a step of aligning liquid crystalline components contained in the coating film. Thereby, a light-absorbing anisotropic layer is obtained.

The alignment step may include a drying treatment. Components such as a solvent can be removed from the coating film by the drying treatment. The drying treatment may be performed by a method (for example, natural drying) for leaving the coating film at room temperature for a predetermined time or a method for heating and/or blowing.

Here, the liquid crystalline components contained in the composition for forming a light-absorbing anisotropic layer may be aligned by the above-mentioned coating film formation step or drying treatment. For example, in an aspect in which the composition for forming a light-absorbing anisotropic layer is prepared as a coating liquid containing a solvent, by drying the coating film and removing the solvent from the coating film, a coating film (that is, a light-absorbing anisotropic layer) having a light absorption anisotropy is obtained.

In a case where the drying treatment is performed at a temperature equal to or higher than a transition temperature of the liquid crystalline component contained in the coating film to a liquid crystal phase, a heating treatment described later may not be performed.

The transition temperature of the liquid crystalline component contained in the coating film to a liquid crystal phase is preferably 10° C. to 250° C. and more preferably 25° C. to 190° C. from the viewpoint of manufacturing suitability or the like. In a case where the transition temperature is 10° C. or higher, a cooling treatment or the like for lowering the temperature to a temperature range in which a liquid crystal phase is exhibited is not required, which is preferable. Moreover, in a case where the transition temperature is 250° C. or lower, a high temperature is not required even in a case of once reaching an isotropic liquid state having a temperature higher than the temperature range in which a liquid crystal phase is exhibited and waste of heat energy and deformation and deterioration of a substrate can be reduced, which is preferable.

The alignment step preferably includes a heating treatment. Thereby, the liquid crystalline components contained in the coating film can be aligned, and thus the coating film after the heating treatment can be suitably used as a light-absorbing anisotropic layer.

The heating treatment is preferably 10° C. to 250° C. and more preferably 25° C. to 190° C. from the viewpoint of manufacturing suitability or the like. Moreover, a heating time is preferably 1 to 300 seconds and more preferably 1 to 60 seconds.

The alignment step may include a cooling treatment performed after the heating treatment. The cooling treatment is a treatment for cooling the heated coating film to about room temperature (20° C. to 25° C.). Thereby, the alignment of the liquid crystalline components contained in the coating film can be fixed. A cooling means is not particularly limited, and can be performed by a well-known method.

Through the above steps, a light-absorbing anisotropic layer can be obtained.

Furthermore, in the present aspect, as a method for aligning the liquid crystalline components contained in the coating film, a drying treatment and a heating treatment are mentioned, but the method is not limited to these treatments and can be performed by a well-known alignment treatment.

(Other Steps)

The method for manufacturing the light-absorbing anisotropic layer may include a step (hereinafter, also referred to as a "curing step") of curing the light-absorbing anisotropic layer, after the alignment step.

For example, in a case where the light-absorbing anisotropic layer has a crosslinkable group (polymerizable group), the curing step is performed by heating and/or light irradiation (exposure). Among them, the curing step is preferably performed by light irradiation.

As a light source used for curing, various light sources such as an infrared ray, visible light, and an ultraviolet ray can be used, but an ultraviolet ray is preferable. Moreover, in the curing, ultraviolet rays may be radiated while heating, or ultraviolet rays may be radiated through a filter which transmits only a specific wavelength.

In a case where exposure is performed while heating, a heating temperature in the exposure depends on the transition temperature of the liquid crystalline component contained in the light-absorbing anisotropic layer to a liquid crystal phase, but is preferably 25° C. to 140° C.

Furthermore, the exposure may be performed under a nitrogen atmosphere. In a case where curing of the light-absorbing anisotropic layer proceeds by radical polymerization, inhibition of polymerization due to oxygen is reduced, and thus it is preferable that the exposure is performed under a nitrogen atmosphere.

[Refractive Index-Adjusting Layer]

The refractive index-adjusting layer included in the laminate according to the embodiment of the present invention is a layer disposed so as to be in contact with the light-absorbing anisotropic layer, is formed of a composition containing a compound having a crosslinkable group, and has an in-plane average refractive index of 1.55 to 1.70 at a wavelength of 550 nm.

(Method for Measuring in-Plane Average Refractive Index)

An in-plane average refractive index is measured using a spectroscopic ellipsometer M-2000U manufactured by J. A. Woollam. A direction in which a refractive index is maximum in the plane is defined as an x axis, a direction orthogonal to the direction is defined as a y axis, a normal direction with respect to the in-plane is defined as a z axis, and refractive indices in the respective directions are defined as $n_x$, $n_y$, and $n_z$. The in-plane average refractive index ($n_{ave}$) in the present invention is represented by Expression (1).

$$n_{ave}=(n_x+n_y)/2 \quad \text{Expression (1)}$$

The in-plane average refractive index of the refractive index-adjusting layer may be within the above range, but is preferably 1.58 to 1.70 and more preferably 1.60 to 1.70.

A thickness of the refractive index-adjusting layer is not particularly limited, but is preferably 0.01 to 2.00 μm, more preferably 0.01 to 0.80 μm, and still more preferably 0.01 to 0.15 μm from the viewpoint of reduction in thickness.

A type of a component constituting the refractive index-adjusting layer is not particularly limited as long as the component contains a compound having a crosslinkable group. The hardness in the layer can be ensured by the presence of the crosslinkable group. A compound cured by light or heat is preferably a polymerizable compound having a (meth)acryloyl group or an epoxy group, for example. Moreover, from the viewpoint that a high in-plane average refractive index can be obtained, a polymerizable liquid crystal compound is also preferable. Furthermore, the polymerizable liquid crystal compound can control the anisotropy of the refractive index in the plane, and thus has a high potential for optimizing the refractive index of the light-absorbing anisotropic layer having the refractive index anisotropy in the plane.

For a reason that the adhesiveness to the oxygen shielding layer is improved, the refractive index-adjusting layer preferably contains a compound having a boronic acid structure.

Examples of the compound having fix boronic acid structure include the compound described in paragraphs [0061] to [0065] of JP2006-309120A, and the compound (copolymer) which has a fluorine-containing boronic acid structure and is described in JP2018-005215A.

The refractive index-adjusting layer may contain particles together with the compound having a crosslinkable group. Examples of the particles include organic particles, inorganic particles, and organic-inorganic composite particles containing an organic component and an inorganic component.

Examples of the organic particles include styrene resin particles, styrene-divinylbenzene copolymer particles, acrylic resin particles, methacrylic resin particles, styrene-acryl copolymer particles, styrene-methacryl copolymer particles, melamine resin particles, and resin particles containing two or more kinds thereof.

Examples of a component constituting the inorganic particles include a metal oxide, a metal nitride, a metal oxynitride, and a metal simple substance. Examples of a metallic atom contained in the above-mentioned metal oxide, metal nitride, metal oxynitride, and metal simple substance include a titanium atom, a silicon atom, an aluminum atom, a cobalt atom, and a zirconium atom. Specific examples of the inorganic particles include inorganic oxide particles such as alumina particles, hydrated alumina particles, silica particles, zirconia particles, and a clay mineral (for example, smectite). From the viewpoint that a high refractive index can be obtained, zirconia particles are preferable.

An average particle diameter of the particles is preferably 1 to 300 nm and more preferably 10 to 200 nm. In a case where the average particle diameter is within the above range, a cured product (transparent resin layer) having excellent dispersibility of the particles and superior high-temperature durability, moisture-heat resistance, and transparency can be obtained.

Here, the average particle diameter of the particles can be obtained from a photograph obtained by observation with a transmission electron microscope (TEM) or a scanning electron microscope (SEM). Specifically, the projected area of the particle is obtained, and the corresponding circle-equivalent diameter (a diameter of a circle) is taken as the average particle diameter of the particles. Moreover, the average particle diameter in the present invention is an arithmetic mean value of circle-equivalent diameters obtained for 100 particles.

The particles may have any shape such as a spherical shape, a needle shape, a fiber (fiber shape), a columnar shape, and a plate shape.

The content of the particles in the refractive index-adjusting layer is not particularly limited, but is preferably 1% to 50% by mass and more preferably 1% to 30% by mass with respect to the total mass of the refractive index-adjusting layer, from the viewpoint that the in-plane average, refractive index of the refractive index-adjusting layer is easily adjusted.

A method for forming the refractive index-adjusting layer is not particularly limited, but examples thereof include a method in which a composition for forming a refractive index-adjusting layer is applied onto a polarizer, and as needed, the coating film is subjected to a curing treatment.

The composition for forming a refractive index-adjusting layer contains components which can constitute the refractive index-adjusting layer, and examples thereof include a resin, a monomer, and particles. Examples of the resin and particles are as described above.

Examples of the monomer include a photocurable compound and a thermosetting compound (for example, a thermosetting resin). As the monomer, a monofunctional polymerizable compound containing one polymerizable group in one molecule, and a polyfunctional polymerizable compound containing the same or different two or more polymerizable groups in one molecule are preferable. The polymerizable compound may be a monomer or a multimer such as an oligomer or a prepolymer.

Examples of the polymerizable group include a radically polymerizable group and a canonically polymerizable group, and a radically polymerizable group is preferable. Examples of the radically polymerizable group include an ethylenically unsaturated bond group. Examples of the cationically polymerizable group include an epoxy group and an oxetane group.

The composition for forming a refractive index-adjusting layer may contain at least one of an interface modifier, a polymerization initiator, or a solvent. Examples of these components include the compounds exemplified as the components which may be contained in the composition for forming a light-absorbing anisotropic layer.

A method for applying the composition for forming a refractive index-adjusting layer is not particularly limited, and examples thereof include the above-mentioned method for applying the composition for forming a light-absorbing anisotropic layer.

After the composition for forming a refractive index-adjusting layer is applied, as needed, the coating film may be subjected to the drying treatment.

Furthermore, in a case where the composition for forming a refractive index-adjusting layer contains a curable compound such as a monomer, after the composition for forming a refractive index-adjusting layer is applied, the coating film may be subjected to a curing treatment.

Examples of the curing treatment include a photo-curing treatment and a thermosetting treatment, and optimal conditions are selected according to the material used.

In a case where the polymerizable liquid crystal compound is used as the compound having a crosslinkable group, the compound is not particularly limited.

In general, the liquid crystalline compound can be classified into a rod-like type and a disk-like type according to the shape thereof. Furthermore, each liquid crystalline compound has a low-molecular type and a high-molecular type. In general, the high-molecular indicates that a degree of polymerization is 100 or higher (Polymer Physics Phase Transition Dynamics, written by Masao DOI, page 2, Iwanami Shoten, Publishers, 1992).

In the present invention, any liquid crystalline compound can be used, but it is preferable to use a rod-like liquid-crystalline compound (hereinafter, also simply referred to as "CLC") or a discotic liquid-crystalline compound (hereinafter, also simply referred to as "DLC"), and more preferable to use a rod-like liquid-crystalline compound. Moreover, two or more kinds of rod-like liquid-crystalline compounds, two or more kinds of disk-like liquid-crystalline compounds, or a mixture of a rod-like liquid-crystalline compound and a disk-like liquid-crystalline compound may be used.

In the present invention, in order to fix the above-mentioned liquid crystalline compounds, it is necessary to use a liquid crystalline compound having a polymerizable group, and the liquid crystalline compound more preferably has two or more polymerizable groups in one molecule. Moreover, in a case where the liquid crystalline compound is a mixture of two or more kinds thereof, it is preferable that at least one kind of liquid crystalline compound has two or more polymerizable groups in one molecule. Furthermore, after the liquid crystalline compound is fixed by polymerization, it is no longer necessary to exhibit liquid crystallinity.

In addition, a type of the polymerizable group is not particularly limited, and is preferably a functional group capable of an addition polymerization reaction and more preferably a polymerizable ethylenically unsaturated group or a ring polymerizable group. More specifically, a (meth)acryloyl group, a vinyl group, a styryl group, an allyl group, and the like are preferably mentioned, and a (meth)acryloyl group is more preferable. Moreover, the (meth)acryloyl group is a notation representing a methacryloyl group or an acryloyl group.

As the rod-like liquid-crystalline compound, for example, the compounds described in claim 1 of JP1999-513019A (JP-H11-513019A) or paragraphs [0026] to [0098] of JP2005-289980A can be preferably used, and as the discotic liquid-crystalline compound, for example, the compounds described in paragraphs [0020] to [0067] of JP2007-108732A or paragraphs [0013] to [0108] of JP2010-244038A can be preferably used, but the present invention is not limited to these examples.

<Other Components>

Specific examples of other components contained in the composition for forming a refractive index-adjusting layer include the polymerization initiator, surfactant, and solvent described in the above-mentioned composition (composition for forming a light-absorbing anisotropic layer) containing the dichroic azo coloring agent compound.

<Formation Method>

A method for forming a refractive index-adjusting layer using the above-mentioned composition for forming a refractive index-adjusting layer is not particularly limited, and examples thereof include a method including a step (hereinafter, also referred to as a "coating film formation step") of applying the above-mentioned composition for forming a refractive index-adjusting layer onto the alignment layer described later or the above-mentioned light-absorbing anisotropic layer according to the layer configuration to form a coating film, and a step (hereinafter, also referred to as an "alignment step") of aligning liquid crystalline components contained in the coating film, in this order.

Here, as the coating film formation step and the alignment step, the same steps as those described in the above-mentioned method for forming a light-absorbing anisotropic layer are mentioned.

[Oxygen Shielding Layer]

The laminate according to the embodiment of the present invention includes an oxygen shielding layer for the purpose of improving the light resistance of the dichroic azo coloring agent compound in the light-absorbing anisotropic layer.

Here, the oxygen shielding layer refers to an oxygen shielding film having an oxygen shielding function, but in the present invention, refers to an oxygen shielding film having an oxygen permeability of 200 cc/m²/day/atm or less.

Furthermore, the oxygen permeability is an index indicating an amount of oxygen passing through the film per unit time and unit area, and in the present invention, a value measured by an oxygen concentration device (for example; MODEL3600 manufactured by Hack Ultra Analytical, or the like) in an environment of 25° C. and a relative humidity of 50% is employed.

In the present invention, the oxygen permeability is preferably 100 cc/m²/day/atm or less, more preferably 30 cc/m²/day/atm or less, still more preferably 10 cc/m²/day/atm or less, and most preferably 3 cc/m²/day/atm or less.

Specific examples of the oxygen shielding layer include layers containing an organic compound such as a polyvinyl alcohol-based resin, a polyethylene vinyl alcohol-based resin, polyvinyl ether, polyvinyl pyrrolidone, polyacrylamide, polyacrylic acid, cellulose ether, polyamide, polyimide, a styrene-maleic acid copolymer; gelatin, vinylidene chloride, and cellulose nanofiber.

Among them, from the viewpoint of high oxygen shielding capacity, a layer containing a polyvinyl alcohol-based resin or a polyethylene vinyl alcohol-based resin is preferable, and a layer containing a polyvinyl alcohol-based resin is particularly preferable.

Examples of a compound which has a high oxygen shielding function and is a polymerizable compound include a polymerizable compound having high hydrogen bonding properties, and a compound having a large number of polymerizable groups per molecular weight. Examples of the compound having a large number of polymerizable groups per molecular weight include pentaerythritol tetra(meth)acrylate and dipentaerythritol hexa(meth)acrylate.

Specific examples of the polymerizable compound having high hydrogen bonding properties include compounds represented by the following formulae, and among them, 3',4'-epoxycyclohexylmethyl-3,4-epoxycyclohexanecarboxylate represented by the following CEL2021P is preferable.

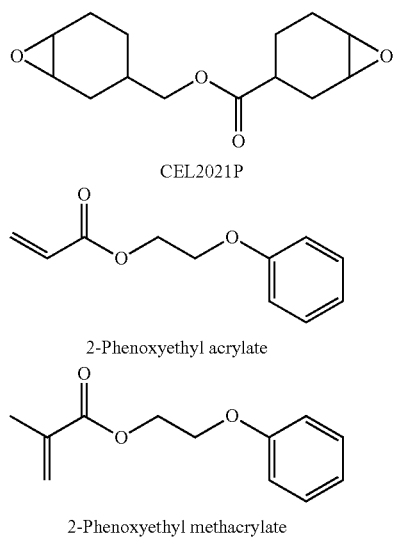

CEL2021P

2-Phenoxyethyl acrylate

2-Phenoxyethyl methacrylate

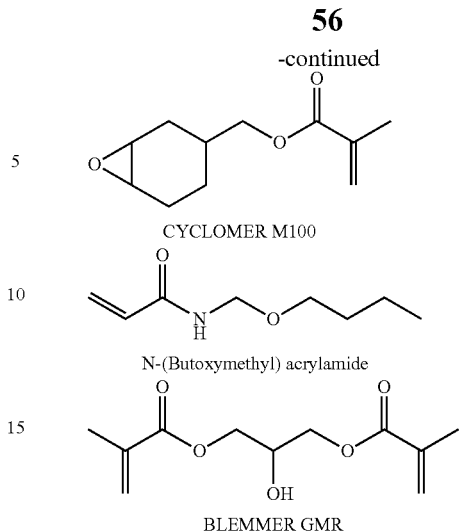

CYCLOMER M100

N-(Butoxymethyl) acrylamide

BLEMMER GMR

In addition, a thin layer (thin metal compound layer) consisting of a metal compound is also exemplified. As a method for forming the thin metal compound layer, any method can be used as long as a desired thin layer can be formed by the method. For example, a sputtering method, a vacuum deposition method, an ion plating method, and a plasma chemical vapor deposition (CVD) method are suitable, and specifically, the formation methods described in JP3400324B, JP2002-322561A, and 22002-361774A can be employed.

A component contained in the thin metal compound layer is not particularly limited as long as the component exhibits the oxygen shielding function, and for example, an oxide, a nitride, an oxynitride, or the like which contains one or more kinds of metals selected from Si, Al, In, Sn, Zn, Ti, Cu, Ce, and Ta can be used. Among them, an oxide, nitride, or oxynitride of a metal selected from Si, Al, In, Sn, Zn, and Ti is preferable, and an oxide, nitride, or oxynitride of a metal selected from Si, Al, Sn, and Ti is particularly preferable. The oxide, nitride, or oxynitride may contain other elements as secondary components. A layer consisting of a reaction product of an aluminum compound and a phosphorus compound as described in JP2016-040120A or 22016-155255A is also preferable.

In addition, the oxygen shielding layer may be in a form in which a layer containing the organic material and the thin metal compound layer are laminated, for example, as described in U.S. Pat. No. 6,413,645B, JP2015-226995A, JP2013-202971A, JP2003-335880A, JP1978-012953B (JP-S53-012953B), and JP1983-2173414A (JP-S58-217344A), or may be a layer in which an organic compound and an inorganic compound are hybridized, as described in WO2011/011836A, JP2013-248832A, and JP3855004B.

In a case of the layer containing the organic compound, the film thickness of the oxygen shielding layer is preferably 0.1 to 10 μm and more preferably 0.5 to 5.5 μm. In a case of the thin metal compound layer, the film thickness of the oxygen shielding layer is preferably 5 nm to 500 nm and more preferably 10 μm to 200 nm.

In the present invention, for a reason that the internal reflection is suppressed, the in-plane average refractive index of the oxygen shielding layer at a wavelength of 550 nm is preferably 1.50 to 1.65 and more preferably 1.55 to 1.65.

In the present invention, the oxygen shielding layer may be a layer which also functions as a surface protective layer or an adhesive layer which will be described later, for example.

In particular, it is preferable that the oxygen shielding layer also functions as an adhesive layer between the above-mentioned refractive index-adjusting layer and the surface protective layer described later. In this case, an aspect in which the oxygen shielding layer is an adhesive containing a polyvinyl alcohol-based resin is a preferred aspect.

[Surface Protective Layer]

The laminate according to the embodiment of the present invention preferably includes a surface protective layer on a side of the oxygen shielding layer opposite to the refractive index-adjusting layer, that is, the most visible side in a case where the laminate is used as a part of a display device.

The surface protective layer is not limited as long as the layer has a function of protecting the surface, and may be a single layer or a plurality of layers. Not only high hardness is preferable, but also high recoverability is preferable. A low-reflection layer which suppresses surface reflection occurring at an air interface is also preferable.

Examples of the preferred aspect include an aspect in which a support and/or a surface coating layer is provided. The support and the surface coating layer will be described below.

(Support)

The surface protective layer preferably has a support, and more preferably has a transparent support.

Here, "transparent" in the present invention indicates that a transmittance of visible light is 60% or greater, preferably 80% or greater, and particularly preferably 90% or greater.

Specific examples of the transparent support include a glass substrate and a plastic substrate, and among them, a plastic substrate is preferable.

Examples of the plastic constituting the plastic substrate include polyolefin such as polyethylene, polypropylene, and a norbornene-based polymer; a cyclic olefin-based resin; polyvinyl alcohol; polyethylene terephthalate; polymethacrylic acid ester; polyacrylic acid ester; cellulose ester such as triacetyl cellulose (TAC), diacetyl cellulose, and cellulose acetate propionate; polyethylene naphthalate; polycarbonate; polysulfone; polyether sulfone; polyether ketone; polyphenylene sulfide; polyphenylene oxide; and a polyimide resin.

Among them, cellulose ester, a cyclic olefin-based resin, polyethylene terephthalate, and polymethacrylic acid ester are preferable from the viewpoint of easy availability from the market and excellent transparency, and a polyimide resin is preferable from the viewpoint of excellent flexibility.

The polyimide has a high refractive index and thus there is a possibility of a large refractive index gap, but it is also preferable to adjust the refractive index by a method such as mixing of silica particles. Details of the polyimide are described in WO2018/062296A or WO2018/062190A.

In the present invention, for a reason that the internal reflection is suppressed, it is preferable that the support included in the surface protective layer has an in-plane average refractive index of 1.45 to 1.60 at a wavelength of 550 nm, and a hard coat layer has an in-plane average refractive index of 1.5 to 1.6 at a wavelength of 550 nm.

A thickness of the transparent support is preferably thin enough to maintain strength and workability, from the viewpoint that the mass is sufficient for practical handling and the viewpoint that sufficient transparency can be ensured.

A thickness of the glass substrate is preferably 1.00 to 3,000 μm and more preferably 100 to 1,000 μm.

A thickness of the plastic substrate is preferably 5 to 300 μm and more preferably 5 to 200 μm.

Furthermore, in a case where the laminate according to the embodiment of the present invention is used as a circularly polarizing plate (particularly, a case of being used as a circularly polarizing plate for a mobile device application), the thickness of the transparent support is preferably about 5 to 100 μm.

(Surface Coating Layer)

Examples of the surface coating layer include at least one selected from the group consisting of an antireflection layer, an antiglare layer, and a hard coat layer. Among them, a hard coat layer is preferable. Well-known layer materials are used for the layers. Furthermore, the layers may be laminated in a plurality of layers.

The antireflection layer refers to a structure which reduces reflection by a structure using light interference, unlike the above-mentioned antireflection plate of a so-called circularly polarizing plate which is configured with the optically anisotropic layer and the light-absorbing anisotropic layer. As the simplest configuration, the antireflection layer may have a configuration consisting of only a layer of low refractive index. Moreover, in order to further reduce a reflectivity; the antireflection layer is preferably configured by combining a layer of high refractive index having a high refractive index with a layer of low refractive index having a low refractive index. Examples of the configuration include a configuration including two layers of the layer of high refractive index/the layer of low refractive index in this order from a lower side and a configuration in which three layers having different refractive indices are laminated in the order of a layer of medium refractive index (layer having a refractive index which is higher than that of an underlayer and lower than that of the layer of high refractive index)/the layer of high refractive index/the layer of low refractive index, and a configuration in which more antireflection layers are laminated is also proposed. Above them, from the viewpoint of durability, optical characteristics, cost, or productivity, it is preferable that the layer of medium refractive index/the layer of high refractive index/the layer of tow refractive index are provided in this order on a hard coat layer, and examples thereof include configurations described in JP1996-122504A (JP-H08-122504A), JP1996-110401A (JP-H08-110401A), JP1998-300902A (JP-H10-300902A), JP2002-243906A, and JP2000-111706A. Moreover, an antireflection film having a three-layer configuration, which is excellent in robustness against a film thickness variation, is described in JP2008-262187A. In a case where the antireflection film having a three-layer configuration is installed on a surface of an image display device, an average value of the reflectivity can be 0.5% or less, reflected glare can be significantly reduced, and an image having an excellent stereoscopic effect can be obtained. Furthermore, other functions may be imparted to each layer, and examples thereof include a layer of low refractive index having antifouling properties, a layer of high refractive index having antistatic properties, a hard coat layer having antistatic properties, and a hard coat layer having anti-glare characteristics (for example, JP1998-206603A (JP-H10-206603A), JP2002-243906A, JP2007-264113A, and the like).

Meanwhile, as the hard coat layer, a hard coat formed of a silsesquioxane compound having the structure described in JP2015-212353A or JP2017-008148A can be suitably used.

[Optically Anisotropic Layer]

The laminate according to the embodiment of the present invention includes an optically anisotropic layer.

In the present invention, the laminate for imparting the antireflection function is the most preferred aspect, and thus the optically anisotropic layer is preferably a λ/4 plate.

The λ/4 plate is a plate having a function of converting linearly polarized light having a specific wavelength to circularly polarized light (or converting circularly polarized light to linearly polarized light), is a plate (phase difference film) whose in-plane retardation Re(λ) at a specific wavelength of λ nm satisfies Re(λ)=λ/4, and is preferably produced by adjusting Re of the positive A-plate to λ/4. In order to suppress the tint change in a case of being viewed from the oblique direction or the light leakage during black display, it is preferable to further combine the positive C-plate. At this time, the total Rth of the antireflection plate is preferably adjusted to be close to zero.

The antireflection plate is suitably used for antireflection application of image display devices such as a liquid crystal display device (LCD), a plasma display panel (PDP), an electroluminescent display (ELD), and a cathode ray tube display device (CRT), and can improve a contrast ratio of display light.

For example, the antireflection plate can be provided on a side of a light extraction surface of the organic EL display device. In this case, the external light is converted to linearly polarized light by the polarizer, and then is converted to circularly polarized light by passing through the phase difference plate. In a case where the light is reflected by a metal electrode or the like of the organic EL panel, the circular polarization state is inverted, and in a ease where the light passes through the phase difference plate again, the light is converted to linearly polarized light which is inclined by 90° from the light at the time of incidence, reaches the polarizer, and is absorbed. As a result, the influence of external light can be suppressed.

The laminate according to the embodiment of the present invention can be manufactured, for example, by adhering the light-absorbing anisotropic layer to the λ/4 positive A-plate and the positive C-plate, which are optically anisotropic layers, with an adhesive or the like. In a case where the optically anisotropic layer is configured with the λ/4 positive A-plate and the positive C-plate, the optically anisotropic layer may be adhered to the light-absorbing anisotropic layer on a surface on the positive C-plate side, and may be adhered to the light-absorbing anisotropic layer on a surface on an opposite side.

Alternatively, the laminate can be manufactured by directly forming the 214 positive A-plate and the positive C-plate on the light-absorbing anisotropic layer. As described in Example 19 of JP6243869B, it is also preferable that the alignment layer is provided between the light-absorbing anisotropic layer and the positive A-plate. Furthermore, as described in Example 1 of JP6123563B, a protective layer can also be provided between the light-absorbing anisotropic layer and the positive A-plate. Alternatively, a method for forming the λ/4 positive A-plate and the positive C-plate and then forming the light-absorbing anisotropic layer can also be used.

An angle between the slow axis direction of the positive A-plate of the antireflection plate and the absorption axis direction of the light-absorbing anisotropic layer is preferably in a range of 45°±10°. Regarding the optical characteristics of the positive A-plate and the positive C-plate, particularly from the viewpoint that the tint change is suppressed, wavelength dispersion of Re or Rth preferably exhibits reciprocal wavelength dispersibility.

In the manufacturing of the antireflection plate, for example, a step of continuously laminating the light-absorbing anisotropic layer in a long state with the positive A-plate and the positive C-plate in a long state is preferably included. The long antireflection plate is cut according to a size of a screen of an image display device to be used.

In a case where the optically anisotropic layer is formed of the liquid crystal compound, the optically anisotropic layer can be made into a thin layer, which is preferable from the viewpoint of flexibility.

Moreover, the optically anisotropic layer is preferably a λ/4 plate formed of a composition having the polymerizable liquid crystalline compound, and more preferably a λ.4 plate formed of a composition containing a compound represented by Formula (3). In particular, the optically anisotropic layer is preferably a λ/4 plate formed of a composition containing a compound represented by Formula (4) from the viewpoint of the moisture-heat resistance, and is preferably a λ/4 plate formed of a composition containing a compound represented by Formula (3) in which Ar represents an aromatic ring represented by Formula (Ar-2) for a reason that the light durability is improved.

In the following description, first, the components in the composition used for the formation of the optically anisotropic layer will be described in detail, and then the manufacturing method and the characteristics of the optically anisotropic layer will be described in detail.

(Compound Represented by Formula (3))

The compound represented by Formula (3) is a liquid crystalline compound having polymerizability.

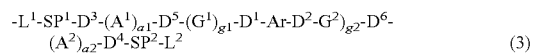

$$\text{-L}^1\text{-SP}^1\text{-D}^3\text{-(A}^1)_{a1}\text{-D}^5\text{-(G}^1)_{g1}\text{-D}^1\text{-Ar-D}^2\text{-G}^2)_{g2}\text{-D}^6\text{-} \\ (A^2)_{a2}\text{-D}^4\text{-SP}^2\text{-L}^2 \quad (3)$$

a1, a2, g1, and g2 in Formula (3) each independently represent 0 or 1, provided that at least one of a1 or g1 represents 1, and at least one of a2 or g2 represents 1.

$D^1$, $D^2$, $D^3$, and $D^4$ in Formula (3) each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

$G^1$ and $G^2$ in Formula (3) each independently represent a divalent alicyclic hydrocarbon group which has 5 to S carbon atoms and may have a substituent, and one or more —$CH_2$—'s constituting the alicyclic hydrocarbon group may be substituted with —O—, —S—, or —NH—.

$A^1$ and $A^2$ in Formula (3) each independently represent an aromatic ring which has 6 or more carbon atoms and may have a substituent, or a cycloalkane ring which has 6 or more carbon atoms and may have a substituent.

$SP^1$ and $SP^2$ in Formula (3) each independently represent a single bond, a linear or branched alkylene group having 1 to 12 carbon atoms, or a divalent linking group in which one or more —$CH_2$—'s constituting the linear or branched alkylene group having 1 to 12 carbon atoms are substituted with —O—, —S—, —N(Q)- , or —CO—, and Q represents a substituent.

$L^1$ and $L^2$ in Formula (3) each independently represent a monovalent organic group, and at least one of $L^1$ or $L^2$ represents a polymerizable group, provided that in a case where Ar is an aromatic ring represented by Formula (Ar-3), at least one of $L^1$, $L^2$, or $L^3$ or $L^4$ in Formula (Ar-3) represents a polymerizable group.

It is preferable that a1, a2, g1, and g2 in Formula (3) are all 1.

The divalent alicyclic hydrocarbon group which has 5 to 8 carbon atoms and is represented by $G^1$ and $G^2$ in Formula (3) is preferably a 5-membered ring or a 6-membered ring. Moreover, the alicyclic hydrocarbon group may be saturated or unsaturated, but a saturated alicyclic hydrocarbon group is preferable. With regard to the divalent alicyclic hydrocarbon group represented by $G^1$ and $G^2$, reference can be made to the description in, for example, paragraph [0078] of JP2012-021068A, the contents of which are incorporated herein by reference.

Furthermore, regarding $G^1$ and $G^2$ in Formula (3), examples of the substituent that the divalent alicyclic hydrocarbon group having 5 to 8 carbon atoms may have include an alkyl group, an alkoxy group, and a halogen atom.

As the alkyl group, for example, a linear, branched, or cyclic alkyl group having 1 to 18 carbon atoms is preferable; an alkyl group having 1 to 8 carbon atoms (for example, a methyl group, an ethyl group, a propyl group, an isopropyl group, an n-butyl group, an isobutyl group, a sec-butyl group, a t-butyl group, a cyclohexyl group, and the like) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, a methoxyethoxy group, and the like) is more preferable, an alkoxy group having 1 to 4 carbon atoms is still more preferable, and a methoxy group or an ethoxy group is particularly preferable.

Examples of the halogen atom include a fluorine atom, a chlorine atom, a bromine atom, and an iodine atom, and among them, a fluorine atom or a chlorine atom is preferable.

Examples of the aromatic ring which has 6 or more carbon atoms and is represented by $A^1$ and $A^2$ in Formula (3) include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among them, a benzene ring (for example, a 1,4-phenyl group and the like) is preferable.

Moreover, examples of the cycloalkane ring which has 6 or more carbon atoms and is represented by $A^1$ and $A^2$ in Formula (3) include a cyclohexane ring, a cyclopeptane ring, a cyclooctane ring, a cyclododecane ring, and a cyclodocosane ring. Among them, a cyclohexane ring (for example, a 1,4-cyclohexylene group and the like) is preferable, and a trans-1,4-cyclohexylene group is more preferable.

Furthermore, regarding $A^1$ and $A^2$, examples of the substituent that the aromatic ring having 6 or more carbon atoms or the cycloalkane ring having 6 or more carbon atoms may have include the same substituents as the substituents that $G^1$ and $G^2$ in Formula (3) may have.

As the linear or branched alkylene group which has 1 to 12 carbon atoms and is represented by $SP^1$ and $SP^2$ in Formula (3), for example, a methylene group, an ethylene group, a propylene group, a butylene group, a pentylene group, a hexylene group, a methylhexylene group, and a heptylene group are preferable. Moreover, as described above, $SP^1$ and $SP^2$ may be divalent linking groups in which one or more —$CH_2$—'s constituting the linear or branched alkylene group having 1 to 12 carbon atoms are substituted with —O—, —S—, —NH—, —N(Q)- , or —CO—, and examples of the substituent represented by Q include the same substituents as the substituents that. $G^1$ and $G^2$ in Formula (3) may have.

Examples of the monovalent organic group represented by $L^1$ and $L^2$ in Formula (3) include an alkyl group, an aryl group, and a heteroaryl group.

The alkyl group may be linear, branched, or cyclic, but is preferably linear. The number of carbon atoms in the alkyl group is preferably 1 to 30, more preferably 1 to 20, and still more preferably 1 to 10.

The aryl group may be monocyclic or polycyclic, but is preferably monocyclic. The number of carbon atoms in the aryl group is preferably 6 to 25 and more preferably 6 to 10.

The heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms in the heteroaryl group is preferably 6 to 18 and more preferably 6 to 12.

The alkyl group, aryl group, and heteroaryl group may be unsubstituted or may have a substituent. Examples of the substituent include the same substituents as the substituents that $G^1$ and $G^2$ in Formula (3) may have.

The polymerizable group represented by at least one of $L^1$ or $L^2$ in Formula (3) is not particularly limited, but is preferably a polymerizable group capable of radical polymerization or cationic polymerization.

As a radically polymerizable group, generally known radically polymerizable groups can be used, and an acryloyl group or a methacryloyl group is preferable. In this case, it is known that the acryloyl group generally has a high polymerization rate, from the viewpoint of improvement in productivity, the acryloyl group is preferable, but the methacryloyl group can also be similarly used as the polymerizable group.

As a canonically polymerizable group, generally known canonically polymerizable groups can be used, and specific examples thereof include an alicyclic ether group, a cyclic acetal group, a cyclic lactone group, a cyclic thioether group, a spiroorthoester group, and a vinyloxy group. Among them, an alicyclic ether group or a vinyloxy group is preferable, and an epoxy group, an oxetanyl group, or a vinyloxy group is more preferable.

Particularly preferred examples of the polymerizable group include the following groups. Moreover, * in the following formulae represents a bonding position to the polymerizable group.

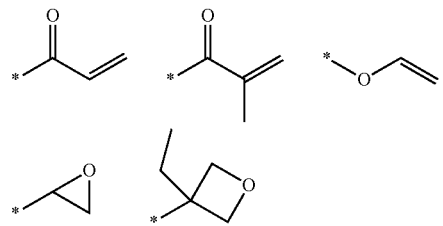

From the viewpoint of superior thermal durability of the laminate, it is preferable that both $L^1$ and $L^2$ in Formula (3) are polymerizable groups, and more preferable that $L^1$ and $L^2$ are each an acryloyl group or a methacryloyl group.

Meanwhile, Ar in Formula (3) represents any one aromatic ring selected from the group consisting of the groups represented by Formulae (Ar-1) to (Ar-5). Moreover, * in Formulae (Ar-1) to (Ar-5) represents a bonding position to $D^1$ or $D^2$ in Formula (3).

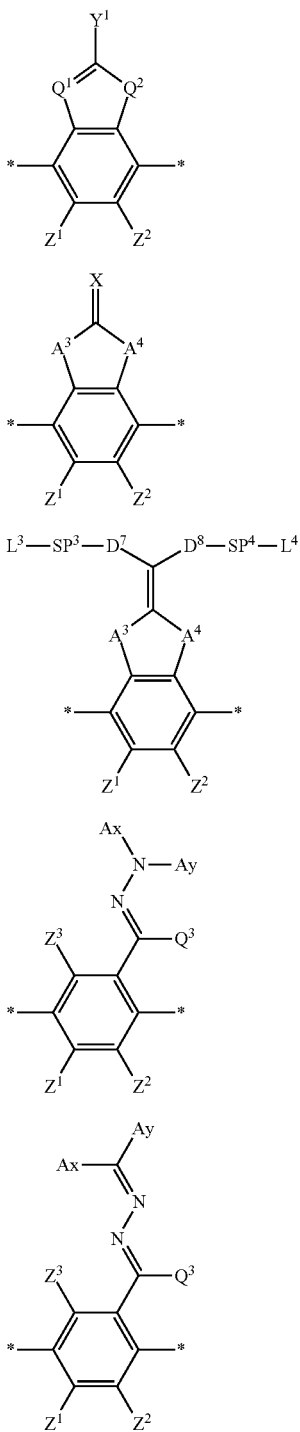

(Ar-1)
(Ar-2)
(Ar-3)
(Ar-4)
(Ar-5)

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, which may have a substituent.

Examples of the alkyl group which has 1 to 6 carbon atoms and is represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group which has 6 to 12 carbon atoms and is represented by $Y^1$ include an aryl group such as a phenyl group, a 2,6-diethylphenyl group, and a naphthyl group.

Examples of the aromatic heterocyclic group which has 3 to 12 carbon atoms and is represented by $Y^1$ include a heteroaryl group such as a thienyl group, a thiazolyl group, a furyl group, and a pyridyl group.

Moreover, examples of the substituent that $Y^1$ may have include the same substituents as the substituents that $G^1$ and $G^2$ in Formula (3) may have.

In addition, in Formulae (Ar-1) to (Ar-5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, where $R^6$ to $R^9$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and a methyl group, an ethyl group, or a tort-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group (particularly, a phenyl group) having 6 to 12 carbon atoms is preferable.

Examples of the halogen atom include a fluorine atom, a chlorine atom, a bromine atom, and an iodine atom, and a fluorine atom, a chlorine atom, or a bromine atom is preferable.

Meanwhile, examples of the alkyl groups which have 1 to 6 carbon atoms and are represented by $R^6$ to $R^9$ include a methyl group, an ethyl group, a propyl group, an isopropyl group, an n-butyl group, an isobutyl group, a sec-butyl group, a tert-butyl group, an n-pentyl group, and an n-hexyl group.

$A^3$ and $A^4$ in Formulae (Ar-2) and (Ar-3) each independently represent a group selected from the group consisting of —O—, —N($R^{10}$)—, —S—, and —CO—, and $R^{10}$ represents a hydrogen atom or a substituent.

Examples of the substituent represented by $R^{10}$ include the same substituents as the substituents that $G^1$ and $G^2$ in Formula (3) may have.

X in Formula (Ar-2) represents a non-metallic atom of Group 14 to Group 16, to which a hydrogen atom or a substituent may be bonded.

Moreover, examples of the non-metallic atom which belongs to Group 14 to Group 16 and is represented by X include an oxygen atom, a sulfur atom, a nitrogen atom having a substituent, and a carbon atom having a substituent, and examples of the substituent include an alkyl group, an alkoxy group, an alkyl-substituted alkoxy group, a cyclic alkyl group, an aryl group (for example, a phenyl group, a naphthyl group, and the like), a cyano group, an amino group, a nitro group, an alkylcarbonyl group, a sulfo group, and a hydroxyl group.

$D^7$ and $D^8$ in Formula (Ar-3) each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

$SP^3$ and $SP^4$ in Formula (Ar-3) each independently represent a single bond, a linear or branched alkylene group having 1 to 12 carbon atoms, or a divalent linking group in which one or more —$CH_2$—'s constituting the linear or branched alkylene group having 1 to 12 carbon atoms are substituted with —O—, —S—, —NH—, —N(Q)—, or —CO—, and Q represents a substituent. Examples of the substituent include the same substituents as the substituents that $G^1$ and $G^2$ in Formula (3) may have.

$L^3$ and $L^4$ in Formula (Ar-3) each independently represent a monovalent organic group, and at least one of $L^3$, $L^4$, or $L^1$ or $L^2$ in Formula (3) represents a polymerizable group.

Examples of the monovalent organic group include the same groups as those described for $L^1$ and $L^2$ in Formula (3).

Moreover, examples of the polymerizable group include the same groups as those described for $L^1$ and $L^2$ in Formula (3).

Ax in Formulae (Ar-4) and (Ar-5) represents an organic group which has 2 to 30 carbon atoms and has at least one aromatic ring selected from the group consisting of an aromatic hydrocarbon ring and an aromatic heterocyclic ring.

Ay in Formulae (Ar-4) and (Ar-5) represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring.

Here, the aromatic rings in Ax and Ay may each have a substituent, and Ax and Ay may be bonded to each other to form a ring.

Moreover, $Q^3$ represents a hydrogen atom or an alkyl group which has 1 to 6 carbon atoms and may have a substituent.

Examples of Ax and Ay include those described in paragraphs [0039] to [0095] of WO2014/010325A.

Examples of the alkyl group which has 1 to 6 carbon atoms and is represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same substituents as the substituents that $Y^1$ in Formula (Ar-1) may have.

Specific examples of a polymerizable liquid crystalline compound represented by Formula (3) include the compound (particularly, the compound described in paragraphs [0067] to [0073]) represented by General Formula (1) described in JP2010-084032A, the compound (particularly, the compound described in paragraphs [0036] to [0043]) represented by General Formula (II) described in JP2016-053709A, and the compound (particularly, the compound described in paragraphs [0043] to [0055]) represented by General Formula (1) described in JP2016-081035A.

Furthermore, as the compound represented by Formula (3), a polymerizable liquid crystalline compound in which $G^1$, $G^2$, $A^1$, and $A^2$ in Formula (3) each independently represent a cycloalkane ring having 6 or more carbon atoms is preferable, and a polymerizable liquid crystalline compound in which $G^1$, $G^2$, $A^1$, and $A^2$ in Formula (3) each independently represent a cycloalkane ring having 6 or more carbon atoms and both $D^3$ and $D^4$ in Formula (3) represent single bonds, that is, a compound represented by Formula (4) is more preferable.

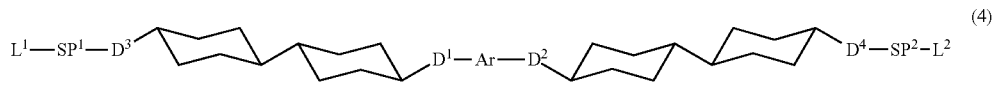

(4)

Here, $D^1$, $D^2$, $D^3$, $D^4$, $SP^1$, $SP^2$, $L^1$, $L^2$, and Ar in Formula (4) are the same as those described in Formula (3), respectively.

Suitable examples of the compound represented by Formula (4) include compounds represented by Formulae (1) and (12), and specifically, respective compounds having side chain structures shown in Tables 1 and 2 below as K (side chain structure) in Formulae (1) and (12) are mentioned.

Furthermore, in the side chain structures represented by 1-2 in Table 1 below and 2-2 in Table 2 below, groups adjacent to an acryloyloxy group and a methacryloyl group each represents a propylene group (a group in which a methyl group is substituted with an ethylene group), and represents mixtures having methyl groups at different positions.

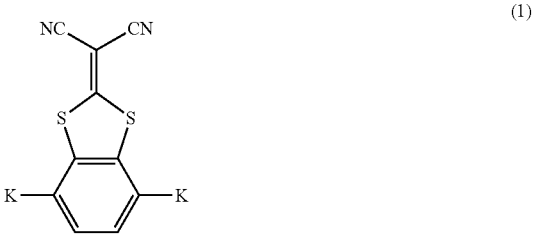

(1)

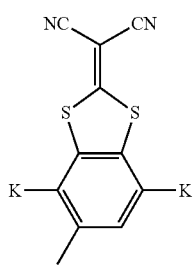
(2)
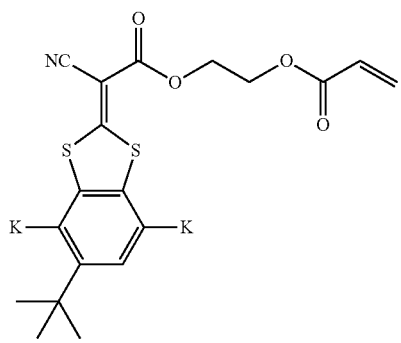
(7)
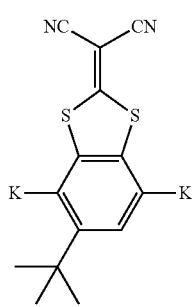
(3)
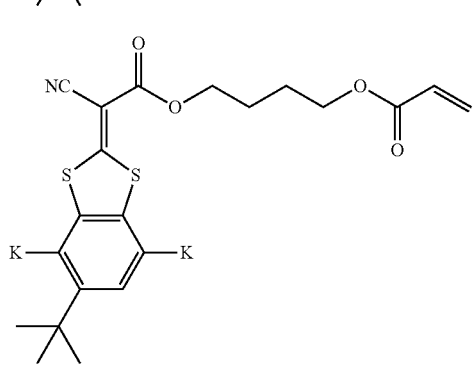
(8)
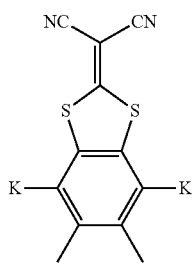
(4)
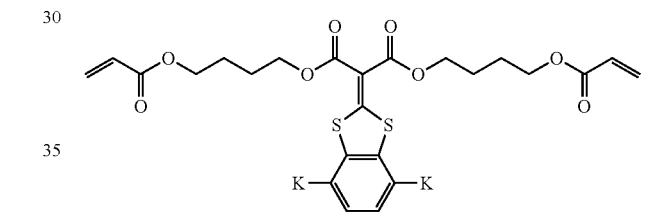
(9)
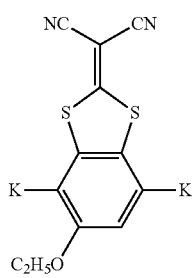
(5)
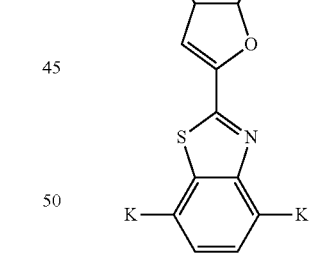
(10)
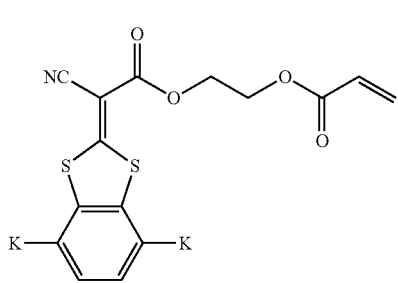
(6)
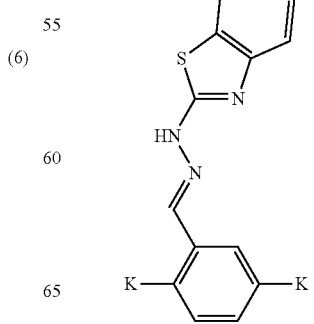
(11)

-continued
(12)
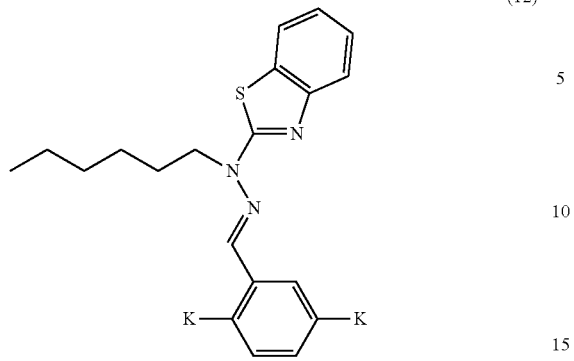
TABLE 1
| | K (side chain structure) |
|---|---|
| 1-1 | 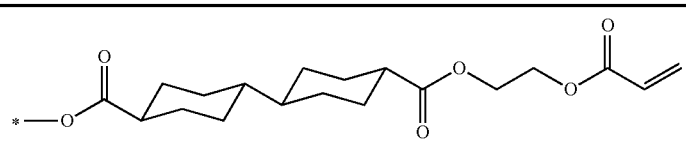 |
| 1-2 | 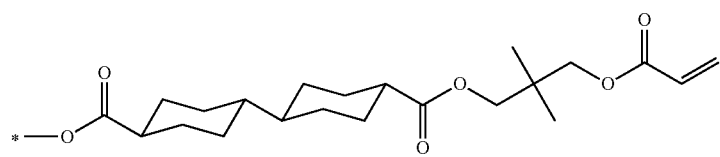 [SMILES: C=CC(=O)OCC(C)(C)COC(=O)C1CCC(C2CCC(C(=O)OC)CC2)CC1] |
| 1-3 |  |
| 1-4 | 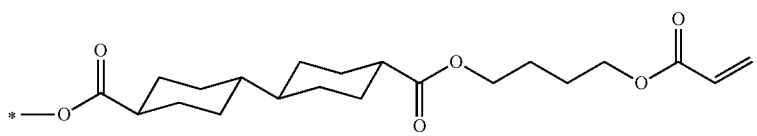 [SMILES: C=CC(=O)OCCCCOC(=O)C1CCC(C2CCC(C(=O)OC)CC2)CC1] |
| 1-5 | 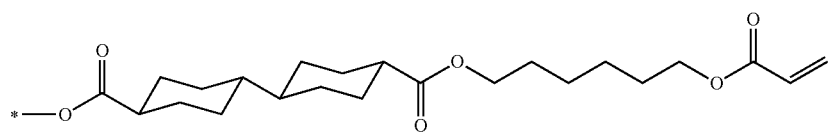 [SMILES: C=CC(=O)OCCCCCCOC(=O)C1CCC(C2CCC(C(=O)OC)CC2)CC1] |
| 1-6 | 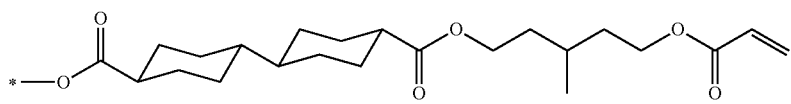 [SMILES: C=CC(=O)OCCC(C)CCOC(=O)C1CCC(C2CCC(C(=O)OC)CC2)CC1] |
| 1-7 | 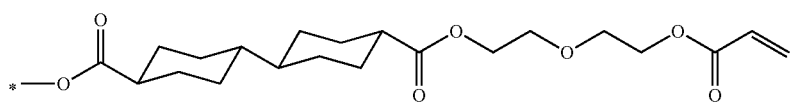 [SMILES: C=CC(=O)OCCOCCOC(=O)C1CCC(C2CCC(C(=O)OC)CC2)CC1] |
| 1-8 | 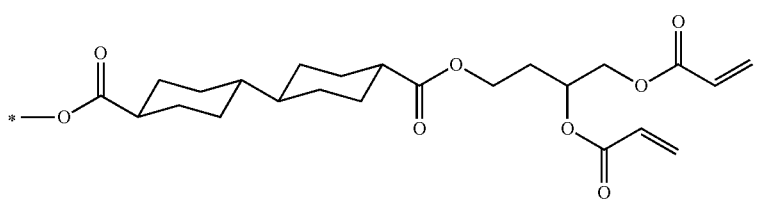 [SMILES: C=CC(=O)OCC(CCOC(=O)C1CCC(C2CCC(C(=O)OC)CC2)CC1)OC(=O)C=C] |

TABLE 1-continued

| | K (side chain structure) |
|---|---|
| 1-9 | (structure) |
| 1-10 | (structure) |
| 1-11 | (structure) |
| 1-12 | (structure) |
| 1-13 | (structure) |
| 1-14 | (structure) |

TABLE 2

| | K (side chain structure) |
|---|---|
| 2-1 | (structure) |
| 2-2 | (structure) |
| 2-3 | (structure) |
| 2-4 | (structure) |

TABLE 2-continued
| K (side chain structure) |
2-5
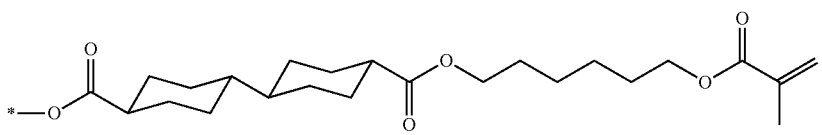 [SMILES: *OC(=O)C1CCC(C2CCC(C(=O)OCCCCCCOC(=O)C(=C)C)CC2)CC1]
2-6
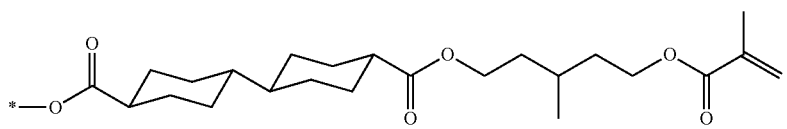 [SMILES: *OC(=O)C1CCC(C2CCC(C(=O)OCCC(C)CCOC(=O)C(=C)C)CC2)CC1]
2-7
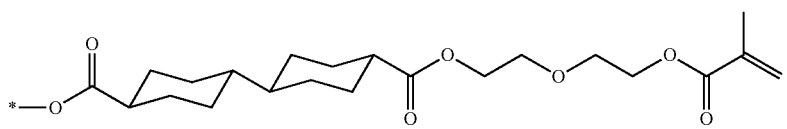 [SMILES: *OC(=O)C1CCC(C2CCC(C(=O)OCCOCCOC(=O)C(=C)C)CC2)CC1]
2-8
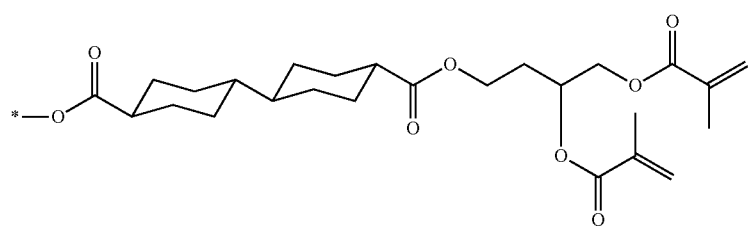 [SMILES: *OC(=O)C1CCC(C2CCC(C(=O)OCCC(COC(=O)C(=C)C)OC(=O)C(=C)C)CC2)CC1]
2-9
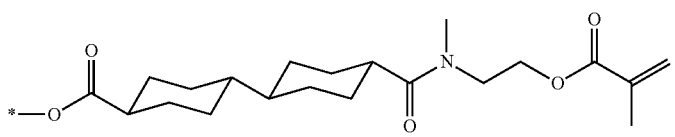 [SMILES: *OC(=O)C1CCC(C2CCC(C(=O)N(C)CCOC(=O)C(=C)C)CC2)CC1]
2-10
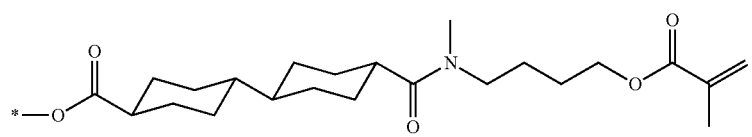 [SMILES: *OC(=O)C1CCC(C2CCC(C(=O)N(C)CCCCOC(=O)C(=C)C)CC2)CC1]
2-11
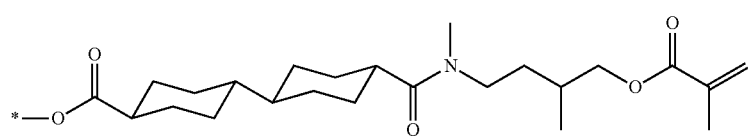 [SMILES: *OC(=O)C1CCC(C2CCC(C(=O)N(C)CCC(C)COC(=O)C(=C)C)CC2)CC1]
2-12
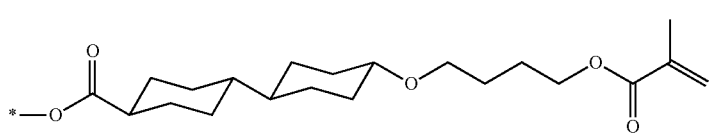 [SMILES: *OC(=O)C1CCC(C2CCC(OCCCCOC(=O)C(=C)C)CC2)CC1]
2-13
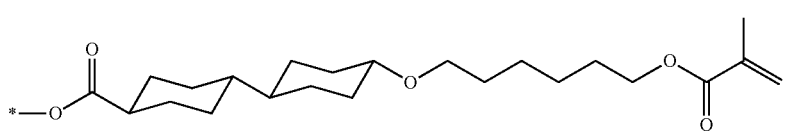 [SMILES: *OC(=O)C1CCC(C2CCC(OCCCCCCOC(=O)C(=C)C)CC2)CC1]
2-14
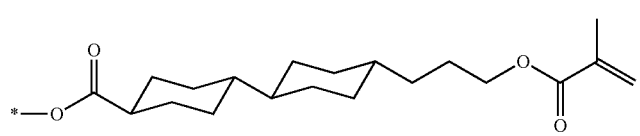 [SMILES: *OC(=O)C1CCC(C2CCC(CCCOC(=O)C(=C)C)CC2)CC1]

A content of the polymerizable liquid crystalline compound represented by Formula (3) in the composition, is not particularly limited, hut is preferably 50% to 100% by mass and more preferably 70% to 99% by mass with respect to the total solid content in the composition.

The solid content means other components excluding a solvent in the composition, and the other components are calculated as the solid content even in a case where a property of the components is a liquid.

The composition may contain other components in addition to the polymerizable liquid crystalline compound represented by Formula (3).

(Liquid Crystal Compound)

The composition may contain other liquid crystal compounds in addition to the polymerizable liquid crystalline compound represented by Formula (3). As the other liquid crystal compounds, well-known liquid crystal compounds (rod-like liquid crystal compound and disk-like liquid crystal compound) are mentioned. The other liquid crystal compounds may have a polymerizable group.

(Polymerizable monomer)

The composition may contain other polymerizable monomers in addition to the polymerizable liquid crystalline compound represented by Formula (3) and the other liquid crystal compound having a polymerizable group. Among them, from the viewpoint that hardness of the optically anisotropic layer is superior, a polymerizable compound (polyfunctional polymerizable monomer) having two or more polymerizable groups is preferable.

As the polyfunctional polymerizable monomer, a polyfunctional radically polymerizable monomer is preferable. Examples of the polyfunctional radically polymerizable monomer include the polymerizable monomer described in paragraphs [0018] to [0020] of JP2002-296423A.

Furthermore, in a case where the composition contains the polyfunctional polymerizable monomer, a content of the polyfunctional polymerizable monomer is preferably 1% to 50% by mass and more preferably 2% to 30% by mass with respect to the total mass of the polymerizable liquid crystalline compound represented by Formula (3).

(Polymerization Initiator)

The composition may contain a polymerization initiator. The polymerization initiator is preferably a photopolymerization initiator capable of initiating a polymerization reaction upon irradiation with ultraviolet rays.

Examples of the photopolymerization initiator include the α-carbonyl compound (described in each of the specifications of U.S. Pat. Nos. 2,367,661A and 2,367,670A), the acyloin ether (described in the specification of U.S. Pat. No. 2,448,828A), the α-hydrocarbon-substituted aromatic acyloin compound (described in the specification of U.S. Pat. No. 2,722,512A), the polynuclear quinone compound (described in each of the specifications of U.S. Pat. Nos. 3,046,127A and 2,951,758A), the combination of a triarylimidazole dimer and p-aminophenyl ketone (described in the specification of U.S. Pat. No. 3,549,367A), the acridine and phenazine compounds (described in JP1985-105667A (JP-S60-105667A) and the specification of U.S. Pat. No. 4,239,850A), the oxadiazole compound (described in the specification of U.S. Pat. No. 4,212,970A), and the acyl phosphine oxide compounds (described in JP1988-040799B (JP-S63-040799B), JP1993-029234B (JP-H05-02923413), JP1998-095788A (JP-H10-095788A), and JP1998-029997A (JP-H10-029997A)).

As the polymerization initiator, an oxime-type polymerization initiator is preferable.

(Solvent)

The composition may contain a solvent from the viewpoint of workability for forming the optically anisotropic layer.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane and the like), alicyclic hydrocarbons (for example, cyclohexane), aromatic hydrocarbons (for example, toluene, xylene, and trimethylbenzene), halocarbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

These solvents may be used alone or in combination of two or more kinds thereof.

(Leveling Agent)

The composition may contain a leveling agent from the viewpoint that the surface of the optically anisotropic layer is kept smooth.

As the leveling agent, for a reason of a high leveling effect on the addition amount, a fluorine-based leveling agent or a silicon-based leveling agent is preferable, and from the viewpoint that weeping (bloom or bleed) is less likely to be caused, a fluorine-based leveling agent is more preferable.

Examples of the leveling agent include the compound described in paragraphs [0079] to [0102] of JP2007-069471A, the polymerizable liquid crystal compound (particularly, the compound described in paragraphs [0020] to [0032]) which is represented by General Formula (4) described in JP2013-047204A, the polymerizable liquid crystal compound (particularly, the compound described in paragraphs [0022] to [0029]) which is represented by General Formula (4) described in JP2012-211306A, the liquid crystal alignment promoter (particularly, the compound described in paragraphs [0076] to [0078] and paragraphs [0082] to [0084]) which is represented by General Formula (4) described in JP2002-129162A, and the compounds (particularly, the compounds described in paragraphs [0092] to [0096]) which are represented by General Formulae (4), (II), and (III) described in JP2005-099248A. Furthermore, the leveling agent may also have a function as an alignment control agent described later.

(Alignment Control Agent)

The composition may contain an alignment control agent, as needed.

The alignment control agent can form various alignment states such as homeotropic alignment (vertical alignment), tilt alignment, hybrid alignment, and cholesteric alignment in addition to homogeneous alignment, and can realize a specific alignment state by more uniform and more precise control.

As an alignment control agent which promotes homogeneous alignment, for example, a low-molecular alignment control agent and a high-molecular alignment control agent can be used.

With regard to the low-molecular alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are incorporated herein by reference.

Furthermore, with regard to the high-molecular alignment control agent, reference can be made to, for example, paragraphs [00.21] to [0057] of JP2004-198511A and paragraphs [0121] to [0167] of JP2006-106662A, the contents of which are incorporated herein by reference.

In addition, examples of an alignment control agent which forms or promotes homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to of JP2008-026730A, paragraphs [0043] to [0055] of JP2016-193869A, and the like, the contents of which are incorporated herein by reference.

In a case where the alignment control agent is contained, the content thereof is preferably 0.01% to 10% by mass and more preferably 0.05% to 5% by mass with respect to the total solid content in the composition.

(Other Components)

The composition may contain components other than the above-mentioned components, and examples thereof include a surfactant, a tilt angle controlling agent, an alignment aid, a plasticizer, and a crosslinking agent.

(Method for Manufacturing Optically Anisotropic Layer)

A method for manufacturing the optically anisotropic layer is not particularly limited, and well-known methods are mentioned.

For example, a cured coating film (optically anisotropic layer) can be manufactured by applying the composition to a predetermined substrate (for example, a support layer described later) to form a coating film, and subjecting the obtained coating film to a curing treatment (irradiation with active energy rays (light irradiation treatment) and/or heating treatment). Moreover, an alignment layer described later may be used, as needed.

Application of the composition can be carried out by well-known methods (for example, a wire bar coating method, an extrusion coating method, a direct gravure coating method, a reverse gravure coating method, and a die-coating method).

In the method for manufacturing the optically anisotropic layer, it is preferable that an alignment treatment for a liquid crystal compound contained in the coating film is performed before the curing treatment for the coating film.

The alignment treatment can be performed by drying at room temperature (for example, 20° C. to 25° C.) or heating. In a case of a thermotropic liquid crystal compound, a liquid crystal phase formed by the alignment treatment can be generally transitioned by a change in a temperature or pressure. In a case of a liquid crystal compound having a lyotropic property, the transition can be performed also by a compositional ratio such as an amount of a solvent.

In a case where the alignment treatment is a heating treatment, a heating time (heat-aging time) is preferably 10 seconds to 5 minutes, more preferably 10 seconds to 3 minutes, and still more preferably 10 seconds to 2 minutes.

The above-mentioned curing treatment (irradiation with active energy rays (light irradiation treatment) and/or heating treatment) for the coating film can also be referred to as a fixing treatment for fixing the alignment of the liquid crystal compound.

The fixing treatment is preferably performed by irradiation with active energy rays (preferably, ultraviolet rays), and the liquid crystal is fixed by polymerization of the liquid crystal compound.

(Characteristics of Optically Anisotropic Layer)

The optically anisotropic layer is a film formed of the above-mentioned composition.

Optical characteristics of the optically anisotropic layer are not particularly limited, but it is preferable that the optically anisotropic layer functions as a λ/4 plate.

The λ/4 plate is a plate having a function of converting linearly polarized light having a specific wavelength to circularly polarized light (or converting circularly polarized light to linearly polarized light), and refers to a plate (optically anisotropic layer) whose in-plane retardation. Re(λ) at a specific wavelength of λ nm satisfies Re(λ)=λ/4.

This expression may be achieved at any wavelength (for example, 550 nm) in the visible light range, but the in-plane retardation Re(550) at a wavelength of 550 nm preferably satisfies a relationship of 110 nm≤Re(550)≤160 nm and more preferably satisfies 110 nm≤Re(550)≤150 nm.

It is preferable that Re(450) which is an in-plane retardation of the optically anisotropic layer measured at a wavelength of 450 nm, Re(550) which is an in-plane retardation of the optically anisotropic layer measured at a wavelength of 550 nm, and Re(650) which is an in-plane retardation of the optically anisotropic layer measured at a wavelength of 650 nm have a relationship of Re(450)≤Re(550)≤Re(650). That is, this relationship can be said to be a relationship indicating reciprocal wavelength dispersibility.

The optically anisotropic layer may be an A-plate or a C-plate, and is preferably a positive A-plate.

The positive A-plate can be obtained, for example, by horizontally aligning the polymerizable liquid crystalline compound represented by Formula (3).

A thickness of the optically anisotropic layer is not particularly limited, but is preferably 0.5 to 10 μm and more preferably 1.0 to 5 μm from the viewpoint of reduction in the thickness.

[Alignment Layer]

The laminate according to the embodiment of the present invention may include an alignment layer between the above-mentioned optically anisotropic layer and the above-mentioned light-absorbing anisotropic layer.

Examples of a method for forming the alignment layer include methods such as a rubbing treatment of an organic compound (preferably, a polymer) on a film surface, oblique vapor deposition of an inorganic compound, formation of a layer having microgrooves, and accumulation of an organic compound (for example, ω-tricosanoic acid, dioctadecyl methylammonium chloride, methyl stearate, and the like) by a Langmuir-Blodgett method (LB film). Moreover, an alignment layer in which an alignment function is generated by application of an electric field, application of a magnetic field, or light irradiation is also known.

Among them, in the present invention, from the viewpoint of easy control of a pretilt angle of the alignment layer, an alignment layer formed by a rubbing treatment is preferable, but from the viewpoint of uniformity of alignment, which is important in the present invention, a photo-alignment layer formed by light irradiation is more preferable.

<Rubbing-Treated Alignment Layer>

Polymer materials used for the alignment layer formed by the rubbing treatment are described in many documents, and a large number of commercially available products can be acquired. In the present invention, polyvinyl alcohol or polyimide, and a derivative thereof are preferably used. Regarding the alignment layer, reference can be made to the descriptions on page 43, line 24 to page 49, line 8 of WO01/088574A1. A thickness of the alignment layer is preferably 0.01 to 10 μm and more preferably 0.01 to 2 μm.

<Photo-Alignment Layer>

In the laminate according to the embodiment of the present invention, from the viewpoint of improvement in the degree of alignment of the dichroic azo coloring agent compound, a photo-alignment layer containing a photoactive compound is preferably utilized.

The photo-alignment layer can also be removed in the step of adhering the optically anisotropic layer to the light-absorbing anisotropic layer, but it is also preferable that the photo-alignment layer is disposed to be left between the optically anisotropic layer and the light-absorbing anisotropic layer. In this case, from the viewpoint of the film hardness of the laminate, the photo-alignment layer is preferably formed of a compound having a crosslinkable group. As the crosslinkable group, a radically polymerizable group and a cationically polymerizable group are preferable, and a radically polymerizable group is more preferable. Examples of the radically polymerizable group include an ethylenically unsaturated bond group. Examples of the cationically polymerizable group include an epoxy group and an oxetane group.

The photo-alignment layer refers to an alignment layer to which alignment regulating force is imparted by applying a composition (hereinafter, sometimes referred to as a "composition for forming a photo-alignment layer") containing a compound having a photoreactive group and a solvent to a substrate and performing irradiation with polarized light (preferably, polarized UV). The photoreactive group refers to a group generating a liquid crystal alignment capability by irradiation with light. Specifically, the photoreactive group causes alignment induction of molecules (called a photoactive compound) generated by irradiation with light, or a photoreaction which is an origin of a liquid crystal alignment capability, such as an isomerization reaction, a dimerization reaction, a photocrosslinking reaction, or a photodegradation reaction. The photoreactive group preferably has an unsaturated bond, particularly a double bond, and a group having at least one bond selected from the group consisting of a carbon-carbon double bond (C═C bond), a carbon-nitrogen double bond (C═N bond), a nitrogen-nitrogen double bond (N═N bond), and a carbon-oxygen double bond (C═O bond) is more preferable.

Examples of the photoreactive group having a C═C bond include a vinyl group, a polyene group, a stilbene group, a stilbazole group, a stilbazolium group, a chalcone group, and a cinnamoyl group. Examples of the photoreactive group having a C═N bond include a group having a structure of an aromatic Schiff's base, an aromatic hydrazone, or the like. Examples of the photoreactive group having a C═O bond include a benzophenone group, a coumarin group, an anthraquinone group, and a maleimide group.

Examples of the photoreactive group having an N═N bond include an azobenzene group, an azonaphthalene group, an aromatic heterocyclic azo group, a bisazo group, a formazan group, and a group having azoxybenzene as a basic structure. These groups may have a substituent such as an alkyl group, an alkoxy group, an aryl group, an allyloxy group, a cyano group, an alkoxycarbonyl group, a hydroxyl group, a sulfonic acid group, and a halogenated alkyl group. Among them, a cinnamoyl group or an azobenzene group is preferable since a polarization irradiation amount required for photo-alignment is relatively small and a photo-alignment layer having excellent heat stability or temporal stability is easily obtained. Specific compounds are described in paragraphs [0211] to [0263] of JP5300776B, and are preferably used.

The photo-alignment layer formed of the materials is irradiated with a linearly polarized light or non-polarized light to manufacture a photo-alignment layer.

In the present specification, the "irradiation with linearly polarized light" and the "irradiation with non-polarized light" are operations for causing a photoreaction to occur in a photo-alignment material. A wavelength of the light to be used depends on the photo-alignment material to be used, and is not particularly limited as long as the wavelength is a wavelength necessary for the photoreaction. A peak wavelength of light used for light irradiation is preferably 200 nm to 700 nm, and ultraviolet light having a peak wavelength of light of 400 nm or less is more preferable.

As a light source used for light irradiation, a generally used light source can be used, for example, a lamp such as a tungsten lamp, a halogen lamp, a xenon lamp, a xenon flash lamp, a mercury lamp, a mercury xenon lamp, and a carbon arc lamp, various lasers [for example, a semiconductor laser, a helium neon laser, an argon ion laser, a helium cadmium laser, and an yttrium-aluminum-garnet (YAG) laser], a light emitting diode, and a cathode ray tube can be exemplified.

As a means for obtaining linearly polarized light, a method using a polarizing plate (for example, an iodine polarizing plate, a two-color coloring agent polarizing plate, and a wire grid polarizing plate), a method using a prism-based element (for example, a Glan-Thompson prism) or a reflective-type polarizer utilizing Brewster's angle, or a method using light emitted from a laser light source having polarized light can be employed. Moreover, only light having a required wavelength may be selectively radiated using a filter, a wavelength conversion element, or the like.

In a case where the light to be radiated is linearly polarized light, a method for irradiating an alignment layer with light from an upper surface or a back surface and irradiating a surface of the alignment layer with light perpendicularly or obliquely is employed. An incidence angle of the light varies depending on the photo-alignment material, but is preferably 0° to 90° (perpendicular) and more preferably 40° to 90°.

In a ease of non-polarized light, the alignment layer is irradiated with non-polarized light obliquely. An incidence angle thereof is preferably 10° to 80°, more preferably 20° to 60°, and still more preferably 30° to 50°.

An irradiation time is preferably 1 minute to 60 minutes and more preferably 1 minute to 10 minutes.

In a case where patterning is necessary, a method for performing light irradiation using a photo mask as many times as necessary for pattern production or a method for writing a pattern by laser light scanning can be employed.

[Pressure Sensitive Adhesive Layer]

The laminate according to the embodiment of the present invention may include a pressure sensitive adhesive layer.

Examples of a pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinylalkyl ether-based pressure sensitive adhesive, a polyvinyl alcohol-based pressure sensitive adhesive, a polyvinylpyrrolidone-based pressure sensitive adhesive, a polyacryl amide-based pressure sensitive adhesive, and a cellulose-based pressure sensitive adhesive.

Among them, from the viewpoint of transparency, weather fastness, and heat resistance, an acrylic pressure sensitive adhesive (pressure-sensitive adhesive) is preferable.

The pressure sensitive adhesive layer can be formed, for example, by a method in which a solution of the pressure sensitive adhesive is applied onto a release sheet and dried, and then the resultant is transferred to a surface of a transparent resin layer; a method in which a solution of the pressure sensitive adhesive is directly applied onto a surface of a transparent resin layer and dried; or the like.

For example, the solution of the pressure sensitive adhesive is prepared as a solution of about 10% to 40% by mass in which the pressure sensitive adhesive is dissolved or dispersed in a solvent such as toluene or ethyl acetate.

As a coating method, a roll coating method such as reverse coating and gravure coating, a spin coating method, a screen coating method, a fountain coating method, a dipping method, a spray method, and the like can be employed.

In addition, examples of a constituent material of the release sheet include appropriate thin leaf-like materials, for example, a synthetic resin film such as polyethylene, polypropylene, and polyethylene terephthalate; a rubber sheet; paper; a fabric; a non-woven fabric; a net; a foam sheet; and a metal foil.

In the present invention, a thickness of any pressure sensitive adhesive layer is not particularly limited, but is preferably 3 µm to 50 µm, more preferably 4 µm to 40 µm, and still more preferably 5 µm to 30 µm.

[Adhesive Layer]

The laminate according to the embodiment of the present invention may include an adhesive layer.

The adhesive is not particularly limited as long as the adhesive exhibits adhesiveness by being dried or reacted after adhesion.

A polyvinyl alcohol-based adhesive (PVA-based adhesive) exhibits adhesiveness by being dried, and thus enables the adhesion between materials.

Specific examples of a curing type adhesive which exhibits adhesiveness by being reacted include an active energy ray-curing type adhesive such as a (meth)acrylate-based adhesive, and a cationic polymerization curing type adhesive. Examples of a curable component in the (meth)acrylate-based adhesive include a compound having a meth) acryloyl group and a compound having a vinyl group.

Furthermore, a compound having an epoxy group or an oxetanyl group can also be used as a cationic polymerization curing-type adhesive. The compound having an epoxy group is not particularly limited as long as the compound has at least two epoxy groups in a molecule, and various curable epoxy compounds generally known can be used. Preferred examples of the epoxy compound include a compound (aromatic epoxy compound) having at least two epoxy groups and at least one aromatic ring in the molecule and a compound (alicyclic epoxy compound) having at least two epoxy groups in the molecule, at least one of which is formed between two adjacent carbon atoms constituting an alicyclic ring.

[Image Display Device]

An image display device according to the embodiment of the present invention includes the above-mentioned laminate according to the embodiment of the present invention.

A display element used in the image display device according to the embodiment of the present invention is not particularly limited, and examples thereof include a liquid crystal cell, an organic electroluminescent (hereinafter, abbreviated as "EL") display panel, and a plasma display panel.

Among them, a liquid crystal cell or an organic EL display panel is preferable and a liquid crystal cell is more preferable. That is, as the image display device according to the embodiment of the present invention, a liquid crystal display device using a liquid crystal cell as a display element or an organic EL display device using an organic EL display panel as a display element is preferable, and an organic EL display device is more preferable.

[Organic EL Display Device]

As an organic EL display device which is an example of the image display device according to the embodiment of the present invention, an aspect in which the above-mentioned laminate according to the embodiment of the present invention and an organic EL display panel are provided in this order from the visually recognized side is suitably exemplified. In this case, in the laminate, a surface protective layer, an adhesive layer or a pressure sensitive adhesive layer which is disposed as needed, an oxygen shielding layer, a refractive index-adjusting layer, a light-absorbing anisotropic layer, an adhesive layer or a pressure sensitive adhesive layer which is disposed as needed, and an optically anisotropic layer are disposed in this order from the visually recognized side.

In addition, the organic EL display panel is a display panel configured using an organic EL element in which an organic light emitting layer (organic electroluminescence layer) is sandwiched between electrodes (between a cathode and an anode). The configuration of the organic EL display panel is not particularly limited, and a well-known configuration is employed.

EXAMPLES

Hereinafter, the present invention will be described in more detail with reference to Examples. The materials, the amounts of materials used, the ratios, the treatment details, the treatment procedure, or the like shown in the following Examples can be appropriately modified without departing from the spirit of the present invention. Therefore, the scope of the present invention will not be restrictively interpreted by the following Examples.

Example 1

<Production of Cellulose Acylate Film 1>

(Production of Core Layer Cellulose Acylate Dope)

The following composition was introduced into a mixing tank and stirred to dissolve the respective components, thereby preparing a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester compound B described in Examples of JP2015-227955A | 12 parts by mass |
| The following compound F | 2 parts by mass |
| Methylene chloride (first solvent) | 430 parts by mass |
| Methanol (second solvent) | 64 parts by mass |

Compound F

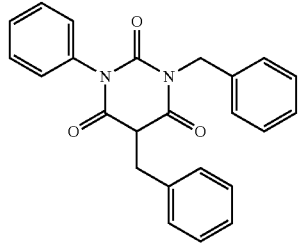 [SMILES: O=C1C(Cc2ccccc2)C(=O)N(c2ccccc2)C(=O)N1Cc1ccccc1]

(Production of Outer Layer Cellulose Acylate Dope)

To 90 parts by mass of the core layer cellulose acylate dope was added 10 parts by mass of the following matting agent solution to prepare a cellulose acetate solution used as an outer layer cellulose acylate dope.

| Matting agent solution | |
|---|---|
| Silica particles having average particle size of 20 nm (AEROSIL R972, produced by NIPPON AEROSIL CO., LTD.) | 2 parts by mass |
| Methylene chloride (first solvent) | 76 parts by mass |
| Methanol (second solvent) | 11 parts by mass |
| The above core layer cellulose acylate dope | 1 part by mass |

(Production of Cellulose Acylate Film 1)

The core layer cellulose acylate dope and the outer layer cellulose acylate dope were filtered through filter paper having an average pore diameter of 34 μm and a sintered metal filter having an average pore diameter of 10 μm, and then three layers of the core layer cellulose acylate dope and the outer layer cellulose acylate dopes on both sides thereof were cast onto a drum at 20° C. from casting ports at the same time (band casting machine).

Subsequently, the film was peeled in the state where the solvent content reached approximately 20% by mass, the both ends of the film in the width direction were fixed with tenter clips, and the film was dried while being stretched at a stretching ratio of 1.1 times in the cross direction.

Thereafter, the film was transported between rolls in a heat treatment device and further dried to produce an optical film having a thickness of 40 μm, which was used as a cellulose acylate film 1. The in-plane retardation of the obtained cellulose acylate film 1 was 0 nm.

<Formation of Photo-Alignment Layer PA1>

A coating liquid PA1 for forming an alignment layer having the following composition was continuously applied onto the cellulose acylate film 1 with a wire bar. The support on which the coating film was formed was dried with hot air at 140° C. for 120 seconds, and subsequently, the coating film was irradiated with polarized ultraviolet rays (10 mJ/cm$^2$, using an ultra-high-pressure mercury lamp) to form a photo-alignment layer PA1, whereby a TAC film with a photo-alignment layer was obtained.

The film thickness of the photo-alignment layer PA1 was 0.4 μm.

| Coating liquid PA1 for forming alignment layer | |
|---|---|
| The following polymer PA-1 | 100.00 parts by mass |
| The following acid generator PAG-1 | 1.00 part by mass |
| CYCLOMER M100 (produced by DAICEL CORPORATION) | 3.00 parts by mass |
| Isopropyl alcohol | 16.50 parts by mass |
| Butyl acetate | 1,072.00 parts by mass |
| Methyl ethyl ketone | 268.00 parts by mass |

Polymer PA-1

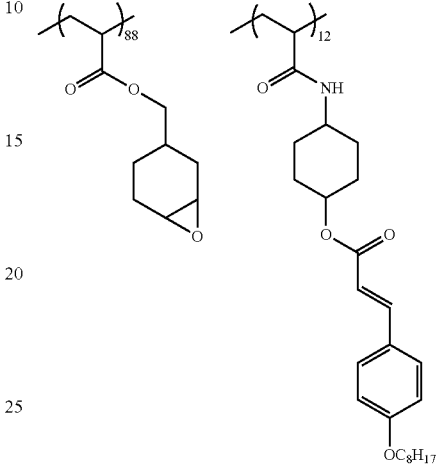

Acid generator PAG-1

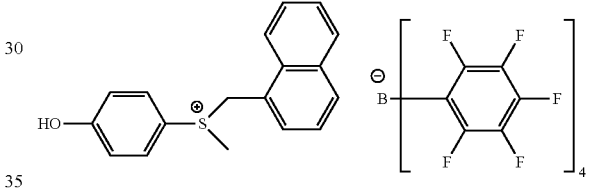

<Formation of Light-Absorbing Anisotropic Layer P1>

A composition P1 for forming a light-absorbing anisotropic layer having the following composition was continuously applied onto the obtained photo-alignment layer PA1 with a wire bar to form a coating layer P1.

Next, the coating layer P1 was heated at 140° C. for 90 seconds and the coating layer P1 was cooled to room temperature (23° C.).

Subsequently, the layer was heated at 80° C. for 60 seconds and cooled again to room temperature.

Thereafter, the layer was irradiated with light for 60 seconds under an irradiation condition of an illuminance of 28 mW/cm$^2$, using a high-pressure mercury lamp, to produce a light-absorbing anisotropic layer P1 on the photo-alignment layer PA1.

The film thickness of the light-absorbing anisotropic layer P1 was 0.3 μm.

| Composition P1 for forming light-absorbing anisotropic layer | |
|---|---|
| The following azo coloring agent Y-1 | 0.25 parts by mass |
| The following azo coloring agent M-1 | 0.27 parts by mass |
| The following azo coloring agent C-1 | 0.65 parts by mass |
| The following high-molecular liquid crystalline compound P-1 | 3.71 parts by mass |
| Polymerization initiator IRGACURE OXE-02 (produced by BASF SE) | 0.151 parts by mass |
| The following interface modifier F-1 | 0.026 parts by mass |
| Cyclopentanone | 47.50 parts by mass |
| Tetrahydrofuran | 47.50 parts by mass |

| Composition P1 for forming light-absorbing anisotropic layer |
| --- |

Azo coloring agent Y-1

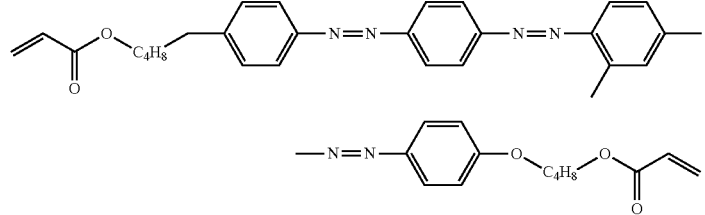

Azo coloring agent M-1

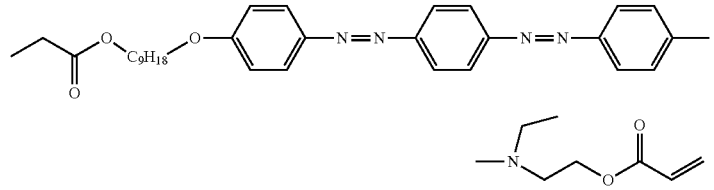

Azo coloring agent C-1

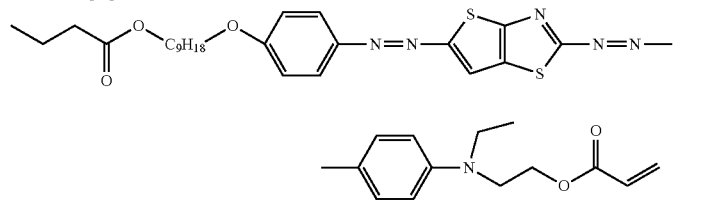

High-molecular liquid crystalline compound P-1

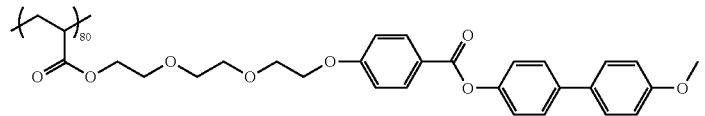

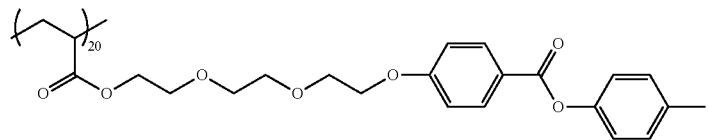

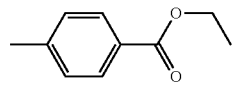

Interface modifier F-1

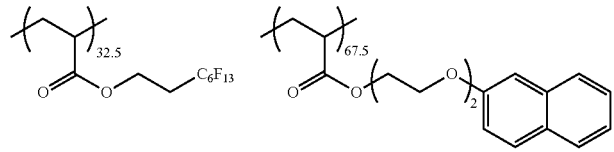

<Formation of Refractive Index-Adjusting Layer N1>

A composition N1 for forming a refractive index-adjusting layer having the following composition was continuously applied onto the obtained light-absorbing anisotropic layer P1 with a wire bar to form a refractive index-adjusting layer N1.

Subsequently, the refractive index-adjusting layer N1 was dried at room temperature and then irradiated with light for 10 seconds under an irradiation condition of an illuminance of 28 mW/cm$^2$, using a high-pressure mercury lamp, to produce the refractive index-adjusting layer N1 on the light-absorbing anisotropic layer P1.

The film thickness of the refractive index-adjusting layer N1 was 80 nm.

| Composition N1 for forming refractive index-adjusting layer | |
|---|---|
| The following mixture L1 of rod-like liquid-crystalline compounds | 2.43 parts by mass |
| The following modified trimethylol propane triacrylate | 0.98 parts by mass |
| The following photopolymerization initiator I-1 | 0.20 parts by mass |
| The above interface modifier F-1 | 0.14 parts by mass |
| 1,4-Phenylenediboronic acid (Tokyo Chemical Industry Co., Ltd.) | 0.10 parts by mass |
| Methyl ethyl ketone | 371 parts by mass |

Mixture L1 of rod-like liquid-crystalline compounds (the numerical values in the following formulae represent % by mass, and R represents a group bonded with an oxygen atom.)

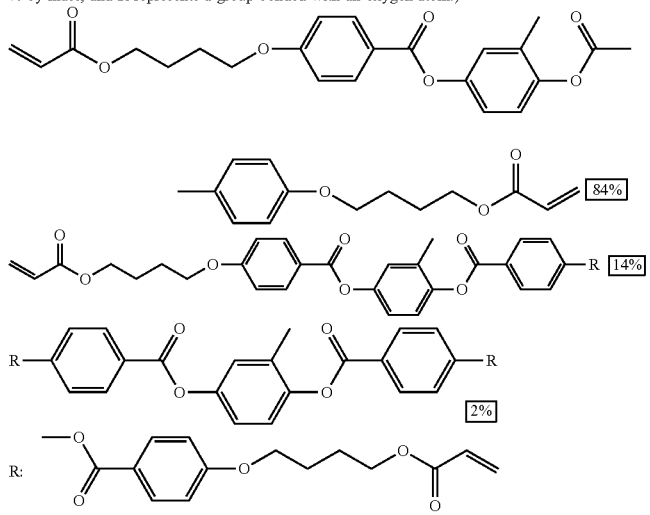

Modified trimethylol propane triacrylate

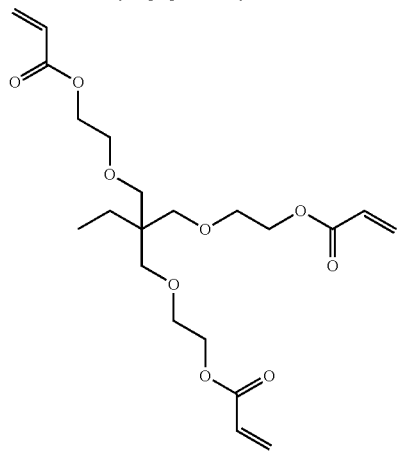

The following photopolymerization initiator

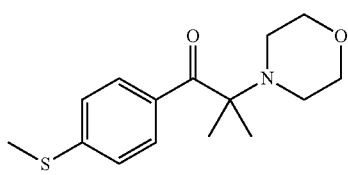 [SMILES: CSc1ccc(C(=O)C(C)(C)N2CCOCC2)cc1]

<Formation of Oxygen Shielding Layer B1>

A coating liquid having the following composition was continuously applied onto the refractive index-adjusting layer N1 with a wire bar. Thereafter, the layer was dried with hot air at 100° C. for 2 minutes to form an oxygen shielding layer B1 consisting of polyvinyl alcohol (PVA) and having a thickness of 2.0 μm on the refractive index-adjusting layer N1, whereby a laminated film 1B was produced.

Moreover, modified polyvinyl alcohol was added to a composition for forming an oxygen shielding layer so that the concentration of the solid content was 4 wt %.

Furthermore, an oxygen permeability of the oxygen shielding layer B1 was 1 cc/m$^2$/day/atm.

| Composition B1 for forming oxygen shielding layer | |
|---|---|
| The following modified polyvinyl alcohol | |
| Water | 70 parts by mass |
| Methanol | 30 parts by mass |

Modified polyvinyl alcohol $-(CH_2-CH)_{96.8}-(CH_2-CH)_{1.5}-(CH_2-CH)_{1.7}$
        |                    |                    |                         $CH_3$
        OH              OCOCH$_3$       OCONHCH$_2$CH$_2$OCOC=CH$_2$ <Production of Surface Protective Layer H1>

As described below, a coating liquid for forming each layer was prepared, and each layer was formed to produce a surface protective layer H1.

(Preparation of Composition for Forming Hard Coat Layer)

Trimethylol propane triacrylate (VISCOAT 4295 (produced by OSAKA ORGANIC CHEMICAL INDUSTRY LTD.)) (750.0 parts by mass), poly(glycidyl methacrylate) having a mass average molecular weight of 15,000 (270.0 parts by mass), methyl ethyl ketone. (730.0 parts by mass), cyclohexanone (500.0 parts by mass), and a photopolymerization initiator (IRGACURE 184, produced by Ciba Specialty Chemicals Inc.) (50.0 parts by mass) were mixed. The obtained mixture was filtered with a polypropylene-made filter having a pore diameter of 0.4 μm to prepare a composition for funning a hard coat layer.

(Preparation of Composition a for Forming Layer of Medium Refractive Index)

A $ZrO_2$ fine particle-containing hard coating agent (DESOLATE 27404 [refractive index of 1.72, concentration of solid content: 60% by mass, content of zirconium oxide fine particles: 70% by mass (with respect to the solid content), average particle diameter of zirconium oxide fine particles: about 20 Cirri, and solvent composition: methyl isobutyl ketone/methyl ethyl ketone=9/1, produced by JSR Corporation]) (5.1 parts by mass), a mixture (DPHA) of dipentaerythritol pentaacrylate and dipentaerythritol hexaacrylate (1.5 parts by mass), a photopolymerization initiator (IRGACURE 907, produced by Ciba Specialty Chemicals Inc.) (0.05 parts by mass), methyl ethyl ketone (66.6 parts by mass), methyl isobutyl ketone (7.7 parts by mass), and cyclohexanone (19.1 parts by mass) were mixed. The obtained mixture was sufficiently stirred and then filtered with a polypropylene-made filter having a pore diameter of 0.4 μm to prepare a composition A for forming a layer of medium refractive index.

(Preparation of Composition B for Forming Layer of Medium Refractive Index)

A mixture (DPHA) of dipentaerythritol pentaacrylate and dipentaerythritol hexaacrylate (4.5 parts by mass), a photopolymerization initiator (IRGACURE 184, produced by Ciba Specialty Chemicals Inc.) (0.14 parts by mass), methyl ethyl ketone (66.5 parts by mass), methyl isobutyl ketone (9.5 parts by mass), and cyclohexanone (19.0 parts by mass) were mixed. The obtained mixture was sufficiently stirred and then filtered with a polypropylene-made filter having a pore diameter of 0.4 μm to prepare a composition B for forming a layer of medium refractive index.

The composition A for forming a layer of medium refractive index and the composition B for forming a layer of medium refractive index were mixed in an appropriate amount so that the refractive index was 1.62, thereby producing a composition for forming a layer of medium refractive index.

(Preparation of Composition for Forming Layer of High Refractive Index)

A $ZrO_2$ fine particle-containing hard coating agent (DE-SOLITE 27404 [refractive index of 1.72, concentration of solid content: 60% by mass, content of zirconium oxide fine particles: 70% by mass (with respect to the solid content), average particle diameter of zirconium oxide fine particles: about 20 nm, and solvent composition: methyl isobutyl ketone/methyl ethyl ketone=9/1, produced by JSR Corporation]) (15.7 parts by mass), methyl ethyl ketone (61.9 parts by mass), methyl isobutyl ketone (3.4 parts by mass), and cyclohexanone (1.1 parts by mass) were mixed. The obtained mixture was filtered with a polypropylene-made filter having a pore diameter of 0.4 μm to prepare a composition for forming a layer of high refractive index.

(Preparation of Composition for Forming Layer of Low Refractive Index)

(Synthesis of Following Perfluoroolefin Copolymer (1))

Perfluoroolefin copolymer (1)

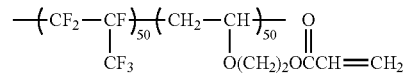

In the structural formula, 50:50 represents a molar ratio.

A stainless steel-made autoclave with a stirrer having an internal volume of 100 ml was charged with ethyl acetate (40 ml), hydroxy ethylvinyl ether (14.7 g), and dilauroyl peroxide (0.55 g), and the inside of the system was degassed and replaced with a nitrogen gas. Hexafluoropropylene (25 g) was further introduced into the autoclave, and the temperature was raised to 65° C. The pressure when the internal temperature of the autoclave reached 65° C. was 0.53 MPa (5.4 kg/cm$^2$). The reaction was continued for 8 hours while maintaining this temperature, and when the pressure reached 0.31 MPa (3.2 kg/cm$^2$), the heating was stopped and the mixture was allowed to cool. When the internal temperature was lowered to room temperature, the unreacted monomer was ejected, the autoclave was opened, and the reaction solution was taken out. The obtained reaction solution was introduced into a large excess of hexane, the solvent was removed by decantation, and the precipitated polymer was taken out. Furthermore, the obtained polymer was dissolved in a small amount of ethyl acetate and reprecipitated twice from hexane to completely remove residual monomers, and drying was performed to obtain a polymer (28 g).

Next, this polymer (20 g) was dissolved in N,N-dimethylacetamide (100 ml) to obtain a solution, and then acrylic acid chloride (11.4 g) was added dropwise to the solution under ice cooling, and the mixture was stirred at room temperature for 10 hours. Ethyl acetate was added to the reaction solution, the resultant was washed with water, an organic phase was extracted and then concentrated, and the obtained polymer was reprecipitated with hexane to obtain a perfluoroolefin copolymer (1) (19 g). The refractive index of the obtained polymer was 1.422.

(Preparation of Sol Liquid a)

Methyl ethyl ketone (120 parts by mass), acryloyloxypropyl trimethoxysilane (KBM-5103, produced by Shin-Etsu Chemical Co., Ltd.) (100 parts by mass), and diisopropoxy aluminum ethyl acetoacetate (trade name: CHELOPE EP-12, produced by Hope Chemical Co., LTD.) (3 parts by mass) were added to a reactor comprising a stirrer and a reflux condenser, and mixed. Thereafter, ion exchange water (31 parts by mass) was further added, and the obtained solution was reacted at 61° C. for 4 hours and then cooled to room temperature to obtain a sol liquid a.

The mass average molecular weight of compounds in the obtained sol liquid a was 1,620, and the proportion of components having a molecular weight of 1,000 to 20,000 in components higher than an oligomer component was 100%. Moreover, in gas chromatography analysis, acryloyloxypropyl trimethoxysilane as a raw material did not remain at all.

(Preparation of Hollow Silica Particle Dispersion Liquid)

Hollow silica particle sol (isopropyl alcohol silica sol, CS60-IPA produced by JGC Catalysts and Chemicals Ltd., average particle diameter of 60 nm, shell thickness of 10 nm, silica concentration of 20%, and refractive index of silica particles of 1.31) (500 parts by mass), acryloyloxypropyl trimethoxysilane (30.5 parts by mass), and diisopropoxy aluminum ethyl acetate (1.51 parts by mass) were mixed, and then ion exchange water (9 parts by mass) was further added.

Next, the obtained solution was reacted at 60° C. for 8 hours and then cooled to room temperature, and acetylacetone (1.8 parts by mass) was added to obtain a dispersion liquid. Thereafter, solvent substitution by distillation under reduced pressure was performed at a pressure of 30 Torr while adding cyclohexanone so that the content of silica was almost constant, and finally, the concentration was adjusted to obtain a hollow silica particle dispersion liquid having a concentration of the solid content of 18.2% by mass. The residual amount of isopropyl alcohol (IPA) in the obtained dispersion liquid was analyzed by gas chromatography, and as a result, was 0.5% or less.

A composition having the following composition was mixed using the obtained hollow silica particle dispersion liquid and the sol liquid a, and the obtained solution was stirred and then filtered with a polypropylene-made filter having a pore diameter of 1 μm to prepare a composition for forming a layer of low refractive index.

| (Composition of composition for forming layer of low refractive index) | |
|---|---|
| DPHA | 14.5 g |
| PO-1 | 24.5 g |
| Hollow silica particle dispersion liquid | 302.2 g |
| RMS-033 | 5.0 g |
| IRGACURE 907 | 1.0 g |
| Methyl ethyl ketone | 1,750 g |
| Cyclohexanone | 223.0 g |

The respective compounds used in the composition for forming a layer of low refractive index are shown below.
PO-1: The above perfluoroolefin copolymer (1)
DPHA: Mixture of dipentaerythritol pentaacrylate and dipentaerythritol hexaacrylate (produced by Nippon Kayaku Co., Ltd.)
RMS-033: Reactive silicone (produced by GELEST, INC.)
IRGACURE 907: Photopolymerization initiator (produced by Ciba Specialty Chemicals Inc.)
(Production of Hard Coat Layer)

A composition for forming a hard coat layer was applied onto a support S1 (TAC substrate having a thickness of 40 μm; and TG40 manufactured by FUJIFILM Corporation) with a gravure coater. The coating film was dried at 100° C., and then cured by performing irradiation with ultraviolet rays with an illuminance of 400 mW/cm$^2$ and an irradiation amount of 150 mJ/cm$^2$ using an air-cooled metal halide lamp (manufactured by EYE GRAPHICS Co., Ltd.) of 160 W/cm while performing nitrogen purging so that the atmosphere had an oxygen concentration of 1.0% by volume or less, thereby forming a hard coat layer having a thickness of 5 μm. The refractive index was 1.52.

The composition for forming a layer of medium refractive index, the composition for forming a layer of high refractive index, and the composition for forming a layer of low refractive index, each of which the refractive index was adjusted to a desired refractive index, were applied onto the obtained hard coat layer with a gravure coater to produce an antireflection film.

Moreover, the refractive index of each layer was measured with a multi-wavelength abbe refractometer DR-M2 (manufactured by ATAGO CO., LTD.) after applying the composition for forming each layer to a glass plate so as to have a thickness of about 4 μm.

Furthermore, the refractive index measured using a filter of "interference filter for DR-M2 and M4, 546(e) nm, part number: RE-3523" was employed as a refractive index at a wavelength of 550 nm.

The film thickness of each layer was calculated using a reflection spectroscopic film thickness meter "FE-3000" (manufactured by OTSUKA ELECTRONICS Co., LTD.) after laminating the layer of medium refractive index, the layer of high refractive index, and the layer of low refractive index in this order. For the refractive index of each layer in the calculation, the value derived by the abbe refractive index meter was used.

For the layer of medium refractive index, the drying conditions were such that the temperature was 90° C. and the time was 30 seconds, and the ultraviolet ray-curing conditions were such that while performing nitrogen purging so that the atmosphere had an oxygen concentration of 1.0% by volume or less, an air-cooled metal halide lamp (manufactured by EYE GRAPHICS Co., Ltd.) of 180 W/cm was used, the illuminance was 300 mW/cm$^2$; and the irradiation amount was 240 mJ/cm$^2$.

In the cured layer of medium refractive index, the refractive index was 1.62 and the layer thickness was 60 nm.

For the layer of high refractive index, the drying conditions were such that the temperature was 90° C. and the time was 30 seconds, and the ultraviolet ray-curing conditions were such that while performing nitrogen purging so that the atmosphere had an oxygen concentration of 1.0% by volume or less, an air-cooled metal halide lamp (manufactured by EYE GRAPHICS Co., Ltd.) of 240 mJ/cm was used, the illuminance was 300 mW/cm$^2$, and the irradiation amount was 240 mJ/cm$^2$. In the cured layer of high refractive index, the refractive index was 1.72 and the layer thickness was 110 nm.

For the layer of low refractive index, the drying conditions were such that the temperature was 90° C. and the time was 30 seconds, and the ultraviolet ray-curing conditions were such that while performing nitrogen purging so that the atmosphere had an oxygen concentration of 0.1% by volume or less, an air-cooled metal halide lamp (manufactured by EYE GRAPHICS Co., Ltd.) of 240 W/cm was used, the illuminance was 600 mW/cm$^2$, and the irradiation amount was 600 mJ/cm$^2$. In the cured layer of low refractive index, the refractive index was 1.36 and the layer thickness was 90 nm.

Consequently, the surface protective layer H1 can be produced.

<Preparation of UV Adhesive 1>

A UV adhesive 1 having the following composition was prepared.

| UV adhesive 1 | |
|---|---|
| CEL2021P (produced by DAICEL CORPORATION) | 70 parts by mass |
| 1,4-Butanediol diglycidyl ether | 20 parts by mass |
| 2-Ethylhexyl glycidyl ether | 10 parts by mass |
| CPI-100P | 2.25 parts by mass |

UV adhesive 1

CPI-100P

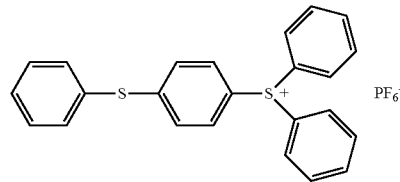

<Production of Surface Protective Layer 1 with Light-Absorbing Anisotropic Layer>

The support S1 side of the surface protective layer H1 was subjected to a corona treatment (in the following, the same treatment was performed for bonding with the UV adhesive 1), and was adhered to the oxygen shielding layer side of the laminated film 1B with the UV adhesive 1, and only the cellulose acylate film 1 was removed to produce a surface protective layer 1 with a light-absorbing anisotropic layer.

Furthermore, the layer configuration of the produced surface protective layer 1 with a light-absorbing anisotropic layer is photo-alignment layer PA1/light-absorbing anisotropic layer P1/refractive index-adjusting layer N1/oxygen shielding layer B1/surface protective layer H1.

<Production of Optically Anisotropic Layer>

(Production of Positive A-Plate A1)

A coating liquid 1 for forming an alignment layer, which will be described later, was continuously applied onto the cellulose acylate film 1 with a wire bar of #2.4. The support on which the coating film was formed was dried with hot air at 140° C. for 120 seconds, and subsequently, the coating film was irradiated with polarized ultraviolet rays (10 mJ/cm$^2$, using an ultra-high-pressure mercury lamp) to form an alignment layer P-1, whereby a TAC film with a photo-alignment layer was obtained.

| (Coating liquid 1 for forming alignment layer) | |
|---|---|
| The above polymer PA-1 | 100.00 parts by mass |
| The above acid generator PAG 1 | 1.00 part by mass |
| Isopropyl alcohol | 16.50 parts by mass |
| Butyl acetate | 1,072.00 parts by mass |
| Methyl ethyl ketone | 268.00 parts by mass |

Next, the composition A1 having the following composition was applied on the alignment layer P-1 with a bar coater. A coating film formed on the alignment layer P-1 was heated to 120° C. with hot air and then cooled to 60° C., and the alignment of the liquid crystalline compound was fixed by irradiating the coating film with ultraviolet rays at 100 mJ/cm$^2$ at a wavelength of 365 nm using a high-pressure mercury lamp in a nitrogen atmosphere, and subsequently irradiating the coating film with ultraviolet rays at 500 mJ/cm$^2$ while heating to 120° C., thereby producing a TAC film A-1 having a positive A-plate A1.

In the positive A-plate A1, the thickness was 2.5 μm and Re(550) was 144 nm. Moreover, the positive A-plate A1 satisfied a relationship of Re(450)≤Re(550)≤Re(650). Re(450)/Re(550) was 0.82.

| (Composition A1) | |
|---|---|
| The following polymerizable liquid crystalline compound L-1 | 43.50 parts by mass |
| The following polymerizable liquid crystalline compound L-2 | 43.50 parts by mass |
| The following polymerizable liquid crystalline compound L-3 | 8.00 parts by mass |
| The following polymerizable liquid crystalline compound L-4 | 5.00 parts by mass |
| The following polymerization initiator PI-1 | 0.55 parts by mass |
| The following leveling agent T-1 | 0.20 parts by mass |
| Cyclopentanone | 235.00 parts by mass |

Polymerizable liquid crystalline compound L-1

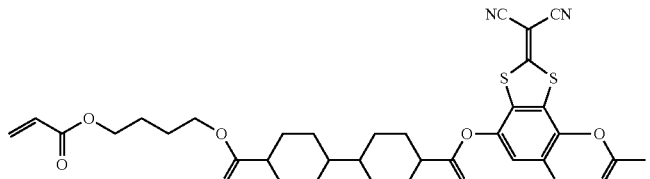

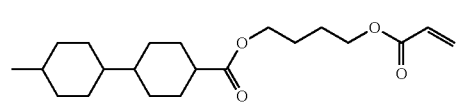

Polymerizable liquid crystalline compound L-2

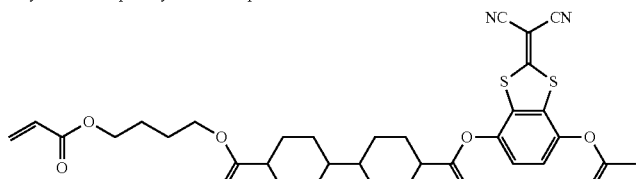

(Composition A1)

Polymerizable liquid crystalline compound L-3

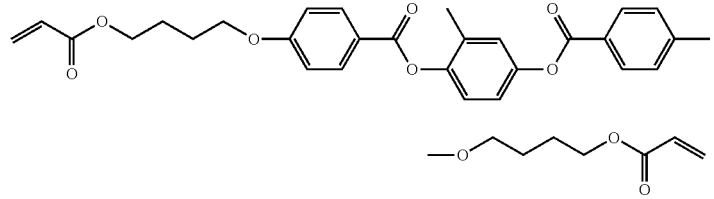

Polymerizable liquid crystalline compound L-4

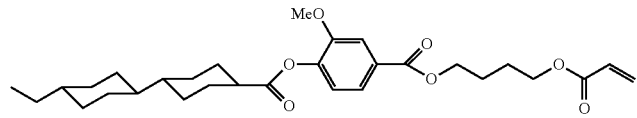 [SMILES: C=CC(=O)OCCCCOC(=O)c1ccc(OC(=O)C2CCC(C3CCC(CC)CC3)CC2)c(OC)c1]

Polymerization initiator PI-1

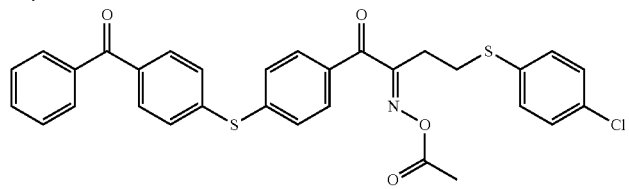

Leveling agent T-1

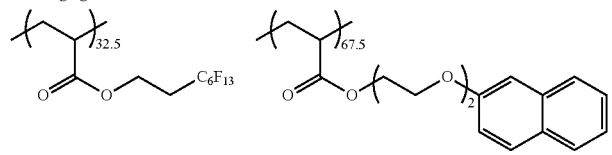

(Production of Positive C-Plate C1)

The cellulose acylate film 1 was used as a temporary support.

The cellulose acylate film 1 was allowed to pass through a dielectric heating roll at a temperature of 60° C., the film surface temperature was raised up to 40° C., then an alkali solution having the following composition was applied onto one surface of the film at an application amount of 14 ml/m² using a bar coater, and the film was heated at 110° C. and transported for 10 seconds under a steam-type far infrared heater manufactured by NORITAKE CO, LIMITED.

Next, pure water was applied onto the film at 3 ml/m² with the same bar coater.

Subsequently, water-washing using a fountain coater and drainage using an air knife were repeated three times, and then, the film was transported to a drying zone at 70° C. for 10 seconds for drying to produce a cellulose acylate film 1 which had been subjected to an alkali saponification treatment.

| (Alkali solution) | |
|---|---|
| Potassium hydroxide | 4.7 parts by mass |
| Water | 15.8 parts by mass |
| Isopropanol | 63.7 parts by mass |
| Surfactant SF-1 ($C_{14}H_{29}O(CH_2CH_2O)_{20}H$) | 1.0 part by mass |
| Propylene glycol | 14.8 parts by mass |

A coating liquid 2 for forming an alignment layer having the following composition was continuously applied with a wire bar of #8 onto the cellulose acylate film 1 which had been subjected to an alkali saponification treatment. The obtained film was dried with hot air at 60° C. for 60 seconds and further dried with hot air at 100° C. for 120 seconds to form an alignment layer.

| (Coating liquid 2 for forming alignment layer) | |
|---|---|
| Polyvinyl alcohol (produced by KURARAY CO., LTD., PVA 103) | 2.4 parts by mass |
| Isopropyl alcohol | 1.6 parts by mass |
| Methanol | 36 parts by mass |
| Water | 60 parts by mass |

A coating liquid (composition) C1 for forming a positive C-plate having the following composition was applied onto the alignment layer, the obtained coating film was aged at 60° C. for 60 seconds, and then irradiated with ultraviolet rays at 1,000 mJ/cm² in air using an air-cooled metal halide lamp (manufactured by EYE GRAPHICS Co., Ltd.) at 70 mW/cm², and the alignment state was fixed to vertically align a liquid crystalline compound, thereby producing a positive C-plate 1.

The Rth (550) of the obtained positive C-plate was −60 nm.

| Coating liquid C1 for forming positive C-plate | |
|---|---|
| The following liquid crystalline compound L-11 | 80 parts by mass |
| The following liquid crystalline compound L-12 | 20 parts by mass |
| The following vertical alignment agent (S01) for liquid crystalline compound | 1 parts by mass |
| Ethylene oxide-modified trimethylol propane triacrylate (V#360, produced by OSAKA ORGANIC CHEMICAL INDUSTRY LTD.) | 8 parts by mass |
| IRGACURE 907 (produced by BASF SE) | 3 parts by mass |
| KAYACURE DETX (produced by Nippon Kayaku Co., Ltd) | 1 part by mass |
| The following compound B03 | 0.4 parts by mass |
| Methyl ethyl ketone | 170 parts by mass |
| Cyclohexanone | 30 parts by mass |

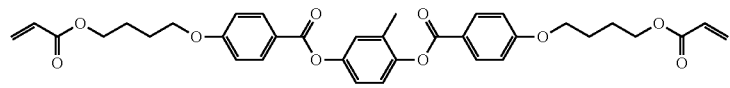

L-11

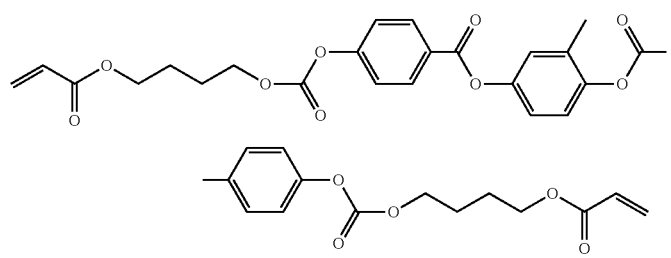

L-12

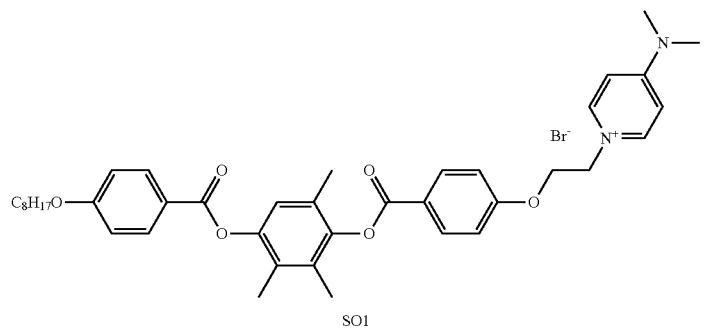

S01

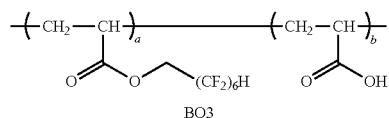

B03

(Production of Optically Anisotropic Layer)

The surface side of the phase difference layer of the positive C-plate 1 produced above was adhered to the surface of the phase difference layer (positive A-plate A1) of the TAC film A-1 with the UV adhesive 1, and the alignment layer on the TAC film A-1 side and the cellulose acylate film 1 were removed to obtain a film 1 with an optically anisotropic layer.

<Production of Laminate 1>

The surface on the light-absorbing anisotropic layer side of the surface protective layer 1 with a light-absorbing anisotropic layer produced above was adhered to the surface of the optically anisotropic layer (positive A-plate A1) of the film 1 with an optically anisotropic layer with the UV adhesive 1, and the alignment layer and the cellulose acylate film 1 were removed to form a laminate 1 of Example 1, At this time, the adhesion was performed so that the angle formed by the absorption axis of the light-absorbing anisotropic layer included in the surface protective layer 1 with a light-absorbing anisotropic layer and the slow axis of the positive A-plate A1 included in the film 1 with an optically anisotropic layer was 45°.

Example 2

A laminate of Example 2 was obtained in the same manner as in Example 1, except that the composition P1 for forming a light-absorbing anisotropic layer was changed to the following composition P2 for forming a light-absorbing anisotropic layer in the formation of the light-absorbing anisotropic layer of Example 1.

| Composition P2 for forming light-absorbing anisotropic layer | |
|---|---|
| The above azo coloring agent Y-1 | 0.25 parts by mass |
| The above azo coloring agent M-1 | 0.27 parts by mass |
| The following azo coloring agent C-2 | 0.65 parts by mass |
| The following high-molecular liquid crystalline compound P-2 | 3.71 parts by mass |
| Polymerization initiator IRGACURE OXE-03 (produced by BASF SE) | 0.151 parts by mass |
| The above interface modifier F-1 | 0.026 parts by mass |
| Cyclopentanone | 47.50 parts by mass |
| Tetrahydrofuran | 47.50 parts by mass |

Cyanazo coloring agent C-2

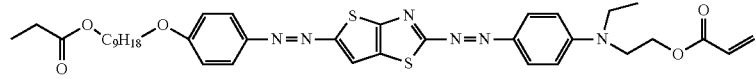

High-molecular liquid crystalline compound P-2

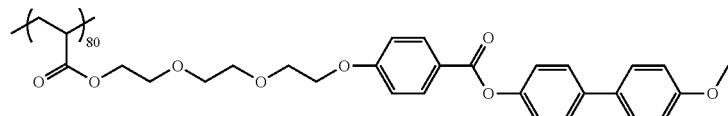

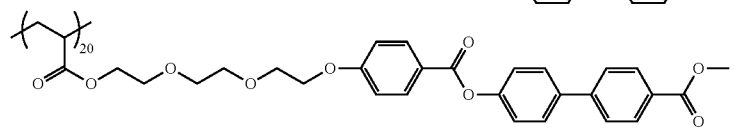

Example 3

A laminate of Example 3 was obtained in the same manner as in Example 1, except that the composition P1 for forming a light-absorbing anisotropic layer was changed to the following composition P3 for forming a light-absorbing anisotropic layer in the formation of the light-absorbing anisotropic layer of Example 1.

| Composition P3 for forming light-absorbing anisotropic layer | |
|---|---|
| The following azo coloring agent Y-2 | 0.25 parts by mass |
| The following azo coloring agent M-2 | 0.27 parts by mass |
| The following azo coloring agent C-3 | 0.65 parts by mass |
| The above high-molecular liquid crystalline compound P-2 | 3.71 parts by mass |
| Polymerization initiator IRGACURE OXE-03 (produced by BASF SE) | 0.151 parts by mass |
| The above interface modifier F-1 | 0.026 parts by mass |
| Cyclopentanone | 47.50 parts by mass |
| Tetrahydrofuran | 47.50 parts by mass |

Azo coloring agent Y-2

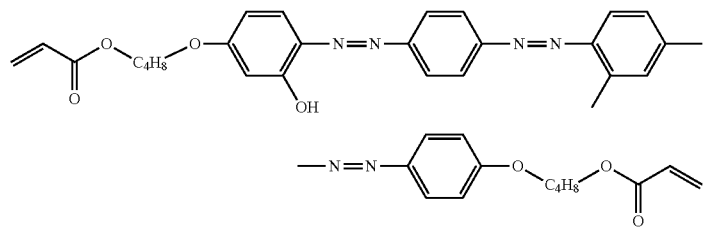

Azo coloring agent M-2

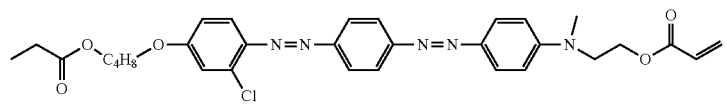

| Composition P3 for forming light-absorbing anisotropic layer |
|---|

Azo coloring agent C-3

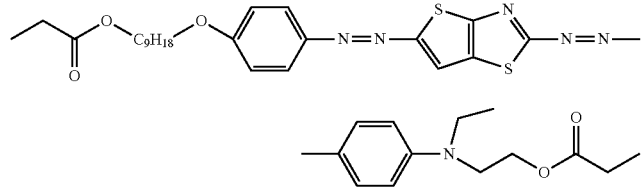

Example 4

A laminate of Example 4 was obtained in the same manner as in Example 1, except that the composition P1 for forming a light-absorbing anisotropic layer was changed to the following composition P4 for forming a light-absorbing anisotropic layer in the formation of the light-absorbing anisotropic layer of Example 1.

| Composition P4 for forming light-absorbing anisotropic layer | |
|---|---|
| The above azo coloring agent Y-2 | 0.17 parts by mass |
| The above azo coloring agent M-2 | 0.19 parts by mass |
| The above azo coloring agent C-3 | 0.45 parts by mass |
| The following high-molecular liquid crystalline compound P-3 | 4.07 parts by mass |
| Polymerization initiator IRGACURE OXE-03 produced by BASF SE) | 0.151 parts by mass |
| The above interface modifier F-1 | 0.026 parts by mass |
| Cyclopentanone | 47.50 parts by mass |
| Tetrahydrofuran | 47.50 parts by mass |

High-molecular liquid crystalline compound P-3

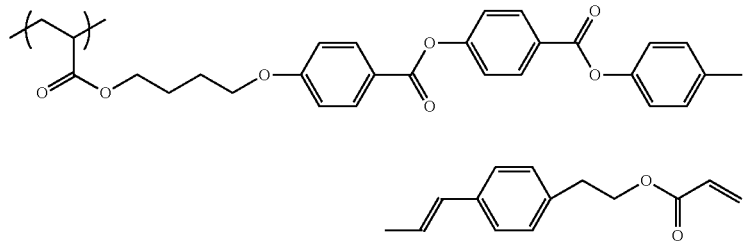

Example 5

A laminate of Example 5 was obtained in the same manner as in Example 1, except that the composition N1 for forming a refractive index-adjusting layer was changed to the following composition N2 for forming a refractive index-adjusting layer and the film thickness was adjusted in the formation of the refractive index-adjusting layer of Example 1. The film thickness of the refractive index-adjusting layer N2 was 0.1

| Composition N2 for forming refractive index-adjusting layer | |
|---|---|
| Zirconium oxide particles | 10.1 parts by mass |
| DPHA (produced by Nippon Kayaku Co., Ltd.) | 60.9 parts by mass |
| Polymerization initiator IRGACURE 907 (produced by BASF SE) | 3.5 parts by mass |
| Photosensitizer KAYACURE DETX (produced by Nippon Kayaku Co., Ltd.) | 0.3 parts by mass |
| Methyl ethyl ketone | 146.3 parts by mass |
| Cyclohexanone | 609.6 parts by mass |

Example 6

A laminate of Example 6 was obtained in the same manner as in Example 1, except that the composition N1 for forming a refractive index-adjusting layer was changed to the following composition N3 for forming a refractive index-adjusting layer and the film thickness was adjusted in the formation of the refractive index-adjusting layer of Example 1. The film thickness of the refractive index-adjusting layer N3 was 0.1 μm.

| Composition of composition N3 for forming refractive index-adjusting layer | |
|---|---|
| CEL2021P (produced by DAICEL CORPORATION) | 32 parts by mass |
| Polymerization initiator IRGACURE 819 (produced by BASF SE) | 1 part by mass |
| Alumina ethanol sol A2K5-10 (produced by Kawaken Fine Chemicals Co., Ltd., colloid liquid in which columnar hydrated alumina particles are dispersed in a liquid) | 60 parts by mass |
| CPI-100P (50% propylene carbonate solution) | 2 parts by mass |

CEL2021P

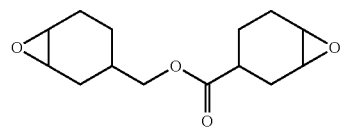 [SMILES: O=C(OCC1CCC2OC2C1)C1CCC2OC2C1]

CPI-100P

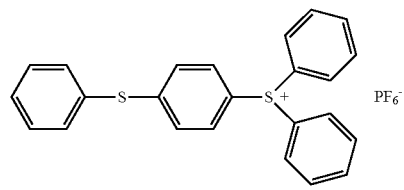

Example 7

A laminated film 7B was produced by subjecting the refractive index-adjusting layer side to a corona treatment without forming the oxygen shielding layer B1 in a laminated film 5B (cellulose acylate film 1/photo-alignment layer PA1/light-absorbing anisotropic layer P1/refractive index-adjusting layer N2/oxygen shielding layer B1) of Example 5.

Furthermore, the support side of the surface protective layer 1 was also subjected to the corona treatment.

(Formation of Oxygen Shielding Layer B2 Also Functioning as Adhesive Layer)

20 parts of methylol melamine with respect to 100 parts of a polyvinyl alcohol-based resin (average degree of polymerization: 1,200, saponification degree: 98.5% by mole, and acetoacetylation degree: 5% by mole) containing an acetoacetyl group was dissolved in pure water under a temperature condition of 30° C. to prepare an aqueous solution (hereinafter, abbreviated as a "composition B2 for forming an oxygen shielding layer") in which the concentration of the solid content was adjusted to 3.7%.

(Production of Surface Protective Layer 7 with Light-Absorbing Anisotropic Layer)

The corona-treated surface of the laminated film 7B was adhered to the corona-treated surface of the surface protective layer 1 using the composition B2 for forming an oxygen shielding layer, and only the cellulose acylate film 1 was removed to produce a surface protective layer 7 with a light-absorbing anisotropic layer. The thickness of the oxygen shielding layer B2 also functioning as an adhesive layer was 2.3 μm.

Furthermore, the oxygen permeability of the oxygen shielding layer B2 was 1 cc/m$^2$/day/atm.

A laminate of Example 7 was obtained in the same manner as in Example 1, except that the surface protective layer 1 with a light-absorbing anisotropic layer was changed to the surface protective layer 7 with a light-absorbing anisotropic layer.

Example 8

A laminate of Example 8 was obtained in the same manner as in Example 7, except that the composition N2 for forming a refractive index-adjusting layer was changed to the following composition N4 for forming a refractive index-adjusting layer and the film thickness was adjusted in the formation of the refractive index-adjusting layer of Example 7. The film thickness of the refractive index-adjusting layer N4 was 0.1 μm.

| Composition N4 for forming refractive index-adjusting layer | |
|---|---|
| The above mixture L1 of rod-like liquid-crystalline compounds | 1.88 parts by mass |
| The above modified trimethylol propane triacrylate | 2.16 parts by mass |
| The above photopolymerization initiator I-1 | 0.20 parts by mass |
| The above interface modifier F-1 | 0.14 parts by mass |
| 1,4-Phenylenediboronic acid (Tokyo Chemical Industry Co., Ltd.) | 0.10 parts by mass |
| Methyl ethyl ketone | 434 parts by mass |

Example 9

In the formation of the refractive index-adjusting layer of Example 7, the composition N2 for forming a refractive index-adjusting layer was changed to the following composition N5 for forming a refractive index-adjusting layer, and the film thickness was adjusted. Moreover, the composition B2 for forming an oxygen shielding layer was changed to the following composition B3 for forming an oxygen shielding layer. A laminate of Example 9 was obtained in the same manner as in Example 7 except for the above matters. The film thickness of the refractive index-adjusting layer N5 was 60 nm.

Furthermore, the oxygen permeability of the oxygen shielding layer B3 was 1 cc/m$^2$/day/atm.

| Composition N5 for forming refractive index-adjusting layer | |
|---|---|
| The above mixture L1 of rod-like liquid-crystalline compounds | 3.28 parts by mass |
| The above modified trimethylol propane triacrylate | 0.13 parts by mass |
| The above photopolymerization initiator I-1 | 0.20 parts by mass |
| The above interface modifier F-1 | 0.14 parts by mass |
| 1,4-Phenylenediboronic acid (Tokyo Chemical Industry Co., Ltd.) | 0.10 parts by mass |
| Methyl ethyl ketone | 371 parts by mass |

(Preparation of Composition B3 for Forming Oxygen Shielding Layer)

20 parts of methylol melamine and 9.4 parts of zirconium oxide particles with respect to 100 parts of a polyvinyl alcohol-based resin (average degree of polymerization: 1,200, saponification degree: 98.5% by mole, and acetoacetylation degree: 5% by mole) containing an acetoacetyl group were dissolved in pure water under a temperature condition of 30° C. to prepare an aqueous solution in which the concentration of the solid content was adjusted to 3.7%.

Example 10

In the formation of the refractive index-adjusting layer of Example 7, the composition N2 for forming a refractive index-adjusting layer was changed to the composition N1 for forming a refractive index-adjusting layer. Moreover, the support S1 of the surface protective layer 141 was changed to the following support S2 to form a surface protective layer H2. A laminate of Example 10 was obtained in the same manner as in Example 7 except for the above matters.

(Production of Support S2)

An acrylic resin having a lactone ring structure was obtained by the method described in paragraph 0154 of JP2012-008248A.

A composition described below was introduced into a mixing tank and stirred white heating to dissolve the respective components, thereby preparing a dope composition.

| Acrylic resin dope composition | |
|---|---|
| The above acrylic resin | 100 parts by mass |
| Crosslinked acrylic resin particles TECHPOLYMER SSX-108 (Sekisui Kasei Co., Ltd.) | 50 parts by mass |
| Dichloromethane | 534 parts by mass |
| Methanol | 46 parts by mass |

The dope composition was uniformly cast in a width of 2,000 mm from a casting die onto a stainless steel-made endless band (casting support) by using a band casting device having the configuration shown in FIG. 1 of WO2015/064732A1. The film was peeled from the casting support when the amount of residual solvents in the dope composition reached 20% by mass.

The peeled film was dried in a drying zone (atmosphere temperature was 140° C.) for 30 minutes to obtain an acrylic resin film. The thickness of the acrylic resin film was adjusted to 40 μm depending on the amount of the dope composition used for film formation.

Comparative Example 1

A laminate of Comparative Example 1 was obtained in the same manner as in Example 1, except that the composition N1 for forming a refractive index-adjusting layer was changed to the following composition N6 for forming a refractive index-adjusting layer and the film thickness was adjusted in the formation of the refractive index-adjusting layer of Example 1. The film thickness of the refractive index-adjusting layer N6 was 0.1 μm.

| Composition of composition N6 for forming refractive index-adjusting layer | |
|---|---|
| CEL2021P (produced by DAICEL CORPORATION) | 32 parts by mass |
| Polymerization initiator IRGACURE 819 (produced by BASF SE) | 1 part by mass |
| CPI-100P (50% propylene carbonate solution) | 2 parts by mass |
| Methyl ethyl ketone (MEK) | 65 parts by mass |

Comparative Example 2

A laminate of Comparative Example 2 was obtained in the same manner as in Example 1, except that the refractive index-adjusting layer was not formed in the formation of the refractive index-adjusting layer of Example 1.

Comparative Example 3

A laminate of Comparative Example 3 was obtained in the same manner as in Example 1, except that the oxygen shielding layer was not formed in the formation of the oxygen shielding layer of Example 1.

Comparative Example 4

A laminate of Comparative Example 4 was obtained in the same manner as in Example 1 except that neither the refractive index-adjusting layer nor the oxygen shielding layer was formed in the formation of the refractive index-adjusting layer and the oxygen shielding layer of Example 1.

Example 11

A laminate of Example 11 was obtained in the same manner as in Example 1, except that the composition A1 was changed to the following composition A2 to produce a positive A-plate A2 in the production of the positive A-plate A1 of Example 1.

| (Composition A2) | |
|---|---|
| The following polymerizable liquid crystalline compound L-5 | 87.0 parts by mass |
| The above polymerizable liquid crystalline compound L-3 | 8.00 parts by mass |

| (Composition A2) | |
|---|---|
| The above polymerizable liquid crystalline compound L-4 | 5.00 parts by mass |
| The above polymerization initiator PI-1 | 0.55 parts by mass |
| The above leveling agent T-1 | 0.20 parts by mass |
| Cyclopentanone | 235.00 parts by mass |

Polymerizable liquid crystalline compound L-5

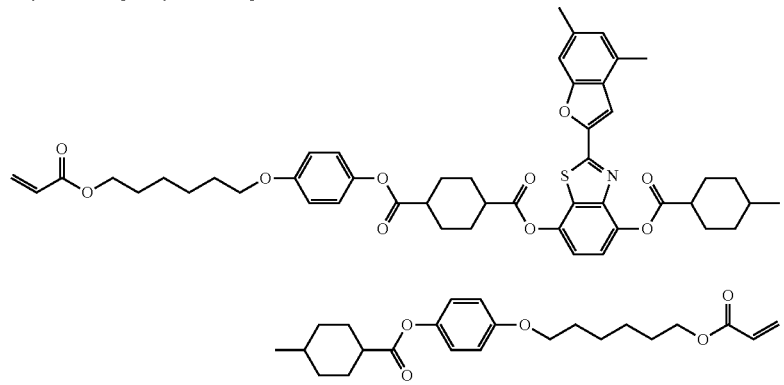

L-5

Example 12

A laminate of Example 12 was obtained in the same manner as in Example 1, except that the composition B1 for forming an oxygen shielding layer was changed to the following composition B4 for forming an oxygen shielding layer and the film thickness was adjusted in the formation of the oxygen shielding layer of Example 1. The film thickness of the oxygen shielding layer B4 was 2.0 μm.

Furthermore, the oxygen permeability of the oxygen shielding layer B4 was 60 cc/m²/day/atm.

| Composition of composition B4 for forming oxygen shielding layer | |
|---|---|
| CEL2021P (produced by DAICEL CORPORATION) | 144 parts by mass |
| Polymerization initiator IRGACURE 819 (produced by BASF SE) | 4 parts by mass |
| CPI-100P (50% propylene carbonate solution) | 6 parts by mass |
| The following interface modifier F-2 | 0.3 parts by mass |
| Methyl ethyl ketone (MEK) | 347 parts by mass |

Interface modifier F-2

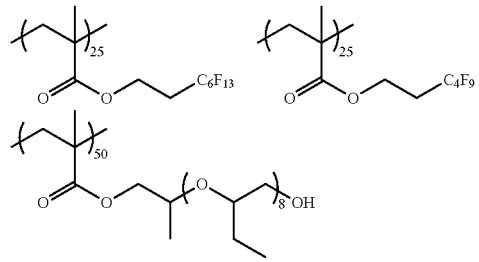

Example 13

<Production of Surface Protective Layer H3>
(Production of Polyimide Powder)

After 832 g of N,N-dimethylacetamide (DMAc) was added to a 1-L reactor equipped with a stirrer, a nitrogen injection device, a dropping funnel, a temperature controller, and a cooler in a nitrogen stream, the temperature of the reactor was set to 25° C. 64.046 g (0.2 mol) of bistrifluoromethyl benzidine (TFDB) was added thereto and dissolved. While maintaining the obtained solution at 25° C., 31.09 g (0.07 mol) of 2,2-bis(3,4-dicarboxyphenyl)hexafluoropropane dianhydride (6FDA) and 8.83 g (0.03 mol)) of biphenyltetracarboxylic acid dianhydride (BPDA) were introduced, and the mixture was reacted by stirring for a certain period of time. Thereafter, 20.302 g (0.1 mol) of terephthaloyl chloride (TPC) was added to obtain a polyamic acid solution having a concentration of the solid content of 13% by mass. Subsequently, 25.6 g of pyridine and 33.1 g of acetic acid anhydride were introduced to the polyamic acid solution, and the mixture was stirred for 30 minutes, further stirred at 70° C. for 1 hour, and then cooled to a normal temperature. 20 L of methanol was added thereto, and the precipitated solid content was filtered and pulverized. Next, the resultant was dried in a vacuum at 100° C. for 6 hours to obtain 111 g of polyimide powder.

(Production of Support S3)

100 g of polyimide powder was dissolved in 670 g of N,N-dimethylacetamide (DMAc) to obtain a 13% by mass solution. The obtained solution was cast on a stainless steel plate and dried with hot air at 130° C. for 30 minutes. Thereafter, the film was peeled from the stainless steel plate, and fixed to a frame with pins, and the frame to which the film was fixed was placed in a vacuum oven, heated for 2 hours while gradually increasing a heating temperature from 100° C. to 300° C., and then gradually cooled. The cooled film was separated from the frame, and then further heat-treated at 300° C. for 30 minutes as a final heat treatment step to obtain a support S3 consisting of a polyimide film and having a thickness of 30 μm.

<Synthesis of polyorganosilsesquioxane having Polymerizability>

(Synthesis of Compound (A))

297 mM (73.2 g) of 2-(3,4-epoxycyclohexyl)ethyltrimethoxysilane, 3 mM (409 mg) of methyltrimethoxysilane, 7.39 g of triethylamine, and 370 g of methyl isobutyl ketone (MIBK) were mixed in a 1,000-ml flask (reaction vessel) equipped with a thermometer, a stirrer, a reflux condenser, and a nitrogen introduction pipe in a nitrogen stream, and 73.9 g of pure water was added dropwise using a dropping funnel over 30 minutes. This reaction solution was heated to 80° C., and a polycondensation reaction was carried out in a nitrogen stream for 10 hours.

Thereafter, the reaction solution was cooled, 300 g of a 5% by mass saline solution was added, and an organic layer was extracted. The organic layer was sequentially washed twice with 300 g of a 5% by mass saline solution and 300 g of pure water, and then concentrated under conditions of 1 mmHg and 50° C. to obtain, as a MIBK solution having a concentration of the solid content of 59.8% by mass, a methyl isobutyl ketone (MIBK) solution containing a colorless and transparent liquid product {a compound (A) (a compound in which in the following (1), Rb is a 2-(3,4-epoxycyclohexyl) ethyl group, Rc is a methyl group, q is 99, and r is 1) which is polyorganosilsesquioxane having an alicyclic epoxy group} as a concentration of the solid content of 59.0% by mass.

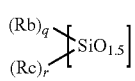

(1)

In the obtained compound (A), the number-average molecular weight (Mn) was 2,310, and the dispersity (Mw/Mn) was 2.1.

Furthermore, 1 mmHg is about 133.322 Pa.

(Synthesis of Polymer (1-1))

A 200-ml three-neck flask comprising a stirrer, a thermometer, a reflux cooling pipe, and a nitrogen gas introduction pipe was charged with 25.0 g of t-amyl alcohol, and the temperature was raised to 120° C. Subsequently, a mixed solution consisting of 3.25 g (7.8 mM) of 2-(perfluorohexyl) ethylacrylate {corresponding to a monomer (K2)}, 2.26 g (4.7 mM) of a compound (I-1) {corresponding to a monomer (K1)} having the following structure, 25.0 g of cyclohexanone, and 4.7 g of "V-601" (produced by FUJIFILM Wako Pure Chemical Corporation) was added dropwise at a constant speed so that the dropwise addition was completed in 120 minutes. After completion of the dropwise addition, stirring was further continued for 3.5 hours to obtain 5.5 g (value expressed in terms of solid contents) of polymer (1-1). The weight-average molecular weight (Mw) of this polymer was 1,1001,600.

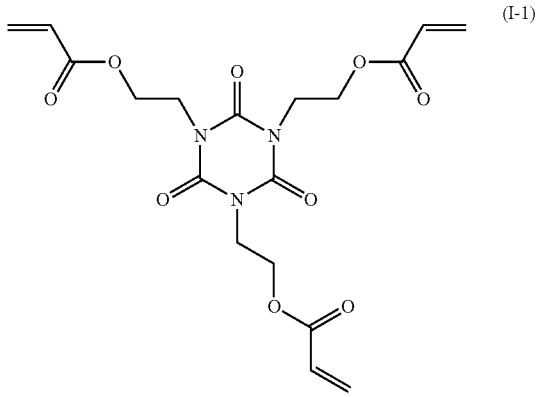 [SMILES: C=CC(=O)OCCn1c(=O)n(CCOC(=O)C=C)c(=O)n(CCOC(=O)C=C)c1=O]

(I-1)

<Preparation of Composition for Forming Hard Coat Layer>

(Composition HC-1 for Forming Hard Coat Layer)

CPI-100P, the polymer (1-1), and methyl isobutyl ketone (MIBK) were added to the MIBK solution containing the compound (A), the concentration of each contained component was adjusted to the following concentration, and the mixture was introduced into a mixing tank and stirred. The obtained composition was filtered with a polypropylene-made filter having a pore diameter of 0.4 μm to obtain a composition HC-1 for forming a hard coat layer.

| Compound (A) | 98.6 parts by mass |
| CPI-100P | 1.3 parts by mass |
| Polymer (1-1) | 0.1 parts by mass |
| Methyl iso butyl ketone | 100.0 parts by mass |

In addition, the compound used in the composition for forming a hard coat layer is as follows.

CPI-100P: Cationic photopolymerization initiator, produced by San-Apra Ltd.

<Preparation of Composition for Forming Mixed Layer>

(Composition M-1 for Forming Mixed Layer)

The MIBK solution containing the compound (A) was subjected to solvent substitution with a methyl ethyl ketone (MEK) solution, DPHA, CPI-100P, IRGACURE 127, a leveling agent-1, and MEK were added, the concentration of each contained component was adjusted to the following concentration, and the mixture was introduced into a mixing tank and stirred. The obtained composition was filtered with a polypropylene-made filter having a pore diameter of 0.4 μm to obtain a composition M-1 for forming a mixed layer. A mixing ratio of the compound (A) to DPHA in the composition M-1 for forming a mixed layer satisfies compound (A)/DPHA=50% by mass/50% by mass.

| Compound (A) | 42.85 parts by mass |
| DPHA | 42.85 parts by mass |
| CPI-100P | 1.3 parts by mass |
| IRGACURE 127 | 5.0 parts by mass |
| Leveling agent-1 | 8.0 parts by mass |
| Methyl ethyl ketone | 500.0 parts by mass |

In addition, the compounds used in the composition for forming a mixed layer are as follows.

DPHA: Mixture of dipentaerythritol pentaacrylate and dipentaerythritol hexaacrylate, produced by Nippon Kayaku Co., Ltd.

IRGACURE 127: Radical photopolymerization initiator, produced by BASF SE

Leveling agent-1: Polymer having the following structure (Mw=20,000, and a compositional ratio of the following repeating units is a mass ratio)

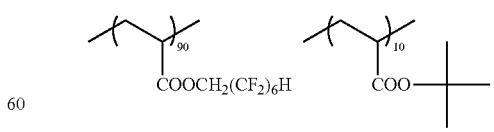

<Preparation of Composition for Forming Scratch-Resistant Layer>

(Composition SR-1 for Forming Scratch-Resistant Layer)

Respective components were introduced into a mixing tank in the following composition, stirred, and filtered with a polypropylene-made filter having a pore diameter of 0.4 µm to obtain a composition SR-1 for forming a scratch-resistant layer.

| DPHA | 96.2 parts by mass |
|---|---|
| IRGACURE 127 | 2.8 parts by mass |
| RS-90 | 1.0 part by mass |
| Methyl ethyl ketone | 300.0 parts by mass |

In addition, the compound used n the composition for forming a scratch-resistant layer is as follows.
RS-90: Lubricant, produced by DIC CORPORATION
(Production of Surface Protective Layer H3)

The composition for forming a hard coat layer was applied onto a substrate with a die coater. The resultant was dried at 120° C. for 1 minute, and then irradiated with ultraviolet rays with an illuminance of 18 mW/cm$^2$ and an irradiation amount of 10 mJ/cm$^2$ using an air-cooled mercury lamp under a condition of 25° C. to semi-cure a hard coat layer. The refractive index of this layer was 1.53.

A composition for forming a mixed layer, which was obtained by adding MEK to the composition M-1 for forming a mixed layer and diluting the concentration of the solid content to 1/10, was prepared, and applied onto the semi-cured hard coat layer with a die coater. The resultant was dried at 120° C. for 1 minute, and then irradiated with ultraviolet rays with an illuminance of 18 mW/cm$^2$ and an irradiation amount of 10 mJ/cm$^2$ using an air-cooled mercury lamp under conditions of 25° C. and an oxygen concentration of 1% to semi-cure a mixed layer, and the mixed layer was provided on the hard coat layer.

The composition SR-1 for forming a scratch-resistant layer was applied onto the semi-cured mixed layer with a die coater. The resultant was dried at 120° C. for 1 minute, then irradiated with ultraviolet rays with an illuminance of 60 mW/cm$^2$ and an irradiation amount of 800 mJ/cm$^2$ using an air-cooled mercury lamp under conditions of 25° C. and an oxygen concentration of 100 ppm, and further irradiated with ultraviolet rays with an illuminance of 60 mW/cm$^2$ and an irradiation amount of 800 mJ/cm$^2$ using an air-cooled mercury lamp under conditions of 80° C. and an oxygen concentration of 100 ppm to completely cure the hard coat layer, the mixed layer, and the scratch-resistant layer. Thereafter, the obtained film was heat-treated at 120° C. for 1 hour to obtain a surface protective layer H3 including the mixed layer having a thickness of 0.1 µm and the scratch-resistant layer having a thickness of 1.0 µm on the hard coat layer having a thickness of 11.0 µm.

(Preparation of Composition B5 for Forming Oxygen Shielding Layer)

20 parts of methylol melamine and 1.6.7 parts of zirconium oxide particles with respect to 100 parts of a polyvinyl alcohol-based resin (average degree of polymerization: 1,200, saponification degree: 98.5% by mole, and acetoacetylation degree: 5% by mole) containing an acetoacetyl group were dissolved in pure water under a temperature condition of 30° C. to prepare an aqueous solution in which the concentration of the solid content was adjusted to 3.7%.

(Production of Laminate of Example 13)

The surface protective layer H1 of Example 9 was changed to the surface protective layer H3 produced above, and the composition B3 for forming an oxygen shielding layer was changed to the composition B5 for forming an oxygen shielding layer. A laminate of Example 13 was obtained in the same manner as in Example 9 except for the above, matters. Furthermore, the oxygen permeability of the oxygen shielding layer B5 was 1 cc/m$^2$/day/atm.

Example 14

(Production of Support S4)

A nitrogen-substituted polymerization tank was charged with a compound represented by Formula (1), a compound represented by Formula (2), a compound represented by Formula (3), a catalyst, and solvents (γ-butyrolactone and dimethylacetamide). The charged amount was 75.0 g for the compound represented by Formula (1), 36.5 g for the compound represented by Formula (2), 76.4 g for the compound represented by Formula (3), 1.5 g for the catalyst, 438.4 g for the γ-butyrolactone, and 313.1 g for the dimethylacetamide. The molar ratio of the compound represented by Formula (2) to the compound represented by Formula (3) was 3:7, and the molar ratio of the total of the compound represented by Formula (2) and the compound represented by Formula (3) to the compound represented by Formula (1) was 1.00:1.02.

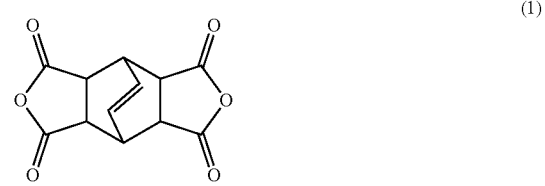

(1)

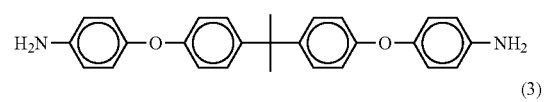

(2)

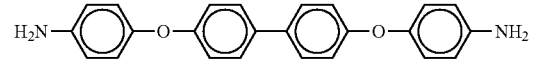

(3)

After the mixture in the polymerization tank was stirred to dissolve the raw materials in the solvent, the temperature of the mixture was raised to 100° C., then raised to 200° C., and kept for 4 hours to polymerize polyimide. During this heating, water in the liquid was removed. Thereafter, polyimide (a polyimide-based polymer containing a repeating structural unit represented by Formula (Pt)) was obtained by purification and drying.

Next, a γ-butyrolactone solution of the polyimide of which the concentration was adjusted to 20% by mass, a dispersion liquid in which silica particles having a concentration of the solid content of 30% by mass were dispersed in γ-butyrolactone, a dimethylacetamide solution of alkoxysilane having an amino group, and water were mixed, and stirred for 30 minutes. The stirring was performed in accordance with the method described in U.S. Pat. No. 8,207,256B2.

Here, the mass ratio of the silica particles to the polyimide was 43:57, the amount of the alkoxysilane having an amino group was 1.67 parts by mass with respect to 100 parts by mass of the total of the silica particles and the polyimide, and the amount of the water was 10 parts by mass with respect to 100 parts by mass of the total of the silica particles and the polyimide.

The mixed solution was applied to a glass substrate, and dried by heating at 50° C. for 30 minutes and at 140° C. for 10 minutes. Thereafter, the film was peeled from the glass substrate, a metal frame was attached, and heating was performed at 210° C. for 1 hour to obtain a support S4 having a thickness of 40 μm. The content of silica particles in this resin film is 43% by mass. The refractive index was 1.58.

<Production of Surface Protective Layer H4>

The support S3 in the surface protective layer 113 was changed to the support S4 to produce a surface protective layer H4.

(Production of Laminate of Example 14)

The surface protective layer 1-13 of Example 13 was changed to the surface protective layer H4 produced above. A laminate of Example 14 was obtained in the same manner as in Example 13 except for the above matters.

Example 15

(Production of Support S5)

A support S5 having a refractive index of 1.53 was produced by changing the mass ratio of the silica particles to the polyimide in the production of the support S4.

<Production of Surface Protective Layer H5>

The support S3 in the surface protective layer H3 was changed to the support S5 to produce a surface protective layer 1-15.

(Production of Laminate of Example 15)

The surface protective layer H1 of Example 6 was changed to the surface protective layer H5 produced above. A laminate of Example 15 was obtained in the same manner as in Example 6 except for the above matters.

Example 16

A laminate of Example 16 was obtained in the same manner as in Example 15, except that the composition N3 for forming a refractive index-adjusting layer was changed to the composition N1 for forming a refractive index-adjusting layer in the formation of the refractive index-adjusting layer of Example 15.

Example 17

A surface protective layer 21 with a light-absorbing anisotropic layer was produced by adhering the surface protective layer H5 instead of the surface protective layer H1 and removing the cellulose acylate film 1 and the photo-alignment layer PA-1 in the production of the surface protective layer 9 with a light-absorbing anisotropic layer of Example 9. A laminate of Example 17 was obtained in the same manner as in Example 9 except for the above matters.

Example 18

In the formation of a refractive index-adjusting layer of Example 14, the composition N5 for forming a refractive index-adjusting layer was changed to the composition N1 for forming a refractive index-adjusting layer, and the surface protective layer H4 was changed to the surface protective layer H5. A laminate of Example 18 was obtained in the same manner as in Example 14 except for the above matters.

Example 19

A laminate of Example 19 was obtained in the same manner as in Example 1, except that the composition P1 for forming a light-absorbing anisotropic layer was changed to the following composition P5 for forming a light-absorbing anisotropic layer in the formation of the light-absorbing anisotropic layer of Example 1.

| Composition P5 for forming light-absorbing anisotropic layer | |
|---|---|
| The above azo coloring agent Y-1 | 0.13 parts by mass |
| The above azo coloring agent M-1 | 0.14 parts by mass |
| The above azo coloring agent C-2 | 0.34 parts by mass |
| The above high-molecular liquid crystalline compound P-2 | 4.27 parts by mass |
| Polymerization initiator IRGACURE OXE-03 (produced by BASF SE) | 0.151 parts by mass |
| The above interface modifier F-1 | 0.026 parts by mass |
| Cyclopentanone | 47.50 parts by mass |
| Tetrahydrofuran | 47.50 parts by mass |

[Evaluation]

<Production of Organic EL Display Device 1>

GALAXY S4 manufactured by SAMSUNG, having an organic EL panel (organic EL display element) installed therein, was disassembled, the touch panel with a circularly polarizing plate was peeled from the organic EL display device, the circularly polarizing plate was further peeled from the touch panel, and the organic EL display element, the touch panel, and the circularly polarizing plate were each isolated. Subsequently, the isolated touch panel was adhered again to the organic EL display element, and the laminate 1 produced above was adhered onto the touch panel with a pressure sensitive adhesive SK2057 (produced by Soken Chemical & Engineering Co., Ltd.) so that the optically anisotropic layer side was the panel side, thereby producing an organic EL display device 1.

<Evaluation of Reflectivity>

A value measured in a state where black paste (containing carbon black) with a high absorbance and no reflection at all was stuck on the support side of the produced surface protective layer 1 in order to exclude the influence of the surface reflection was used as a surface reflectivity.

The reflectivity (total reflection) of the organic EL display device 1 was measured, and a value obtained by subtracting the surface reflectivity from the reflectivity was evaluated.

Regarding the reflectivity, a spectral colorimeter (manufactured by KONICA MINOLTA JAPAN, INC.) was used, and a Y value of the display system in an observation light source D65 under an observation condition of a visual field of 10° was used as a reflectivity. The obtained values were evaluated according to the following standard.

AA: Case where a reflectivity was 2.2% or less

A: A reflectivity was greater than 2.2% and 2.6% or less

B: A reflectivity was greater than 2.6% and 3.5% or less

C: A reflectivity was greater than 3.5%

<Evaluation of Light Durability>

After the laminate 1 was irradiated with xenon under conditions of 60°, 50% RH, 150 W/m$^2$, and 100 h using SUPER XENON WEATHER METER SX75 manufactured by Suga Test Instruments Co., Ltd., the reflectivity was evaluated in the same manner as described above.

The same evaluation was performed on the laminates produced in Examples 2 to 18 and Comparative Examples 1 to 4, and the results are shown in Table 3.

TABLE 3

| | Optically anisotropic layer | | Photo-alignment layer Composition | Light-absorbing anisotropic layer | | Refractive index-adjusting layer | |
|---|---|---|---|---|---|---|---|
| | | | | Dichroic azo coloring agent | | | |
| | Positive C Composition | Positive A Composition | | Composition | compound (% by mass) | Degree of alignment | Composition | In-plane average refractive index |
| Example 1 | C1 | A1 | PA1 | P1 | 23 | 0.97 | N1 | 1.62 |
| Example 2 | C1 | A1 | PA1 | P2 | 23 | 0.97 | N1 | 1.62 |
| Example 3 | C1 | A1 | PA1 | P3 | 23 | 0.97 | N1 | 1.62 |
| Example 4 | C1 | A1 | PA1 | P4 | 16 | 0.93 | N1 | 1.62 |
| Example 5 | C1 | A1 | PA1 | P1 | 23 | 0.97 | N2 | 1.62 |
| Example 6 | C1 | A1 | PA1 | P1 | 23 | 0.97 | N3 | 1.56 |
| Example 7 | C1 | A1 | PA1 | P1 | 23 | 0.97 | N2 | 1.62 |
| Example 8 | C1 | A1 | PA1 | P1 | 23 | 0.97 | N4 | 1.58 |
| Example 9 | C1 | A1 | PA1 | P1 | 23 | 0.97 | N5 | 1.66 |
| Example 10 | C1 | A1 | PA1 | P1 | 23 | 0.97 | N1 | 1.62 |
| Comparative Example1 | C1 | A1 | PA1 | P1 | 23 | 0.97 | N6 | 1.52 |
| Comparative Example2 | C1 | A1 | PA1 | P1 | 23 | 0.97 | None | |
| Comparative Example3 | C1 | A1 | PA1 | P1 | 23 | 0.97 | N1 | 1.62 |
| Comparative Example4 | C1 | A1 | PA1 | P1 | 23 | 0.97 | None | |
| Example 11 | C1 | A2 | PA1 | P1 | 23 | 0.97 | N1 | 1.62 |
| Example 12 | C1 | A1 | PA1 | P1 | 23 | 0.97 | N1 | 1.62 |
| Example 13 | C1 | A1 | PA1 | P1 | 23 | 0.97 | N5 | 1.66 |
| Example 14 | C1 | A1 | PA1 | P1 | 23 | 0.97 | N5 | 1.66 |
| Example 15 | C1 | A1 | PA1 | P1 | 23 | 0.97 | N3 | 1.56 |
| Example 16 | C1 | A1 | PA1 | P1 | 23 | 0.97 | N1 | 1.62 |
| Example 17 | C1 | A1 | None | P1 | 23 | 0.97 | N5 | 1.66 |
| Example 18 | C1 | A1 | PA1 | P1 | 23 | 0.97 | N1 | 1.62 |
| Example 19 | C1 | A1 | PA1 | P5 | 12 | 0.93 | N1 | 1.62 |

| | Oxygen shielding layer | | Adhesive layer | Surface protective layer | | | Evaluation results | |
|---|---|---|---|---|---|---|---|---|
| | | | | | Support | HC | Display performance | |
| | Composition | In-plane average refractive index | In-plane average refractive index | Support | In-plane average refractive index | In-plane average refractive index | Before light-fast | After light-fast |
| Example 1 | B1 | 1.52 | 1.52 | H1 | 1.48 | 1.52 | A | A |
| Example 2 | B1 | 1.52 | 1.52 | H1 | 1.48 | 1.52 | A | A |
| Example 3 | B1 | 1.52 | 1.52 | H1 | 1.48 | 1.52 | A | A |
| Example 4 | B1 | 1.52 | 1.52 | H1 | 1.48 | 1.52 | A | B |
| Example 5 | B1 | 1.52 | 1.52 | H1 | 1.48 | 1.52 | B | B |
| Example 6 | B1 | 1.52 | 1.52 | H1 | 1.48 | 1.52 | B | B |
| Example 7 | B2 | 1.52 | None | H1 | 1.48 | 1.52 | A | A |
| Example 8 | B2 | 1.52 | None | H1 | 1.48 | 1.52 | B | B |
| Example 9 | B3 | 1.58 | None | H1 | 1.48 | 1.52 | AA | AA |
| Example 10 | B2 | 1.52 | None | H2 | 1.5 | 1.52 | A | A |
| Comparative Example1 | B1 | 1.52 | 1.52 | H1 | 1.48 | 1.52 | C | C |
| Comparative Example2 | B1 | 1.52 | 1.52 | H1 | 1.48 | 1.52 | C | C |
| Comparative Example3 | None | | 1.52 | H1 | 1.48 | 1.52 | B | C |
| Comparative Example4 | None | | 1.52 | H1 | 1.48 | 1.52 | C | C |
| Example 11 | B1 | 1.52 | 1.52 | H1 | 1.48 | 1.52 | A | B |
| Example 12 | B4 | 1.52 | 1.52 | H1 | 1.48 | 1.52 | A | B |
| Example 13 | B5 | 1.62 | None | H3 | 1.67 | 1.53 | B | B |
| Example 14 | B5 | 1.62 | None | H4 | 1.58 | 1.53 | AA | AA |
| Example 15 | B1 | 1.52 | 1.52 | H5 | 1.53 | 1.53 | B | B |
| Example 16 | B1 | 1.52 | 1.52 | H5 | 1.53 | 1.53 | A | A |
| Example 17 | B3 | 1.58 | None | H5 | 1.53 | 1.53 | AA | AA |
| Example 18 | B3 | 1.58 | None | H5 | 1.53 | 1.53 | AA | AA |
| Example 19 | B1 | 1.52 | 1.52 | H1 | 1.48 | 1.52 | A | B |

As shown in Table 3, it was found that in a case where the in-plane average refractive index of the refractive index-adjusting layer at a wavelength of 550 nm was less than L55, the display performance (display performance before light-fast) and the light durability (display performance after light-fast) were inferior (Comparative Example 1).

Moreover, it was found that in a case where the refractive index-adjusting layer was not provided, the display performance and the light durability were inferior (Comparative Example 2).

Further, it was found that in a case where the oxygen shielding layer was not provided, the light durability was inferior (Comparative Example 3).

Furthermore, it was found that in a case where the refractive index-adjusting layer and the oxygen shielding layer were not provided, the display performance and the light durability were inferior (Comparative Example 4).

On the other hand, it was found that in a case where the optically anisotropic layer, the light-absorbing anisotropic layer, the refractive index-adjusting layer, and the oxygen shielding layer were provided in this order, and the in-plane average refractive index of the refractive index-adjusting layer at a wavelength of 550 nm was 1.55 to 1.70, the display performance (display performance before light-fast) and the light durability (display performance after light-fast) were excellent (Examples 1 to 19).

EXPLANATION OF REFERENCES 100, 200: Laminate
12: Optically anisotropic layer
13: Alignment layer
14: Light-absorbing anisotropic layer
16: Refractive index-adjusting layer
18: Oxygen shielding layer
20: Surface protective layer

What is claimed is:
1. A laminate comprising, in the following order:
an optically anisotropic layer;
a light-absorbing anisotropic layer;
a refractive index-adjusting layer; and
an oxygen shielding layer,
wherein the light-absorbing anisotropic layer is formed of a composition containing a dichroic azo coloring agent compound and a liquid crystalline compound,
a content of the dichroic azo coloring agent compound is 10% to 30% by mass with respect to a mass of a total solid content of the light-absorbing anisotropic layer,
a degree of alignment of the light-absorbing anisotropic layer is 0.92 or higher,
the refractive index-adjusting layer is formed of a composition containing a compound having a crosslinkable group, and has an in-plane average refractive index of 1.55 to 1.70 at a wavelength of 550 nm, and
an angle formed by an in-plane slow axis of the optically anisotropic layer and an absorption axis of the light-absorbing anisotropic layer is 45°±10°.
2. The laminate according to claim 1,
wherein the oxygen shielding layer has a polyvinyl alcohol-based resin or a polyethylene vinyl alcohol-based resin.
3. The laminate according to claim 1,
wherein the liquid crystalline compound is a liquid crystalline compound having a repeating unit in the chemical structure.
4. The laminate according to claim 1,
wherein the light-absorbing anisotropic layer has at least two kinds of dichroic azo coloring agent compounds represented by Formulae (1) and (2),

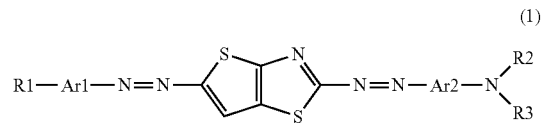

Ar1 and Ar2 in Formula (1) each independently represent a phenylene group which may have a substituent, or a naphthylene group which may have a substituent,
R1 in Formula (1) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group,
provided that —$CH_2$— constituting the alkyl group represented by one aspect of R1 may be substituted with —O—, —CO—, —C(O)—O—, —O—C(O)—, —Si($CH_3$)$_2$—O—Si($CH_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —CC—, —N=N—, —C(R1')=CH—C(O)—, or —O—C(O)—O—,
in a case where R1 is a group other than a hydrogen atom, a hydrogen atom of the corresponding group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$,
R1' represents a hydrogen atom or a linear or branched alkyl group having 1 to 6 carbon atoms, and in a case where a plurality of R1"s are present in the corresponding group, the plurality of R1"s may be the same or different from each other,
R2 and R3 in Formula (1) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group,
provided that —$CH_2$— constituting the alkyl group represented by one aspect of R2 and R3 may be substituted with —O—, —S—, —C(O)—, —C(O)—O—, —O—C(O)—, —C(O)—S—, —S—C(O)—, —Si($CH_3$)$_2$—O—Si($CH_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —CC—, —N=N—, —C(R2')=CH—C(O)—, or —O—C(O)—O—,
in a case where R2 and R3 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$, R2' represents a hydrogen atom or a linear or branched alkyl group having 1 to 6 carbon atoms, and in a case where a plurality of R2''s are present in the corresponding group, the plurality of R2''s may be the same or different from each other, and R2 and R3 may be bonded to each other to form a ring, and R2 or R3 may be bonded to Ar2 to form a ring, and

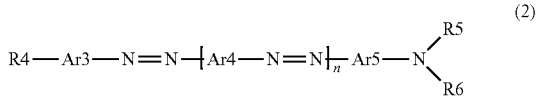
(2)

n in Formula (2) represents 1 or 2,

Ar3, Ar4, and Ar5 in Formula (2) each independently represent a phenylene group which may have a substituent, a naphthylene group which may have a substituent, or a heterocyclic group which may have a substituent, R4 in Formula (2) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group, R5 and R6 in Formula (2) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, provided that —CH$_2$— constituting the alkyl group represented by one aspect of R5 and R6 may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —CC—, —N=N—, —C(R2')=CH—C(O)—, or —O—C(O)—O—, in a case where R5 and R6 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$, R2' represents a hydrogen atom or a linear or branched alkyl group having 1 to 6 carbon atoms, and in a case where a plurality of R2''s are present in the corresponding group, the plurality of R2''s may be the same or different from each other, and R5 and R6 may be bonded to each other to form a ring, and R5 and R6 may be bonded to Ar5 to form a ring.

5. The laminate according to claim 1, wherein an in-plane average refractive index of the oxygen shielding layer at a wavelength of 550 nm is 1.50 to 1.65.

6. The laminate according to claim 1, wherein an in-plane average refractive index of the oxygen shielding layer at a wavelength of 550 nm is 1.55 to 1.65.

7. The laminate according to claim 1, wherein the oxygen shielding layer is an adhesive containing a polyvinyl alcohol-based resin.

8. The laminate according to claim 1, wherein the refractive index-adjusting layer has a compound having a boronic acid structure.

9. The laminate according to claim 1, further comprising:
a photo-alignment layer which is formed of a compound having a crosslinkable group and provided between the optically anisotropic layer and the light-absorbing anisotropic layer.

10. The laminate according to claim 1, further comprising:
a surface protective layer which is provided on a side of the oxygen shielding layer opposite to the refractive index-adjusting layer,
wherein the surface protective layer has a support, and the support has a polyimide resin.

11. The laminate according to claim 1, further comprising:
a surface protective layer which is provided on a side of the oxygen shielding layer opposite to the refractive index-adjusting layer,
wherein the surface protective layer has a hard coat layer, and the hard coat layer contains silsesquioxane.

12. The laminate according to claim 1, further comprising:
a surface protective layer which is provided on a side of the oxygen shielding layer opposite to the refractive index-adjusting layer,
wherein the surface protective layer has a support and a hard coat layer, and
an in-plane average refractive index of the support at a wavelength of 550 nm is 1.45 to 1.60, and an in-plane average refractive index of the hard coat layer at a wavelength of 550 nm is 1.5 to 1.6.

13. The laminate according to claim 1, wherein the optically anisotropic layer has a λ/4 plate formed of a composition containing a polymerizable liquid crystalline compound.

14. The laminate according to claim 13, wherein the polymerizable liquid crystalline compound is a compound represented by Formula (3),

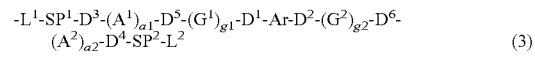
(3)

in Formula (3), a1, a2, g1, and g2 each independently represent 0 or 1, provided that at least one of a1 or g1 represents 1, and at least one of a2 or g2 represents 1, D$^1$, D$^2$, D$^3$, D$^4$, D$^5$, and D$^6$ each independently represent a single bond, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—, and R$^1$, R$^2$, R$^3$, and R$^4$ each independently represent a hydrogen atom, a fluorine atom, or an alkyl group having 1 to 4 carbon atoms, G¹ and G² each independently represent a divalent alicyclic hydrocarbon group which has 5 to 8 carbon atoms and may have a substituent, and one or more —CH₂—'s constituting the alicyclic hydrocarbon group may be substituted with —O—, —S—, or —NH—, A¹ and A² each independently represent an aromatic ring which has 6 or more carbon atoms and may have a substituent, or a cycloalkane ring which has 6 or more carbon atoms and may have a substituent, SP¹ and SP² each independently represent a single bond, a linear or branched alkylene group having 1 to 12 carbon atoms, or a divalent linking group in which one or more —CH₂-'s constituting the linear or branched alkylene group having 1 to 12 carbon atoms are substituted with —O—, —S—, —NH—, —N(Q)- , or —CO—, and Q represents a substituent, L¹ and L² each independently represent a monovalent organic group, and at least one of L¹ or L² represents a polymerizable group, provided that in a case where Ar is an aromatic ring represented by Formula (Ar-3), at least one of L¹, L², or L³ or L⁴ in Formula (Ar-3) represents a polymerizable group, and Ar represents any one aromatic ring selected from the group consisting of the groups represented by Formulae (Ar-1) to (Ar-5), and

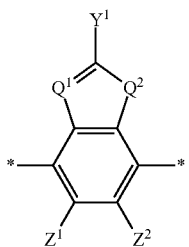

(Ar-1)

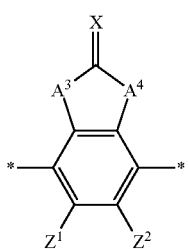

(Ar-2)

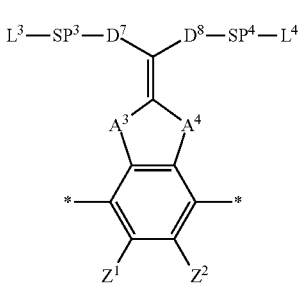

(Ar-3)

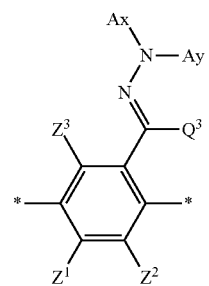

(Ar-4)

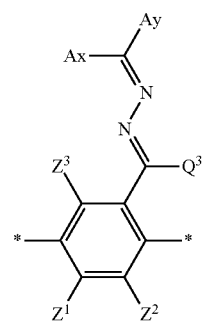

(Ar-5)

in Formulae (Ar-1) to (Ar-5), represents a bonding position to D¹ or D²,

Q¹ represents N or CH,

Q² represents —S—, —O—, or —N(R⁵)—, and R⁵ represents a hydrogen atom or an alkyl group having 1 to 6 carbon atoms, Y¹ represents an aromatic hydrocarbon group having 6 to 12 carbon atoms or an aromatic heterocyclic group having 3 to 12 carbon atoms, which may have a substituent, Z¹, Z², and Z³ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —OR⁶, —NR⁷R⁸, or —SR⁹, where R⁶ to R⁹ each independently represent a hydrogen atom or an alkyl group having 1 to 6 carbon atoms, and Z¹ and Z² may be bonded to each other to form an aromatic ring, A³ and A⁴ each independently represent a group selected from the group consisting of —O—, —N(R¹⁰)—, —S—, and —CO—, and R¹⁰ represents a hydrogen atom or a substituent, X represents a non-metallic atom of Group 14 to Group 16, to which a hydrogen atom or a substituent may be bonded, D⁷ and D⁸ each independently represent a single bond, —CO—O—, —C(=S)O—, —CR¹R²—, —CR¹R²—CR³R⁴—, —O—CR¹R²—, —CR¹R²—O—CR³R⁴—, —CO—O—CR¹R²—, —O—CO—CR¹R²—, —CR¹R²—O—CO—CR³R⁴—, —CR¹R²—CO—O—CR³R⁴—, —NR¹—CR²R³—, or —CO—NR¹—, and R¹, R², R³, and R⁴ each independently represent a hydrogen atom, a fluorine atom, or an alkyl group having 1 to 4 carbon atoms, SP³ and SP⁴ each independently represent a single bond, a linear or branched alkylene group having 1 to 12 carbon atoms, or a divalent linking group in which one or more —CH₂-'s constituting the linear or branched alkylene group having 1 to 12 carbon atoms are substituted with —O—, —S—, —NH—, —N(Q)-, or —CO—, and Q represents a substituent, $L^3$ and $L^4$ each independently represent a monovalent organic group, and at least one of $L^3$, $L^4$, or $L^1$ or $L^2$ in Formula (3) represents a polymerizable group, Ax represents an organic group which has 2 to 30 carbon atoms and has at least one aromatic ring selected from the group consisting of an aromatic hydrocarbon ring and an aromatic heterocyclic ring, Ay represents a hydrogen atom, an alkyl group which has 1 to 12 carbon atoms and may have a substituent, or an organic group which has 2 to 30 carbon atoms and has at least one aromatic ring selected from the group consisting of an aromatic hydrocarbon ring and an aromatic heterocyclic ring, the aromatic rings in Ax and Ay may each have a substituent, and Ax and Ay may be bonded to each other to form a ring, and $Q^3$ represents a hydrogen atom or an alkyl group which has 1 to 6 carbon atoms and may have a substituent.

15. The laminate according to claim 14,
wherein the compound represented by Formula (3) is a compound represented by Formula (4),

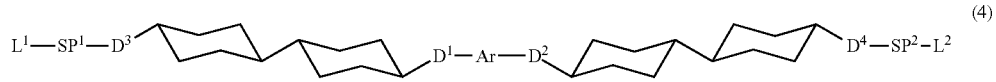

here, $D^1$, $D^2$, $D^3$, $D^4$, $SP^1$, $SP^2$, $L^1$, $L^2$, and Ar in Formula (4) are the same as those described in Formula (3), respectively.

16. The laminate according to claim 14,
wherein the compound represented by Formula (3) is a compound in which Ar in Formula (3) represents an aromatic ring represented by Formula (Ar-2).

17. An image display device comprising:
the laminate according to claim 1.

18. The laminate according to claim 2,
wherein the liquid crystalline compound is a liquid crystalline compound having a repeating unit in the chemical structure.

19. The laminate according to claim 2,
wherein the light-absorbing anisotropic layer has at least two kinds of dichroic azo coloring agent compounds represented by Formulae (1) and (2),

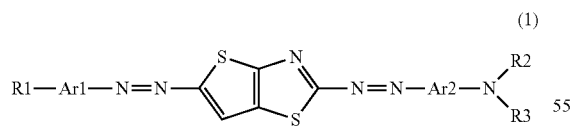

Ar1 and Ar2 in Formula (1) each independently represent a phenylene group which may have a substituent, or a naphthylene group which may have a substituent, R1 in Formula (1) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group, provided that —$CH_2$— constituting the alkyl group represented by one aspect of R1 may be substituted with —O—, —CO—, —C(O)—O—, —O—C(O)—, —Si$(CH_3)_2$—O—Si$(CH_3)_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —CC—, —N=N—, —C(R1')=CH—C(O)—, or —O—C(O)—O—, in a case where R1 is a group other than a hydrogen atom, a hydrogen atom of the corresponding group may be substituted with a halogen atom, a nitro group, a cyano group, —N(R1')$_2$, an amino group, —C(R1')=C(R1')—$NO_2$, —C(R1')=C(R1')—CN, or —C(R1')=C(CN)$_2$, R1' represents a hydrogen atom or a linear or branched alkyl group having 1 to 6 carbon atoms, and in a case where a plurality of R1''s are present in the corresponding group, the plurality of R1''s may be the same or different from each other, R2 and R3 in Formula (1) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, provided that —$CH_2$— constituting the alkyl group represented by one aspect of R2 and R3 may be substituted with —O—, —S—, —C(O)—, —C(O)—O—, —O—C(O)—, —C(O)—S—, —S—C(O)—, —Si$(CH_3)_2$—O—Si$(CH_3)_2$—, —NR2'—, —NR2'—CO—, —CO—NR2'—, —NR2'—C(O)—O—, —O—C(O)—NR2'—, —NR2'—C(O)—NR2'—, —CH=CH—, —CC—, —N=N—, —C(R2')=CH—C(O)—, or —O—C(O)—O—, in a case where R2 and R3 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—$NO_2$, —C(R2')=C(R2')—CN, or —C(R2')=C(CN)$_2$, R2' represents a hydrogen atom or a linear or branched alkyl group having 1 to 6 carbon atoms, and in a case where a plurality of R2''s are present in the corresponding group, the plurality of R2''s may be the same or different from each other, and R2 and R3 may be bonded to each other to form a ring, and R2 or R3 may be bonded to Ar2 to form a ring, and

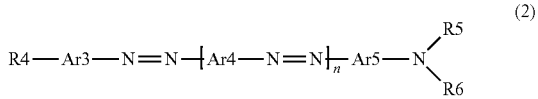 (2)

n in Formula (2) represents 1 or 2,

Ar3, Ar4, and Ar5 in Formula (2) each independently represent a phenylene group which may have a substituent, a naphthylene group which may have a substituent, or a heterocyclic group which may have a substituent, R4 in Formula (2) represents a hydrogen atom, a linear or branched alkyl group which has 1 to 20 carbon atoms and may have a substituent, an alkoxy group, an alkylthio group, an alkylsulfonyl group, an alkylcarbonyl group, an alkyloxycarbonyl group, an acyloxy group, an alkyl carbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkyl phosphoric acid amide group, an alkylimino group, or an alkylsilyl group, R5 and R6 in Formula (2) each independently represent a hydrogen atom, a linear or branched alkyl group which has 1 to 20 carbon atoms and may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, provided that —$CH_2$— constituting the alkyl group represented by one aspect of R5 and R6 may be substituted with —O, S, C(O)—, —C(O)—O—, —O—C(O)—, —C(O)—S—, —S—C(O)—, —Si($CH_3$)$_2$—O—Si($CH_3$)$_2$—, —NR2'—, —NR2'—CO—, —CO—NR2'—, —NR2'—C(O)—O—, —O—C(O)—NR2'—, —NR2'—C(O)—NR2'—, —CH=CH—, —CC—, —N=N—, —C(R2')=CH—C(O)—, or —O—C(O)—O—, in a case where R5 and R6 are each a group other than a hydrogen atom, a hydrogen atom of the corresponding group may be substituted with a halogen atom, a nitro group, a cyano group, an —OH group, —N(R2')$_2$, an amino group, —C(R2')=C(R2')—NO$_2$, —C(R2')=C(R2')—CN, or —C(R2')=C(CN)$_2$, R2' represents a hydrogen atom or a linear or branched alkyl group having 1 to 6 carbon atoms, and in a case where a plurality of R2''s are present in the corresponding group, the plurality of R2''s may be the same or different from each other, and R5 and R6 may be bonded to each other to form a ring, and R5 and R6 may be bonded to Ar5 to form a ring.

20. The laminate according to claim 2, wherein an in-plane average refractive index of the oxygen shielding layer at a wavelength of 550 nm is 1.50 to 1.65.

\* \* \* \* \*